US008325508B2

(12) United States Patent
Kawai et al.

(10) Patent No.: US 8,325,508 B2
(45) Date of Patent: Dec. 4, 2012

(54) WRITING METHOD FOR VARIABLE RESISTANCE NONVOLATILE MEMORY ELEMENT, AND VARIABLE RESISTANCE NONVOLATILE MEMORY DEVICE

(75) Inventors: Ken Kawai, Osaka (JP); Kazuhiko Shimakawa, Osaka (JP); Shunsaku Muraoka, Osaka (JP); Ryotaro Azuma, Osaka (JP)

(73) Assignee: Panasonic Corporation, Osaka (JP)

( * ) Notice: Subject to any disclaimer, the term of this patent is extended or adjusted under 35 U.S.C. 154(b) by 202 days.

(21) Appl. No.: 13/001,905

(22) PCT Filed: Jun. 8, 2010

(86) PCT No.: PCT/JP2010/003802
§ 371 (c)(1),
(2), (4) Date: Dec. 29, 2010

(87) PCT Pub. No.: WO2010/143414
PCT Pub. Date: Dec. 16, 2010

(65) Prior Publication Data
US 2011/0110144 A1 May 12, 2011

(30) Foreign Application Priority Data
Jun. 8, 2009 (JP) .................................. 2009-137759

(51) Int. Cl.
*G11C 11/00* (2006.01)
(52) U.S. Cl. .................................... 365/148; 365/189.16
(58) Field of Classification Search .................. 365/148, 365/189.16, 163, 159, 158
See application file for complete search history.

(56) References Cited

U.S. PATENT DOCUMENTS
7,697,317 B2 * 4/2010 Shimaoka et al. ............ 365/148
(Continued)

FOREIGN PATENT DOCUMENTS
| JP | 2005-235360 | 9/2005 |
| JP | 2006-351780 | 12/2006 |
| JP | 2007-188603 | 7/2007 |
| JP | 2007-288016 | 11/2007 |

(Continued)

OTHER PUBLICATIONS

I.G. Baek et al., "*Highly Scalable Non-volatile Resistive Memory using Simple Binary Oxide Driven by Asymmetric Unipolar Voltage Pulses*", IEDM2004.

*Primary Examiner* — Vu Le
(74) *Attorney, Agent, or Firm* — Wenderoth, Lind & Ponack, LLP

(57) ABSTRACT

A writing method optimum for a variable resistance element which can maximize an operation window of the variable resistance element is provided. The writing method is performed for a variable resistance element that reversibly changes between a high resistance state and a low resistance state depending on a polarity of an applied voltage pulse. The writing method includes a preparation step (S50) and a writing step (S51, S51a, S51b). At the preparation step (S50), resistance values of the variable resistance element are measured by applying voltage pulses of voltages that are gradually increased to the variable resistance element, thereby determining the first voltage V1 for starting high resistance writing and the second voltage V2 having a maximum resistance value. At the HR writing step (S51a), a voltage pulse having a voltage Vp that is equal to or higher than the first voltage V1 and equal to or lower than the second voltage V2 is applied to the variable resistance element, thereby changing the variable resistance element from the low resistance state (S52) to the high resistance state (S53).

10 Claims, 55 Drawing Sheets

U.S. PATENT DOCUMENTS

| | | |
|---|---|---|
| 8,059,448 B2 * | 11/2011 | Tanigami et al. ............. 365/148 |
| 2005/0174840 A1 | 8/2005 | Tsushima et al. |
| 2007/0165442 A1 | 7/2007 | Hosoi et al. |
| 2008/0123394 A1 | 5/2008 | Lee et al. |
| 2009/0152526 A1 | 6/2009 | Courtade et al. |
| 2009/0224224 A1 | 9/2009 | Fujii et al. |
| 2009/0236581 A1 | 9/2009 | Yoshida et al. |
| 2009/0283736 A1 | 11/2009 | Kanzawa et al. |
| 2010/0207094 A1 | 8/2010 | Kanzawa et al. |

FOREIGN PATENT DOCUMENTS

| | | |
|---|---|---|
| JP | 2008-124471 | 5/2008 |
| JP | 2009-71206 | 4/2009 |
| JP | 2009-164580 | 7/2009 |
| WO | 2008/059701 | 5/2008 |
| WO | 2008/068800 | 6/2008 |
| WO | 2008/149484 | 12/2008 |
| WO | 2009/050833 | 4/2009 |
| WO | 2010/021134 | 2/2010 |

* cited by examiner

I-Type Cell

II-Type Cell

FIG. 22

II-Type Cell

| Operation Mode<br>Node | Forming | Verification Reading | LR Writing | HR Writing | Reading |
|---|---|---|---|---|---|
| WL | VH (3.3 V) | VDD (1.8 V) | VH (2.4 V) | VH (2.4 V) | VDD (1.8 V) |
| SL | 0V | 0V | 0V | VH (2.4 V) | 0V |
| BL | Step Up Vp | Vread (0.4 V) | Vp ⎍ (2.4 V) | Vp ⎍ (2.4 V) | Vread (0.4 V) |
| VH0 | 3.3 V | — | 2.4 V | 2.4 V | — |
| VL0 | 3.3 V | — | 3.3 V | 3.3 V | — |

M11 Access
Write "0" (HR writing)

M11 Access
Write "1" (LR writing)

M11 Access
Reading

FIG. 29

I-Type Cell

| Node \ Operation Mode | Forming | Verification Reading | LR Writing | HR Writing | Reading |
|---|---|---|---|---|---|
| WL | VL (3.3 V) | VDD (1.8 V) | VL (2.4 V) | VH (2.4 V) | VDD (1.8 V) |
| SL | Step Up Vp | 0 V | Vp=VL (2.4 V) | 0 V | 0 V |
| BL | 0 V | Vread (0.4 V) | VH (2.4 V) ⎍ | VH (2.4 V) ⎍ | Vread (0.4 V) |
| VH0 | 3.3 V | — | 2.4 V | 2.4 V | — |
| VL0 | 3.3 V | — | 2.4 V | 2.4 V | — |

M11 Access
Reading

M11 Access
Write "0" (HR writing)

M11 Access
Write "1" (LR writing)

FIG. 35

I-Type Cell

| Operation Mode<br>Node | Forming | Verification Reading | LR Writing | HR Writing | Reading |
|---|---|---|---|---|---|
| WL | VL<br>(3.3 V) | VDD<br>(1.8 V) | VL<br>(2.4 V) | VL<br>(2.4 V) | VDD<br>(1.8 V) |
| SL | VL<br>(3.3 V) | 0 V | VL<br>(2.4 V) | 0 V | 0 V |
| BL | Step Down<br>Vp1 | Vread<br>(0.4 V) | Vp1<br>(2.4 V) | VH<br>(2.4 V) | Vread<br>(0.4 V) |
| VH0 | 3.3 V | — | 2.4 V | 2.4 V | — |
| VL0 | 3.3 V | — | 2.4 V | 2.4 V | — |

WRITING METHOD FOR VARIABLE RESISTANCE NONVOLATILE MEMORY ELEMENT, AND VARIABLE RESISTANCE NONVOLATILE MEMORY DEVICE

TECHNICAL FIELD

The present invention relates to a writing method and a variable resistance nonvolatile memory device having a function of the writing method which provide stable resistance change to a variable resistance nonvolatile memory element having a resistance value reversibly changed based on electrical signals. More particularly, the present invention relates to a writing method and a device for changing a variable resistance nonvolatile memory element into a high resistance state.

BACKGROUND ART

In recent years, variable resistance nonvolatile memory devices (hereinafter, referred to also simply as "nonvolatile memory devices") having memory cells including variable resistance nonvolatile memory elements (hereinafter, referred to also simply as "variable resistance elements") have been researched and developed. The variable resistance elements are elements having characteristics in which a resistance value reversibly changes based on electrical signals, and capable of holding data corresponding to the resistance value in a nonvolatile manner.

Commonly known is a nonvolatile memory device including a matrix of so-called 1T1R memory cells in each of which a Metal Oxide Semiconductor (MOS) transistor and a variable resistance element are connected in series to each other at a location close to a cross-point between a bit line and a word line that are arranged perpendicular to each other. In each of the 1T1R memory cells, one of two terminals of the variable resistance element is connected to the bit line and a source line, while the other terminal is connected to a drain or source of the MOS transistor. A gate of the MOS transistor is connected to the word line. The source line is arranged parallel to the bit line or the word line.

Another memory cell structure is also generally known as a nonvolatile memory device including a matrix of cross point memory cells called 1D1R memory cells in each of which a diode and a variable resistance element are connected in series to each other at a cross-point between a bit line and a word line that are arranged perpendicular to each other.

The following describes typical examples of conventional variable resistance elements (Non-Patent Reference 1 and Patent References 1 to 3).

First, Non-Patent Reference 1 discloses a nonvolatile memory including 1T1R memory cells each using a transition metal oxide as a variable resistance element. Non-Patent Reference 1 describes that a transition metal oxide film is generally an insulator, and that a resistance value of the transition metal oxide film can therefore be changed based on a pulse voltage by performing a forming to form a conducting path for switching the resistance value between a high resistance state and a low resistance state. Here, the "forming" refers to initialization of a variable resistance element. The forming is an operation for changing a variable resistance element from a state having an extremely high resistance value after manufacture of the variable resistance element to a state where a resistance value can be changed between a high resistance state and a low resistance state according to an applied pulse voltage. In other words, the forming is used to change the variable resistance element from a state after the manufacture where the variable resistance element has not yet operated as a variable resistance element to a state where the variable resistance element is capable of serving as a variable resistance element. In general, the forming is performed only once after the manufacture.

FIG. 46 is a graph plotting a dependency of a forming start voltage on a transition metal oxide film thickness which is disclosed in Non-Patent Reference 1. The graph indicates four kinds of properties, NiO, $TiO_2$, $HfO_2$, and $ZrO_2$, as transition metal oxides. The forming start voltage depends on the kinds of the transition metal oxides. When a thickness of a transition metal oxide is greater, the forming start voltage is higher. Therefore, in order to decrease the forming voltage, it is preferable to select a transition metal oxide such as NiO to form a transition metal oxide film having a small thickness. Here, the "forming voltage" refers to a voltage applied to perform a forming for a variable resistance element. The "forming start voltage" refers to the lowest voltage (a forming voltage having a minimum absolute value) required to perform a forming for a variable resistance element Moreover, FIG. 47 is a graph plotting current-voltage (I-V) m properties which indicates unipolar resistance change properties of NiO which is disclosed in Non-Patent Reference 1. When a reset voltage of approximately 0.5 V is applied to a variable resistance element having a low resistance state, the low resistance state is changed to a high resistance state. Then, when a set voltage (point A) of approximately 1.15 V is applied to the variable resistance element, the high resistance state is changed to a low resistance state. After the change to the low resistance state (at and after the point A), current restriction is executed not to flow too much current to the variable resistance element. Therefore, after the change to the low resistance state, an extreme voltage is not applied to the variable resistance element. In FIG. 47, a solid line represents resistance change hysteresis before baking of 150° C. and 300 hours, and a broken line represents resistance change hysteresis after the baking of 150° C. and 300 hours. The resistance change hysteresis is not notably changed, even if the resistance change hysteresis is repeatedly looped by changing a voltage in the case where a voltage applied to the variable resistance element is limited after the point A where a high resistance state is changed to a low resistance state. Therefore, the high resistance state and the low resistance state are achieved with stability.

Furthermore, Patent Reference 1 discloses an ion conduction nonvolatile memory device using a rare-earth oxide thin film as a variable resistance elements.

FIG. 48 is a cross-sectional view of a memory cell disclosed in Patent Reference 1.

This memory cell has the following structure. A lower electrode 2 is formed on a substrate 1 having a high electrical conductivity (a silicon substrate 1 doped with a P-type high-concentration impurity, for example). An ion source layer 3 including a metallic element as an ion source is formed on the lower electrode 2. A memory layer 4 having a relatively high resistance value is formed on the ion source layer 3. An upper electrode 6 is formed to contact the memory layer 4 through an opening in an insulation layer 5 on the memory layer 4.

Patent Reference 1 discloses CuTe, GeSbTe, AgGeTe, and the like as a material of the ion source layer 3, and discloses a rear-earth element oxide such as a gadolinium oxide as a material of the memory layer 4. A material of the lower electrode 2 and the upper electrode 6 is described as a common semiconductor line material such as TiW and TaN. Furthermore, a gadolinium oxide for the memory layer 4 is added with metallic particles such as Cu having an amount not enough to form a layer, namely, an amount enough to keep insulation properties or semi-insulation properties.

A method of writing data into the memory cell shown in FIG. 48 is as follows. When a negative voltage causing a potential of the upper electrode 6 to be lower than a potential of the lower electrode 2, a conducting path including a large amount of metallic elements is formed in the memory layer 4, or a large number of defects resulting from the metallic elements are formed in the memory layer 4. As a result, a resistance value of the memory layer 4 is decreased. On the other hand, when a positive voltage causing the potential of the upper electrode 6 to be higher than the potential of the lower electrode 2 is applied, the conducting path or the defects formed in the memory layer 4 due to the metallic elements disappear. As a result, the resistance value of the memory layer 4 is increased.

FIG. 49 is a graph plotting I-V properties changed from an initial state regarding the memory cell shown in FIG. 48. In the first loop, a relatively high negative voltage is applied to the memory cell to change a high resistance state of the initial state to a low resistance state. The voltage is assumed to be an initialization voltage Vo. Then, when a positive potential is increased, an erasing voltage Ve is applied to the memory cell to change the low resistance state to a high resistance state. Furthermore, after the first loop, a writing voltage Vr having an absolute value smaller than that of the initialization voltage Vo is applied to the memory cell to change the high resistance state to a low resistance state.

Accordingly, Patent Reference 1 discloses a technology of lowering the initialization (forming) voltage. As described above, the addition of metallic particles to the memory layer 4 forms defects in the memory layer 4. As a result, a low voltage easily allows ion of the metallic elements to start moving. Into the empty site from which ion is moved, new ion is moved from the ion source layer 3 in contact with the memory layer 4. Such ion movements continuously occur, speedily forming a conducting path. The conducting path allows an initialization (forming) operation to be performed by a low voltage. As a result, reliability of the memory cell can be maintained.

On the other hand, Patent Reference 2 discloses a method of writing multiple values into a 1T1R memory cell using a variable resistance memory element. FIG. 50 is a graph for explaining analysis of an operation point for low resistance writing (LR writing operation point analysis) based on static properties between a Metal Insulator Semiconductor (MIS) transistor and a variable resistance element in such a 1T1R cell. As shown in FIG. 50, the properties of the variable resistance element are represented by straight lines. When a voltage higher than a threshold voltage Vth for writing data to cause a low resistance state (hereinafter, referred to as "LR writing") is applied to the variable resistance element, a high resistance state of the variable resistance element is changed to a low resistance state. Moreover, when a gate voltage VGS of the MIS transistor is sequentially changed to VG3, VG2, and then VG1 (where VG3<VG2<VG1), the properties of the MIS transistor is changed. If the gate voltage VGS of the MIS transistor is higher, more current flows and on-resistance is lower. The change of the gate voltage VGS of the MIS transistor sequentially to VG3, VG2, and then VG1 also changes the LR writing operation point sequentially to P3, P2, and then P1, so that the variable resistance element has a low resistance value corresponding to a value of current flowing at the operation point. As described above, a level of the low resistance value of the variable resistance element controls the gate voltage VGS of the MIS transistor, and thereby controls its I-V properties so as to flexibly set the I-V properties. The method can therefore be used for multivalued memories.

Patent Reference 3 discloses a method of writing multiple values to a variable resistance element. FIG. 51 is a graph plotting resistance-voltage (R-V) characteristics of a metal insulation film (magnesium oxidation film, for example) serving as the variable resistance element. FIG. 51 shows resistance change characteristics (a) causing the variable resistance element to change into a high resistance state by applying a positive voltage (hereinafter, writing to change the variable resistance element into a high resistance state is referred to as "high resistance (HR) writing"), and (b) causing the variable resistance element to change into a low resistance state by applying a negative voltage (hereinafter, writing to change the variable resistance element into a low resistance state is referred to as "low resistance (LR) writing"). Regarding application of a positive voltage, a return path differs depending on an applied voltage, after the applied voltage is increased to be equal to or higher than a critical voltage. More specifically, when a switching voltage is higher, resistance is regressed to have a higher resistance value. As described above, Patent Reference 3 discloses that a level of a high resistance value of a variable resistance element can be set to a desired high resistance value, by setting a plurality of switching voltages to control the R-V characteristics.

PRIOR ARTS

Patent References
Patent Reference 1: Japanese Unexamined Patent Application Publication No. 2006-351780 (FIGS. 1 and 3)
Patent Reference 2: Japanese Unexamined Patent Application Publication No. 2005-235360 (FIG. 4)
Patent Reference 3: Japanese Unexamined Patent Application Publication No. 2008-124471 (FIG. 2A)
Non-Patent Reference
Non-Patent Reference 1: I. G. Baek et al., IEDM 2004, p. 587 (FIG. 5 (b))

DISCLOSURE OF INVENTION

Problems that Invention is to Solve

Here, the conventional technologies disclosed in Background Art are summarized. Non-Patent Reference 1 discloses the following. Some kinds of transition metal oxides show nonvolatile variable change phenomenon due to application of electrical pulse. The occurrence of the variable change phenomenon firstly requires application of a voltage having an absolute value greater than an absolute value of a control voltage for subsequent resistance change. This is explained using a model of forming a conducting path at a level enough to cause resistance change from an extremely high resistance state in an initial insulation state. Non-Patent Reference 1 also discloses that, after the forming, variable resistance elements using these transition metal oxides produce reversible resistance change when electrical signals exceeding a predetermined threshold voltage are applied. Non-Patent Reference 1 further discloses that there are two types of such a variable resistance element: an unipolar variable resistance element that can be controlled only by applying a voltage having a polarity of a single direction; and a bipolar variable resistance element that can be controlled by applying voltages having different polarities.

Patent Reference 1 discloses that even an ion conductive variable resistance element made of a material that is not a transition metal oxide is also capable of achieving the same resistance change caused by a forming or electrical pulse.

Patent Reference 2 discloses a method of controlling LR writing of a variable resistance element. Patent Reference 2 discloses that a high resistance state of a variable resistance element is changed to a low resistance state when an applied voltage reaches a predetermined voltage, that a resistance value of a low resistance state is determined depending on a size of an amount of current flowing in the variable resistance element, and that the control method can be used for multivalued memories by using the above phenomenon to control a gate voltage.

Patent Reference 3 reports that there is a phenomenon that a level of a high resistance value is uniquely determined by a value of a voltage applied to a variable resistance value in writing data to cause a high resistance state (hereinafter, referred to as "HR writing").

Thus, the prior arts disclose that a variable resistance nonvolatile memory element is capable of having a simple structure in which some materials such as transition metal oxides are sandwiched between electrodes. The prior arts also disclose that a forming using a high voltage is initially performed for the structure so as to achieve stable control of a change between a low resistance state and a high resistance state only by afterwards applying electrical signals having a short pulse. The prior arts further disclose that the low resistance state and the high resistance state are nonvolatile. If these variable resistance nonvolatile memory elements are used as memory cells, it would be possible to offer memories having a higher speed and a lower cost more than commonly-known nonvolatile memories such as Flash memory.

In consideration of the above disclosures, the inventors of the present application use tantalum (Ta) that is one of transition metals for an example of a material of variable resistance nonvolatile memory devices, in order to provide a variable resistance nonvolatile memory device including memory cells each having a variable resistance layer comprising the oxygen-deficient oxide (tantalum oxide) and a switch element.

Here, the oxygen-deficient oxide refers to an oxide in which oxygen is deficient in a stoichiometric composition. In the case of tantalum that is one of transition metals, $Ta_2O_5$ is an example of an oxide having a stoichiometric composition. The $Ta_2O_5$ contains oxygen 2.5 times as much as oxygen in tantalum, which is expressed by an oxygen content percentage as 71.4%. If an oxide having an oxygen content percentage lower than 71.4% is expressed as $TaO_x$, a tantalum oxide (hereinafter, referred to as "Ta oxide") having a nonstoichiometric composition satisfying $0<x<2.5$ is called an oxygen-deficient Ta oxide. Especially, as disclosed in PCT International Publication No. WO2008/059701 (Patent Reference 4) that is a patent reference related to this application, a good resistance change operation can be obtained within $0.8<x<1.9$ that is a desirable range for x.

Preparing for explaining problems of the conventional technologies, the following describes some properties obtained by experiments regarding a variable resistance element having a variable resistance layer comprising an oxygen-deficient Ta oxide ($TaO_{1.54}$).

FIG. 52 is a cross-sectional view of a structure (structure for one bit) of a 1T1R memory cell using a conventional variable resistance element. As shown in FIG. 52, the 1T1R memory cell 500 includes a transistor 317 and a variable resistance element 300.

On a semiconductor substrate 301, sequentially formed are a first N-type diffusion layer region 302a, a second N-type diffusion layer region 302b, a gate insulation film 303a, a gate electrode 303b, a first via 304, a first line layer 305, a first resistance film via 510, a variable resistance element 300, a second resistance film via 511, a second via 306, a second line layer 307, a third via 308, and a third line layer 311.

Here, the second line layer 307 connected to the second resistance film via 511 is defined as an upper electrode terminal A, the first line layer 305 connected to the first resistance film via 510 is defined as a lower electrode terminal 8, and the third line layer 311 is defined as a lower electrode side terminal C.

A voltage of the semiconductor substrate 301 is 0 V, which is supplied from a commonly-known structure of a 0V power source line (not shown).

The figure located at the upper right corner of FIG. 52 is an enlarged view of the variable resistance element 300. The variable resistance element 300 has a structure in which a set of the lower electrode 300a, the variable resistance layer 300b that is the oxygen-deficient Ta oxide ($TaO_{1.54}$), and the upper electrode 300c is sandwiched between the first resistance film via 510 and the second resistance film via 511. Here, the set is on the first resistance film via 510 and is in contact with the second resistance film via 511 connected to the second line layer 307. The variable resistance layer 300b has an area of 0.25 μm² (=0.5 μm×0.5 μm) and a film thickness of 50 nm. Regarding the transistor 317, an N-channel Metal Oxide Semiconductor (NMOS) transistor has a gate width W of 0.44 μm and a gate length L of 0.18 μm, and the gate insulation film 303a has a thickness Tox of 3.5 nm.

The lower electrode 300a comprises TaN. The upper electrode 300c comprises electrode materials including, as a major component, Pt that is likely to occur resistance change.

The variable resistance element 300 has the following resistance change characteristics. When a positive voltage equal to or higher than a threshold voltage causing resistance change is applied to the upper electrode 300c with reference to the lower electrode 300a, oxidation occurs at an interface of the upper electrode 300c so as to change the variable resistance element 300 from a low resistance state to a high resistance state. On the other hand, when a negative voltage equal to or lower than the threshold voltage causing resistance change is applied to the upper electrode 300c with reference to the lower electrode 300a, reductive reaction occurs in the variable resistance layer 300b close to the interface of the upper electrode 300c so as to change the variable resistance element 300 from the high resistance state to a low resistance state. As described above, the variable resistance element 300 has different electrode structure, in which the material of the upper electrode 300c is different from the material of the lower electrode 300a. In the variable resistance element 300, a relationship between (a) each of a high resistance state and a low resistance state and (b) a polarity direction of an applied pulse voltage is therefore uniquely determined depending on an electrode material. As a result, the variable resistance element 300 is capable of having reversible and stable rewriting characteristics and employing the resistance change phenomenon. Such a nonvolatile memory element is an object of the inventors of this application, and is described in detail in PCT International Publication No. WO2009/050833 (Patent Reference 5) that is a patent reference related to this application.

FIG. 53 is a graph plotting a resistance value (a resistance measurement voltage is 0.4 V) of each application of a voltage to the 1T1R memory cell 500 shown in FIG. 52, in the case that a pulse voltage causing LR writing and a pulse voltage causing HR writing is alternately applied for a certain one bit after initially performing a forming by applying a high voltage pulse. A horizontal axis represents a count of applied electrical pulse, while a vertical axis represents a resistance value. Here, the resistance measurement voltage is a voltage applied to the variable resistance element in order to measure a resistance value of the variable resistance element. This resistance measurement voltage is equal to or lower than a threshold voltage causing resistance change (change between a high resistance state and a low resistance state).

More specifically, FIG. 53 shows the following. Since a gate voltage Vg of 2.4 V is applied to the gate electrode 303*b* in the 1T1R memory cell 500 shown in FIG. 52, the 1T1R memory cell 500 is firstly in a low resistance state LR of approximately 8.8 kΩ. Then, a pulse voltage of +2.4 V (with a pulse width of 50 ns) is applied to the upper electrode terminal A (here, a ground potential is applied to the lower electrode side terminal C), in other words, a positive pulse voltage of +2.4 V is applied, so that the low resistance state LR is changed to a high resistance state HR of approximately 222 kΩ. Then, a pulse voltage of +2.4 V (with a pulse width of 50 ns) is applied to the lower electrode side terminal C (here, a ground potential is applied to the upper electrode terminal A), in other words, a negative pulse voltage of −2.4 V is applied, so that the high resistance state HR is changed to a low resistance state LR of approximately 8.9 kΩ. After that, (a) HR writing caused by application of a positive pulse voltage to the upper electrode terminal A for the lower electrode side terminal C and (b) LR writing caused by application of a negative pulse voltage to the upper electrode terminal A for the lower electrode side terminal C are repeated.

As described above, it has been confirmed that even a tantalum oxide that is one of transition metals shows bipolar resistance change characteristics. It has also been confirmed that application of a short pulse of several dozens ns enables high-speed rewriting of a resistance value. In addition, although it is not described in detail herein, it has also been confirmed that a low resistance value obtained by the LR writing is determined depending on an amount of current flowing in the LR writing, for example, depending on a size of a voltage of the gate electrode 303*b* or a channel width (not shown) of the transistor 317. This phenomenon is the same as the characteristics disclosed in Patent Reference 2.

FIG. 54 is a graph plotting normalized expectation values of resistance values of a high resistance state HR and a low resistance state LR in the case that a pulse application count is further increased (application of a positive pulse 300 times and application of a negative pulse 300 times) in FIG. 53. A horizontal axis represents resistance values of HR and LR (a resistance measurement voltage is 0.4 V), while a vertical axis represents a normalized expectation value that indicates a degree of variation of the resistance values when the resistance values are fitted in normal distribution.

As shown in FIG. 54, although resistance change is continuously operated by alternately performing LR writing and HR writing for one bit under the same conditions, each of the high resistance state and the low resistance state is not set to have the same resistance value, but set to have certain statistical distribution variation. The discovered phenomenon is not conventionally known. Especially, variation in resistance values in the high resistance state is large. Therefore, it is important in a reading operation how to maximize a window C defined by a minimum value of the high resistance state HR and a maximum value of the low resistance state LR when a variable resistance memory device has variable resistance memory elements. However, if a plurality of the variable resistance memory elements are integrated, a well known factor of manufacture variation in respective bits is also added. As a result, this window C becomes narrower, which produces serious problems such as reading errors and decrease of a reading speed, failing stable operations.

The present invention is addresses to the above-described problems. An object of the present invention is to provide a writing method optimum for a variable resistance element to maximize an operation window of the variable resistance element, and also to provide a variable resistance nonvolatile memory device having a function of such a writing method.
Means to Solve the Problems In accordance with an aspect of the present invention for achieving the object, there is provided a method of writing to a variable resistance nonvolatile memory element that reversibly changes between a high resistance state and a low resistance state depending on a polarity of an applied voltage pulse, wherein the variable resistance nonvolatile memory element has characteristics of (i) changing from the low resistance state to the high resistance state due to application of a voltage having an absolute value equal to or greater than an absolute value of a first voltage, (ii) changing to the high resistance state having a maximum resistance value due to application of a second voltage having an absolute value greater than the absolute value of the first voltage, and (iii) changing to the high resistance state having a resistance value lower than the maximum resistance value due to application of a third voltage having an absolute value greater than the absolute value of the second voltage, and each of the first, second, and third voltages has a first polarity, the writing method including: a high resistance writing step of changing the variable resistance nonvolatile memory element from the low resistance state to the high resistance state, by applying a voltage pulse having the first polarity to the variable resistance nonvolatile memory element; and a low resistance writing step of changing the variable resistance nonvolatile memory element from the high resistance state to the low resistance state, by applying a voltage pulse having a second polarity to the variable resistance nonvolatile memory element, wherein the voltage pulse applied in the high resistance writing step has an absolute value which is equal to or greater than the absolute value of the first voltage and equal to or smaller than the absolute value of the second voltage.

Thereby, in the high resistance writing step, a voltage having an absolute value equal to or smaller than the absolute value of the second voltage that maximizes the resistance value is applied to the variable resistance nonvolatile memory element. It is therefore possible to prevent application of a voltage exceeding the second voltage (decrease of a resistance value due to entry to the unipolar region). Thereby, a resistance value in the high resistance state of the variable resistance nonvolatile memory element can be maximized. As a result, it is possible to maximize an operation window of the variable resistance nonvolatile memory element.

It is preferable that the writing method further includes a preparation step of determining the first and second voltages, by applying voltage pulses to the variable resistance nonvolatile memory element so as to measure respective resistance values of the variable resistance nonvolatile memory element, the voltage pulses having voltage absolute values that are gradually increased, wherein the voltage pulse applied in the high resistance writing step is determined based on the first and second voltages determined in the preparation step. Thereby, since the first and second voltages are determined by the measurements, a voltage optimum for the high resistance writing step can be surely determined.

A maximum voltage in the high resistance writing step is restricted to the above second voltage. It is because the variable resistance nonvolatile memory element has characteristics by which application of a voltage pulse of any voltage in the high resistance writing step causes a resistance value in the high resistance state to be lower than the maximum resistance value if a voltage pulse of the third voltage has been applied to the variable resistance nonvolatile memory element, the third voltage having the absolute value greater than the absolute value of the second voltage.

It is further preferable that the variable resistance nonvolatile memory element includes a first oxygen-deficient transition metal oxide layer and a second oxygen-deficient transition metal oxide layer, the second oxygen-deficient transition metal oxide layer having an oxygen content percentage higher than an oxygen content percentage of the first oxygen-deficient transition metal oxide layer, and the voltage pulse applied in the high resistance writing step has a positive voltage for the second oxygen-deficient transition metal oxide layer, with reference to a potential of the first oxygen-deficient transition metal oxide layer.

In accordance with another aspect of the present invention, there is provided a variable resistance nonvolatile memory device including variable resistance nonvolatile memory elements, the variable resistance nonvolatile memory device including: a memory cell array including a plurality of memory cells in each of which a corresponding one of the variable resistance nonvolatile memory elements is connected in series to a corresponding one of switch elements, the variable resistance nonvolatile memory elements each being reversibly changeable between a high resistance state and a low resistance state depending on a polarity of an applied voltage pulse; a selection unit configured to select at least a memory cell from the memory cell array; a writing unit configured to (i) generate a high resistance writing voltage pulse to be applied to change a variable resistance nonvolatile memory element in the memory cell selected by the selection unit from the low resistance state to the high resistance state, or (ii) generate a low resistance writing voltage pulse to be applied to change the variable resistance nonvolatile memory element from the high resistance state to the low resistance state; and a reading unit configured to determine whether the variable resistance nonvolatile memory element in the memory cell selected by the selection unit is in the high resistance state or in the low resistance state, wherein the variable resistance nonvolatile memory element has characteristics of (i) changing from the low resistance state to the high resistance state due to application of a voltage having an absolute value equal to or greater than an absolute value of a first voltage, (ii) changing to the high resistance state having a maximum resistance value due to application of a second voltage having an absolute value greater than the absolute value of the first voltage, and (iii) changing to the high resistance state having a resistance value lower than the maximum resistance value due to application of a third voltage having an absolute value greater than the absolute value of the second voltage, each of the first, second, and third voltages has a same polarity, and the high resistance writing voltage pulse generated in the writing unit is a voltage pulse having an absolute value which is equal to or greater than the absolute value of the first voltage and equal to or smaller than the absolute value of the second voltage.

Thereby, in the high resistance writing step, a voltage having an absolute value equal to or smaller than the absolute value of the second voltage that maximizes the resistance value is applied to the variable resistance nonvolatile memory element. It is therefore possible to prevent application of a voltage exceeding the second voltage (decrease of a resistance value due to entry to the unipolar region). Thereby, a resistance value in the high resistance state of the variable resistance nonvolatile memory element can be maximized. As a result, it is possible to maximize an operation window of the variable resistance nonvolatile memory element.

A maximum voltage in the high resistance writing step is restricted to the above second voltage. It is because the variable resistance nonvolatile memory element has characteristics in which application of a voltage pulse having any absolute value in the high resistance writing step causes a resistance value in the high resistance state to be lower than the maximum resistance value if a voltage pulse of the third voltage has been applied to the variable resistance nonvolatile memory element, the third voltage having the absolute value greater than the absolute value of the second voltage.

It is preferable that the variable resistance nonvolatile memory element includes a first oxygen-deficient transition metal oxide layer and a second oxygen-deficient transition metal oxide layer, the second oxygen-deficient transition metal oxide layer having an oxygen content percentage higher than an oxygen content percentage of the first oxygen-deficient transition metal oxide layer, and the writing unit is configured to (i) generate, as the high resistance writing voltage pulse, a voltage pulse having a positive voltage for the second oxygen-deficient transition metal oxide layer, with reference to a potential of the first oxygen-deficient transition metal oxide layer, and (ii) generate, as the low resistance writing voltage pulse, a voltage pulse having a positive voltage for the first oxygen-deficient transition metal oxide layer, with reference to a potential of the second oxygen-deficient transition metal oxide layer. For example, the first oxygen-deficient transition metal oxide layer is a layer including a composition represented by $TaO_x$, and the second oxygen-deficient transition metal oxide layer is a layer including a composition represented by $TaO_y$, where $x<y$.

It is further preferable that the variable resistance nonvolatile memory device further includes a plurality of bit lines and a plurality of source lines, wherein each of the plurality of memory cells is connected between a corresponding one of the plurality of bit lines and a corresponding one of the plurality of source lines, the selection unit includes a row selection unit and a column selection unit, the row selection unit configured to select at least one of the plurality of source lines, and the column selection unit configured to select at least one of the plurality of bit lines, the reading circuit is connected to the variable resistance nonvolatile memory elements via the column selection unit, and the writing unit is configured to (i) generate the high resistance writing voltage pulse for the at least one of the plurality of source lines selected by the row selection unit with reference to a potential of the at least one of the plurality of bit lines selected by the column selection unit, or (ii) generate the high resistance writing voltage pulse for the at least one of the plurality of bit lines selected by the column selection unit with reference to a potential of the at least one of the plurality of source lines selected by the row selection unit.

More specifically, it is still further preferable that the plurality of memory cells are arranged two-dimensionally, the variable resistance nonvolatile memory device further including a plurality of word lines which are provided to respective rows of the plurality of memory cells, wherein each of the plurality of word lines is connected to a control terminal of a corresponding one of switch elements included in memory cells forming a corresponding one of the rows, the row selection unit is further configured to select, from the plurality of word lines, a word line corresponding to the at least one of the plurality of source lines selected by the row selection unit, and the writing unit is configured to apply the high resistance writing voltage pulse to the at least one of the plurality of bit lines selected by the column selection unit, after fixing the at least one of the source lines selected by the row selection unit to have a reference potential and turning ON the corresponding one of the switch elements via the word line selected by the row selection unit.

Thereby, it is possible to surely apply a high resistance writing voltage pulse having a restricted voltage to a variable resistance nonvolatile memory element in a memory cell selected from the plurality of memory cells arranged two-dimensionally. As a result, a large operation window can be obtained.

Effects of the Invention

The writing method for a variable resistance nonvolatile memory element and the variable resistance nonvolatile memory device according to the present invention perform HR writing for each of memory cells by applying an optimum HR writing pulse voltage not exceeding a maximum point. As a result, it is possible to control a changeable high resistance value level to be higher, thereby expanding an operation window between a low resistance state and a high resistance state. Thereby, a high-speed reading and data reliability can be improved, and a risk of erroneous reading can be significantly reduced.

BRIEF DESCRIPTION OF DRAWINGS

FIG. 22 is a list of setting voltages of each node for respective operation modes according to the first embodiment of the present invention.

FIG. 29 is a list of setting voltages of each node for respective operation modes according to the second embodiment of the present invention.

FIG. 35 is a list of setting voltages of each node for respective operation modes according to the third embodiment of the present invention.

BEST MODE FOR CARRYING OUT THE INVENTION

The following describes embodiments of the present invention in detail with reference to the drawings.

[First Embodiment]

A variable resistance nonvolatile memory device according to the first embodiment of the present invention is a 1T1R nonvolatile memory device in which each variable resistance element is connected in series to a MOS transistor. The variable resistance nonvolatile memory device according to the first embodiment can perform a forming method (namely, a forming) capable of controlling a high resistance value level of the variable resistance element. In addition, the variable resistance nonvolatile memory device can apply an optimum pulse voltage for HR writing to the variable resistance element. As a result, this variable resistance nonvolatile memory device can provide a wide operation window between a high resistance state and a low resistance state.

[Basic Data 1 of Present Invention: Characteristics of Variable Resistance Film Connected in Series to Fixed Resistance Element]

For preparation for the explanation, the following describes basic data related to a variable resistance element used in the variable resistance nonvolatile memory device according to the present invention.

Figure 1:
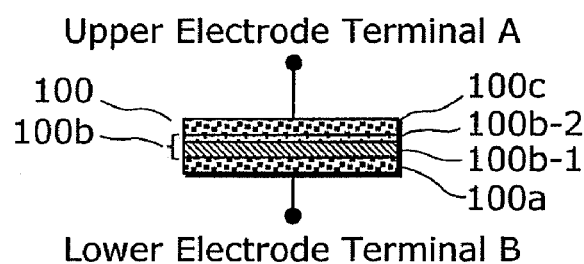
FIG. 1 is a schematic diagram showing a basic structure of a nonvolatile memory element according to basic data of the present invention.

FIG. 1 is a schematic diagram showing a basic structure of a variable resistance element used in an experiment. As shown in FIG. 1, a variable resistance element 100 has a structure in which a lower electrode 100a, a variable resistance layer 100b, and an upper electrode 100c are sequentially stacked to form a sandwich shape. A lower electrode terminal B extends from the lower electrode 100a, and an upper electrode terminal A extends form the upper electrode 100c. Here, the lower electrode 100a comprises TaN, and the upper electrode 100c comprises electrode materials including, as a major component, Pt that is likely to occur resistance change.

Furthermore, the variable resistance layer 100b includes: a first oxygen-deficient tantalum oxide layer 100b-1 ($TaO_x$, where x=1.54) that contacts the lower electrode 100a; and a second oxygen-deficient tantalum oxide layer 100b-2 ($TaO_y$, where y=2.47) that contacts the upper electrode 100c.

The second oxygen-deficient tantalum oxide layer 100b-2 ($TaO_{2.47}$) is formed by performing, prior to a process for manufacturing the upper electrode 100c, a plasma oxidation process on a surface of the first oxygen-deficient tantalum oxide layer 100b-1 ($TaO_{1.54}$) formed by sputtering. Therefore, the second oxygen-deficient tantalum oxide layer 100b-2 ($TaO_{2.47}$) has an oxygen content percentage higher than that of the first oxygen-deficient tantalum oxide layer 100b-1 ($TaO_{1.54}$). In other words, the second oxygen-deficient tantalum oxide layer 100b-2 ($TaO_{2.47}$) has a resistance value higher than that of the first oxygen-deficient tantalum oxide layer 100b-1 ($TaO_{1.54}$). Since the variable resistance element 100 therefore has a significantly high initial resistance (>10 MΩ), resistance change needs application of a high forming voltage (voltage for LR writing) to form a conducting path.

After the forming, the variable resistance element 100 has the following resistance change characteristics. When a positive voltage equal to or higher than a threshold voltage causing resistance change is applied to the upper electrode 100c with reference to the lower electrode 100a, oxidation occurs at an interface of the upper electrode 100c so as to change the variable resistance element 100 from a low resistance state to a high resistance state. On the other hand, when a negative voltage equal to or lower than the threshold voltage causing resistance change is applied to the upper electrode 100c with reference to the lower electrode 100a, reductive reaction occurs at an interface of the upper electrode 100c so as to change the variable resistance element 100 from a high resistance state to a low resistance state. The variable resistance element 100 including such a high resistance layer ($TaO_{2.47}$) has been invented by the inventors of this application, aiming at providing a nonvolatile memory element that has reversible stable rewriting characteristics and that utilizes resistance change phenomenon. The variable resistance element 100 is discloses in detail in PCT International Publication No. WO2010/021134 (Patent Reference 6) that is a patent reference related to this application.

Here, Table 1 lists: a size of the variable resistance element 100 used in the experiment; a thickness and an oxygen content percentage x of the first tantalum oxide layer ($TaO_x$ layer); and a thickness and an oxygen content percentage y of the second tantalum oxide layer ($TaO_y$ layer).

TABLE 1

| | | Variable Resistance Element 100 |
|---|---|---|
| Electrode Size | | 0.25 μm² |
| Upper Electrode | Material | Pt |
| $TaO_y$ Layer (Second Tantalum Oxide Layer) | Thickness (nm) | 6 |
| | y | 2.47 |
| $TaO_x$ Layer (First Tantalum Oxide Layer) | Thickness (nm) | 50 |
| | x | 1.54 |
| Lower Electrode | Material | TaN |

Next, the experiment related to the variable resistance element 100 is described.

Figure 2:
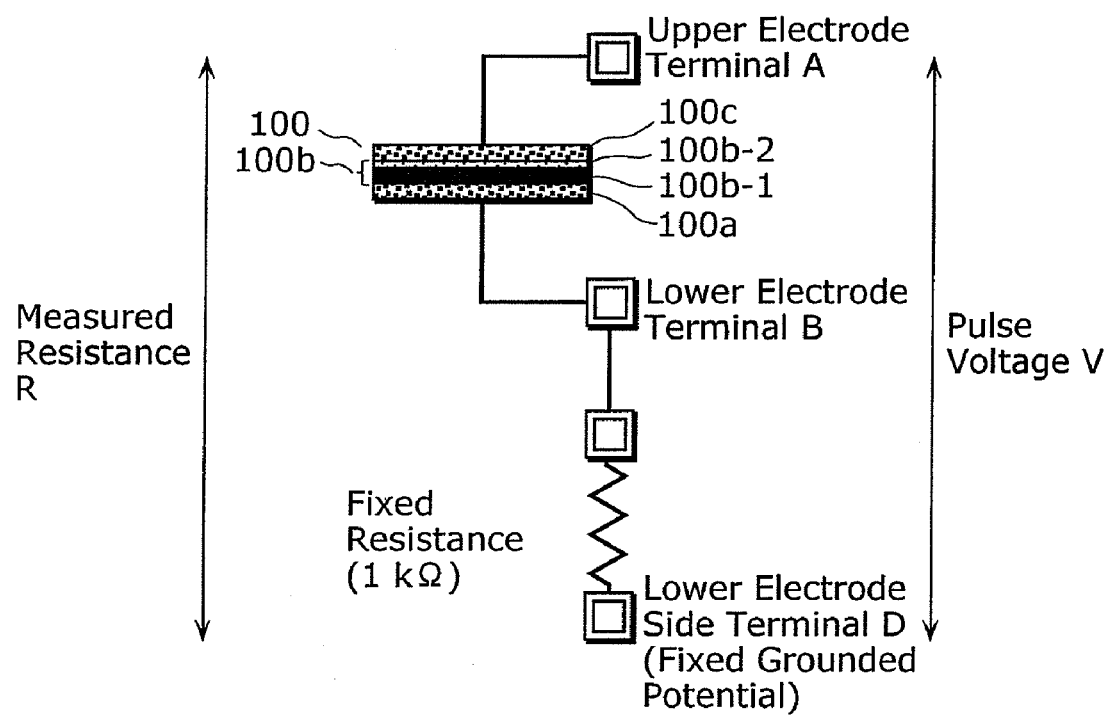
FIG. 2 is a block diagram showing a structure of a variable resistance element added with a fixed resistance according to basic data 1 of the present invention.

FIG. 2 is a circuit diagram of an evaluation circuit for the experiment. The evaluation circuit has a cell structure in which the variable resistance element 100 shown in FIG. 1 is connected in series to a fixed resistance element of 1 kΩ. The same reference numerals of FIG. 1 are assigned to the identical structural elements of FIG. 2, so that the identical structural elements are not explained again below. In order to examine characteristics of a 1T1R memory cell, the evaluation circuit shown in FIG. 2 has a cell structure for obtaining basic data. In more detail, the evaluation circuit has a pseudo structure in which a fixed resistance of 1 kΩ is used as a substitute for the memory transistor. A terminal of the fixed resistance element which is not connected to the variable resistance element 100 serves as a lower electrode side terminal D.

Figure 3A:
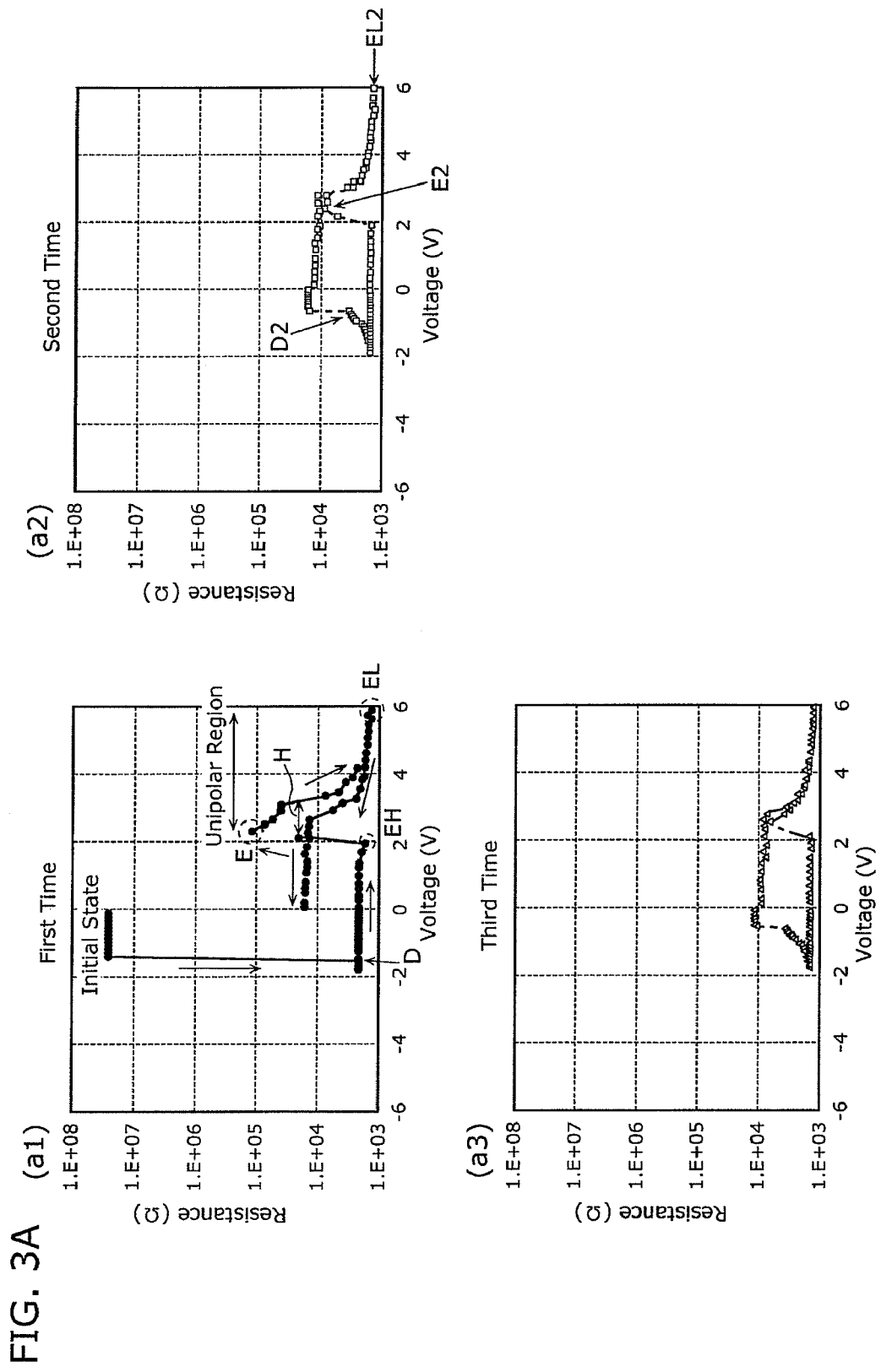
[FIG. 3A] Each of (a1) to (a3) in FIG. 3A is a graph plotting a relationship between a resistance value and an applied pulse voltage according to the basic data of the present invention.
Figure 3B:
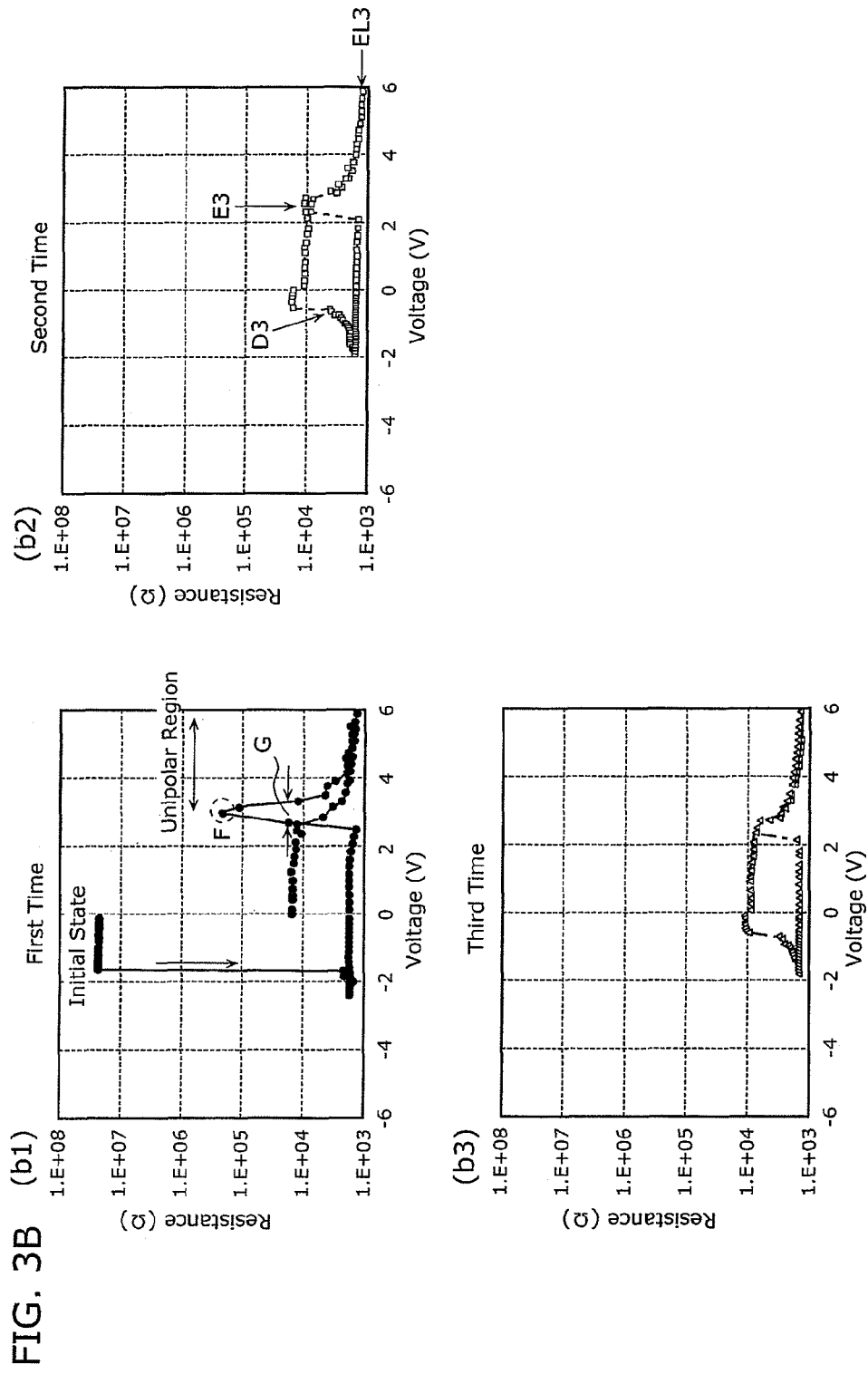
[FIG. 3B] Each of (b1) to (b3) in FIG. 3B is a graph plotting a relationship between a resistance value and an applied pulse voltage according to the basic data of the present invention.
Figure 3C:
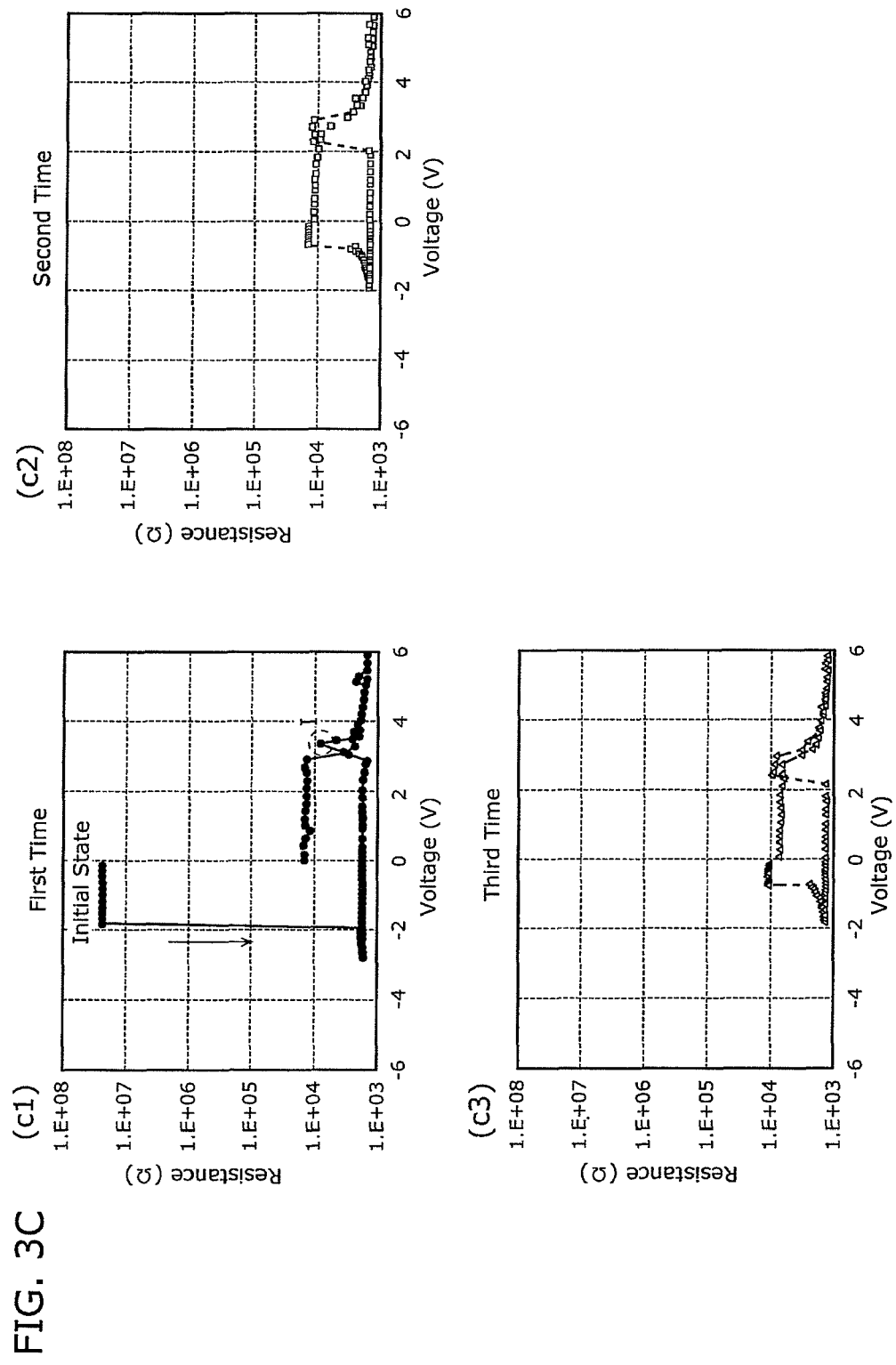
[FIG. 3C] Each of (c1) to (c3) in FIG. 3C is a graph plotting a relationship between a resistance value and an applied pulse voltage according to the basic data of the present invention.
Figure 3D:
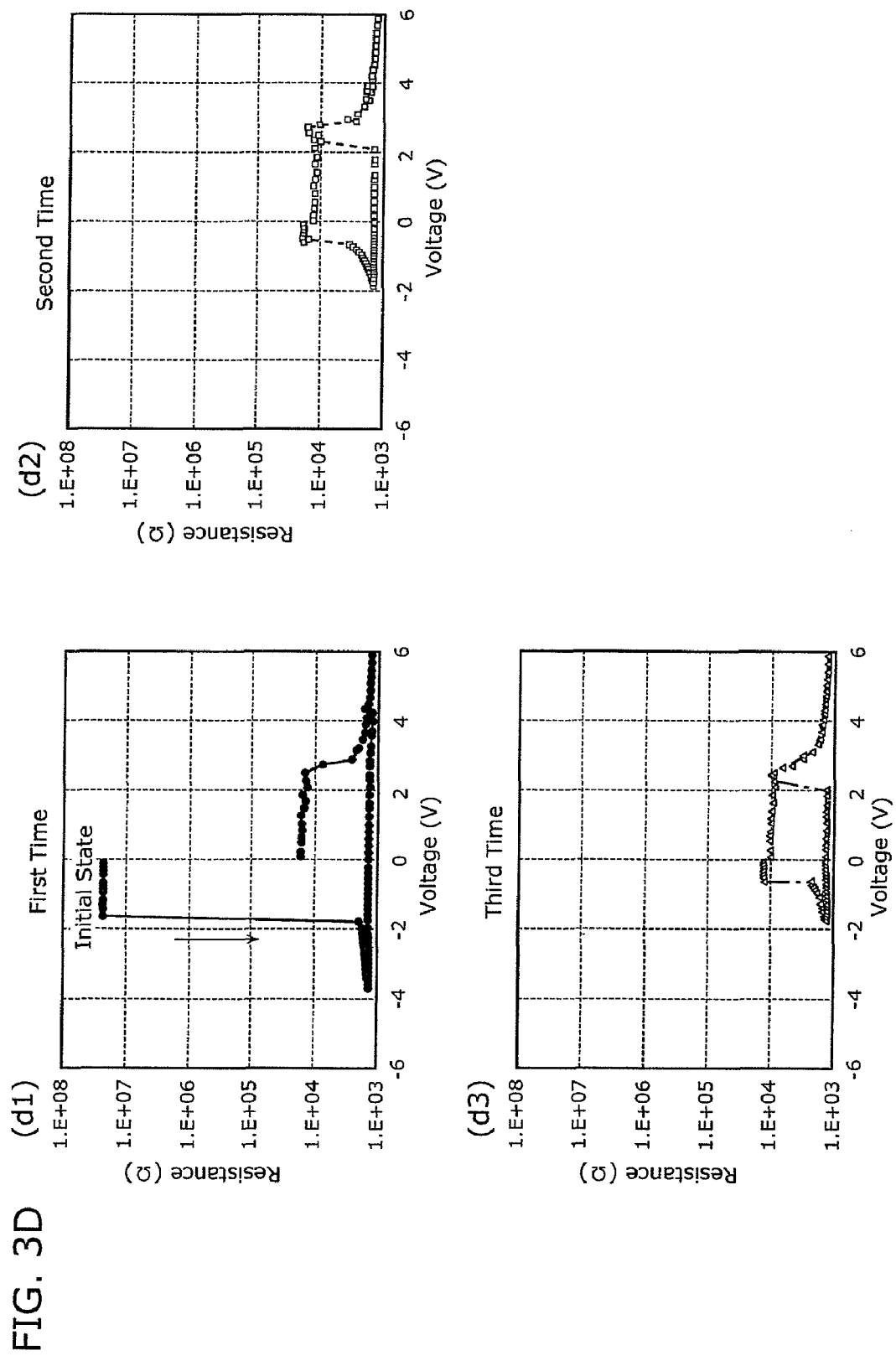
[FIG. 3D] Each of (d1) to (d3) in FIG. 3D is a graph plotting a relationship between a resistance value and an applied pulse voltage according to the basic data of the present invention.
Figure 3E:
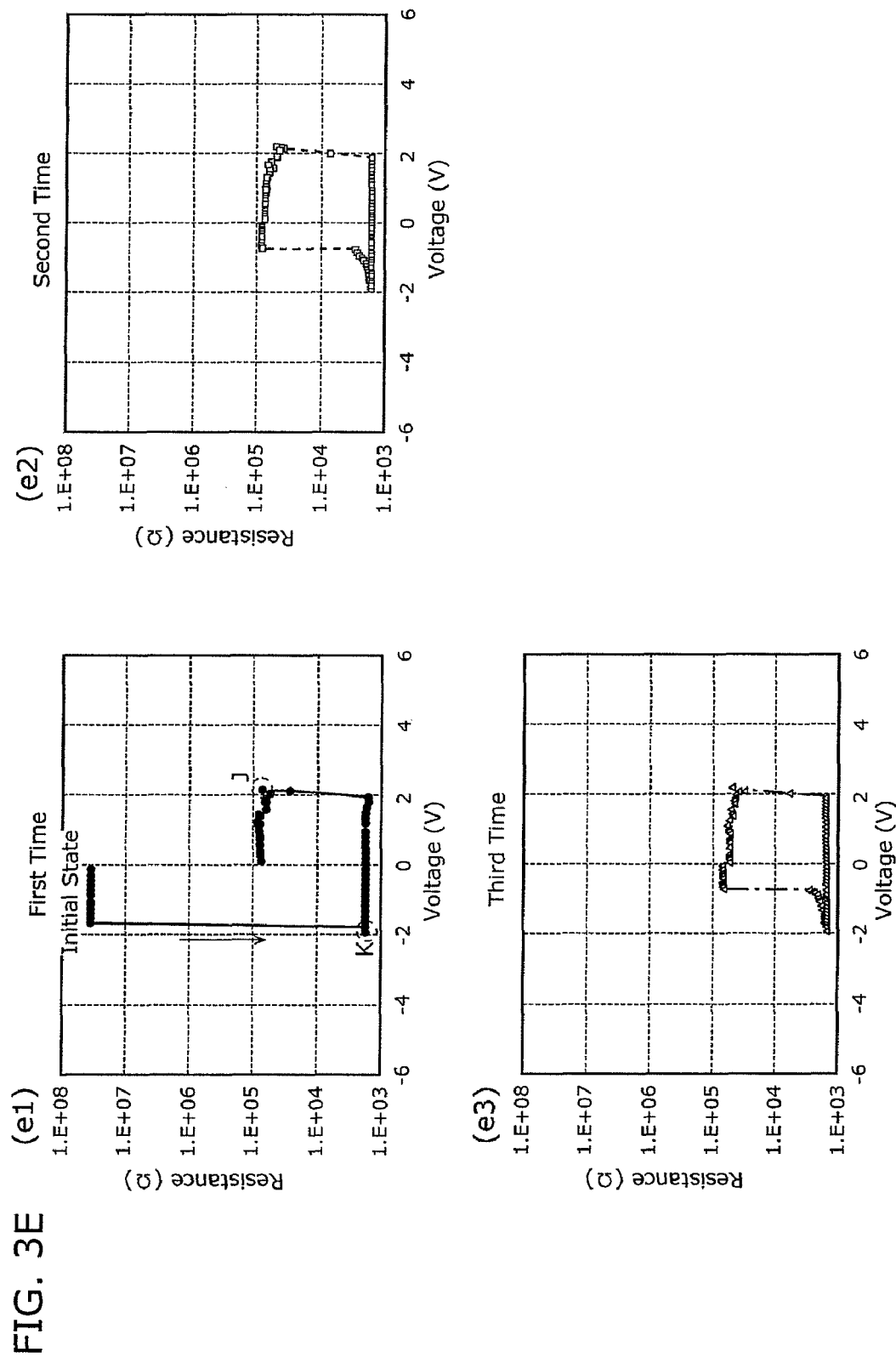
[FIG. 3E] Each of (e1) to (e3) in FIG. 3E is a graph plotting a relationship between a resistance value and an applied pulse voltage according to the basic data of the present invention.

Each of (a1) to (a3) in FIG. 3A, (b1) to (b3) in FIG. 3B, (c1) to (c3) in FIG. 3C, (d1) to (d3) in FIG. 3D, and (e1) to (e3) in FIG. 3E is a graph plotting pulse application R-V characteristics changed from an initial state of the variable resistance element when a voltage pulse is applied to the evaluation circuit under various conditions in the evaluation circuit shown in FIG. 2. Each of the graphs plots characteristics of a state of a resistance value after applying a predetermined pulse. The characteristics are hereinafter referred to also as pulse RV characteristics. In these graphs, a horizontal axis represents a pulse voltage V (with a pulse width of 100 ns) applied between the upper electrode terminal A and the lower electrode side terminal D in the evaluation circuit shown in FIG. 2. The lower electrode side terminal D has a fixed ground potential. Here, application of a positive voltage to the upper electrode terminal A with reference to the lower electrode side terminal D is referred to as positive pulse voltage application, while application of a negative voltage to the upper electrode terminal A with reference to the lower electrode side terminal D is referred to as negative pulse voltage application. A vertical axis represents a resistance value between the upper electrode terminal A and the lower electrode side terminal D after application of each pulse voltage. Here, a resistance measurement voltage is +0.4 V.

Figure 4:
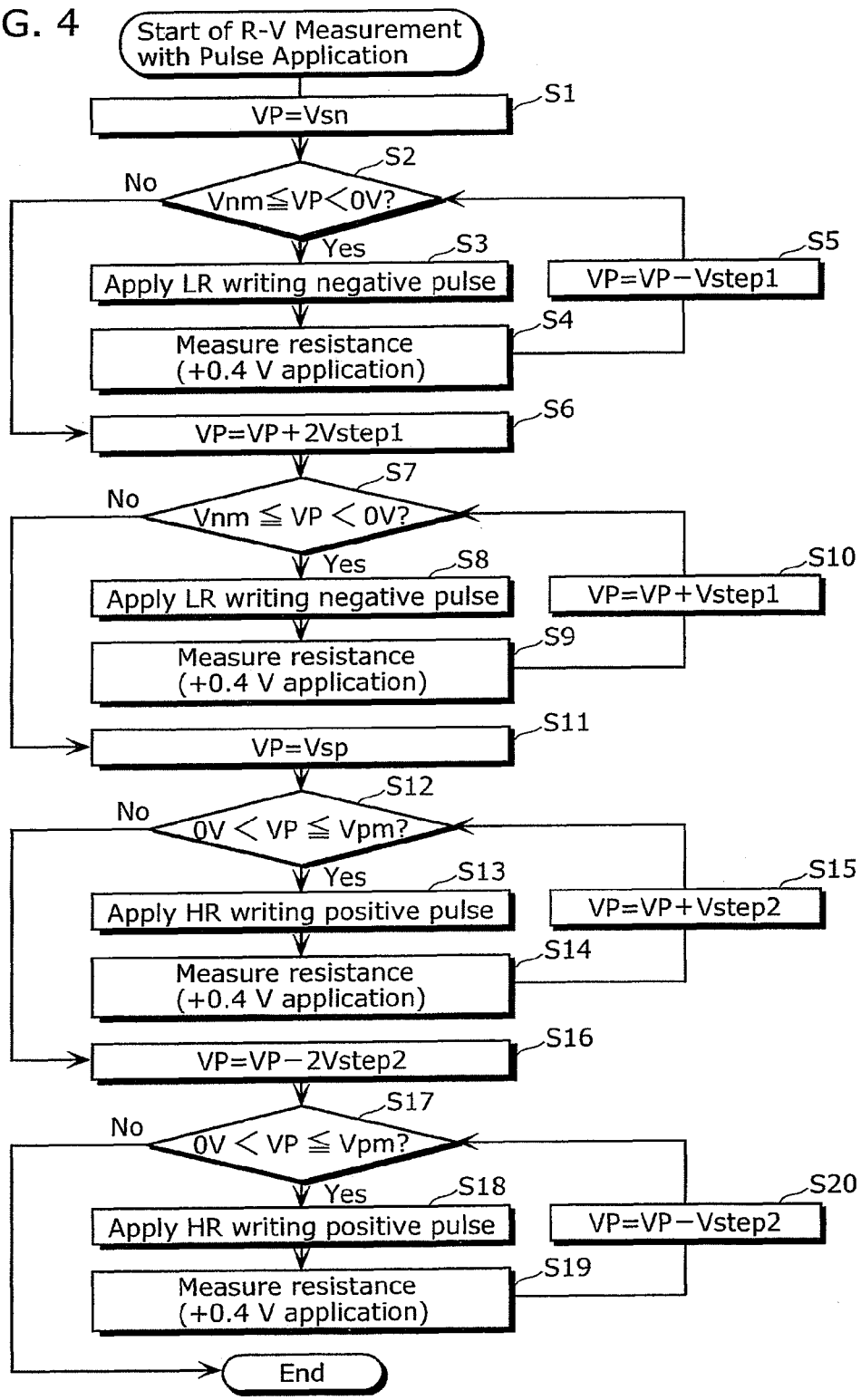
FIG. 4 is a flowchart of measurement of the pulse RV characteristics according to the basic data of the present invention.

FIG. 4 is a flowchart of measurement for the pulse RV characteristics plotted in each of (a1) to (a3) in FIG. 3A, (b1) to (b3) in FIG. 3B, (c1) to (c3) in FIG. 3C, (d1) to (d3) in FIG. 3D, and (e1) to (e3) in FIG. 3E. In the following description, (a1) in FIG. 3A is used as an example for explaining actual numeral values.

1) VP=0 V to −1.85 V

As shown in FIG. 4, at first, a pulse voltage VP is set to be a start voltage Vsn (approximately −0.07 V in (a1) in FIG. 3A) (S1: the first step). Then, it is determined whether or not the pulse voltage VP is lower than 0 V and equal to or higher than a minimum negative voltage Vnm (−1.85 V in (a1) in FIG. 3A) (S2: the second step). If the determination result is true (Yes), then the set pulse voltage VP is used to apply a negative pulse voltage for LR writing (approximately −0.07 V with a pulse width of 100 ns) to the evaluation circuit shown in FIG. 2 (S3: the third step). After that, a voltage of +0.4 V is applied between the upper electrode terminal A and the lower electrode side terminal D to measure a resistance value (S4: the fourth step). Next, the pulse voltage VP is decremented by −Vstep1 (Vstep1=approximately 0.07 V in (a1) in FIG. 3A) to be approximately −0.14 V (S5: the fifth step). Then, the second to fifth steps (S2 to S5) are repeated until the pulse voltage VP becomes lower than the minimum negative voltage Vnm. If the pulse voltage VP becomes lower than the minimum negative voltage Vnm (VP<Vnm) at the second step (S2), then the pulse RV measurement proceeds to the sixth step.

2) VP=−1.85 V to −0 V

In proceeding to the sixth step (S6), the pulse voltage VP is set to be a sum of an immediately-prior pulse voltage VP (approximately −1.89 V in (a1) in FIG. 3A) and 2Vstep1 (newly set VP=approximately −1.75 V in (a1) in FIG. 3A). Next, it is determined whether or not the resulting pulse voltage VP is lower than 0 V and equal to or higher than the minimum negative voltage Vnm (S7: the seventh step). If the determination result is true (Yes), then the set pulse voltage VP is used to apply a negative pulse voltage for LR writing (approximately −7.5 V with a pulse width of 100 ns) to the evaluation circuit shown in FIG. 2 (S8: the eighth step). After that, a voltage of +0.4 V is applied between the upper electrode terminal A and the lower electrode side terminal D to measure a resistance value (S9: the ninth step). Next, the pulse voltage VP is incremented by +Vstep1 to be approximately −1.68 V (S10: the tenth step). After that, the seventh to tenth steps (S7 to S10) are repeated until the pulse voltage VP becomes equal to or higher than 0 V. If the pulse voltage VP becomes equal to or higher than 0 V (VP≧0 V) at the seventh step (S7), then the pulse RV measurement proceeds to the eleventh step (S11).

3) VP=0 V to +6 V

In proceeding to the eleventh step (S11), the pulse voltage VP is set to be the start voltage Vsp (approximately 0.1 V in (a1) in FIG. 3A) (S11: the eleventh step). Next, it is determined whether or not the pulse voltage VP is higher than 0 V and equal to or lower than a maximum positive voltage Vpm (6 V in (a1) in FIG. 3A) (S12: the twelfth step). If the determination result is true (Yes), then the set pulse voltage VP is used to apply a positive pulse voltage for HR writing (approximately 0.1 V with a pulse width of 100 ns) to the evaluation circuit shown in FIG. 2 (S13: the thirteenth step). After that, a voltage of +0.4 V is applied between the upper electrode terminal A and the lower electrode side terminal D to measure a resistance value (S14: the fourteenth step). Next, the pulse voltage VP is incremented by +Vstep2 (Vstep2=approximately 0.2 V in (a1) in FIG. 3A) to be approximately 0.3 V (S15: the fifteenth step). After that, the twelfth to fifteenth steps (S12 to S15) are repeated until the pulse voltage VP becomes higher than the maximum positive voltage Vpm. If the pulse voltage VP becomes higher than the maximum positive voltage Vpm at the twelfth step (S12) (VP>Vpm), then the pulse RV measurement proceeds to the sixteenth step (S16).

4) VP=+6 V to 0 V

In proceeding to the sixteenth step (S16), the pulse voltage VP is set to be a voltage obtained by subtracting 2Vstep2 (newly set VP=approximately 5.7 V in (a1) in FIG. 3A) from an immediately-prior pulse voltage VP (approximately 6.1 V in (a1) in FIG. 3A) (namely, −2Vstep2). Next, it is determined whether or not the resulting pulse voltage VP is higher than 0 V and equal to or lower than the maximum positive voltage Vpm (S17: the seventeenth step). If the determination result is true (Yes), then the set pulse voltage VP is used to apply a positive pulse voltage for HR writing (approximately 5.7 V with a pulse width of 100 ns) to the evaluation circuit shown in FIG. 2 (518: the eighteenth step). After that, a voltage of +0.4 V is applied between the upper electrode terminal A and the lower electrode side terminal D to measure a resistance value (S19: the nineteenth step). Next, the pulse voltage VP is decremented by Vstep2 (namely, −Vstep2) to be approximately 5.5 V (S20: the twentieth step). After that, the seventeenth to twentieth steps (S17 to S20) are repeated until the pulse voltage VP becomes equal to or lower than 0 V. If the pulse voltage VP becomes equal to or lower than 0 V (VP≦0 V) at the seventeenth step (S17), then the pulse RV measurement (one loop) is completed. Hereinafter, every pulse RV characteristics are measured based on the measurement flow described with reference to FIG. 4.

As shown in (a1) in FIG. 3A, if negative voltages having respective absolute values gradually increased (step up) for performing a forming (LR writing) to form a conducting path are applied at first in an initial state (approximately 25 kΩ), application (point. D) of a negative pulse voltage of approximately −1.5 V (namely, a forming start voltage) causes a resistance change to a low resistance state of approximately 2.2 kΩ. At this time, a conducting path is formed, and a forming is performed. After that, the absolute values of the negative pulse voltages step up to approximately −1.8 V, then gradually decreased (step down) to approximately 0 V, and then positive pulse voltages step up to be applied. Thereby, when a positive pulse voltage of approximately 2.1 V is applied, a low resistance state starts changing to a high resistance state (approximately 20 kΩ) (point EH in (a1) in FIG. 3A). Then, at a point E where a positive pulse voltage of approximately 2.4 V is applied, the high resistance value level becomes maximum (approximately 113 kΩ) (point E in (a1) in FIG. 3A). After that, if positive pulse voltages step up from approximately 2.4 V to a maximum approximately 5.9 V (point EL in (a1) in FIG. 3A), the high resistance value level starts decreasing to a low resistance state. Subsequently, if the positive pulse voltages step down from the point EL (+5.9 V), the resistance value R is increased as the positive pulse voltages step down. However, the increase follows a path different from the pulse RV curve of the first step up. After that, if the positive pulse voltages further step down to approximately 0 V, application of the positive pulse voltage of approximately +2.7 V starts saturating the increase of the resistance value, and eventually keeps a high resistance state of approximately 15 kΩ.

Although details are not described, it has been confirmed that, even if, for example, a pulse voltage of +2.4 V and a pulse voltage of +5.9 V corresponding to the point E and the point EL, respectively, which are pulse voltages having the same polarity, are applied alternately, the resistance value alternately changes between a high resistance value and a low resistance value. A pulse voltage region in which only application of pulse voltages having the same polarity can rewrite a resistance value between a high resistance value and a low resistance value as describe above is called a unipolar region. However, as described later, the variable resistance nonvolatile memory element according to the present invention operates as a memory element in a bipolar region, not in a unipolar region. More specifically, the variable resistance nonvolatile memory element according to the prevent invention is a memory element that is reversibly changed between a high resistance state and a low resistance state depending on a polarity of an applied voltage pulse.

Furthermore, as shown in (a2) in FIG. 3A, in the second loop of the pulse RV characteristics measurement, negative pulse voltages are applied stepping up their absolute values to change a high resistance state (approximately 16 kΩ) to a low resistance state. Thereby, at a point D2 where a negative pulse voltage of approximately −0.7 V is applied, the resistance state of the variable resistance nonvolatile memory device is changed to a low resistance state of approximately 3.4 kΩ. After that, the absolute values of the negative pulse voltages step up to approximately −1.8 V to change the resistance state to a low resistance state (approximately 1.5 kΩ), then step down to approximately 0 V, and then positive pulse voltages step up to be applied. Thereby, when the positive pulse voltage of approximately 2.1 V is applied, a low resistance state starts changing to a high resistance state (approximately 5.3 kΩ). Furthermore, at a point E2 where a positive pulse voltage of approximately 2.4 V is applied, the high resistance value level becomes maximum (approximately 9 kΩ). After that, when the positive pulse voltages step up from approximately 2.4 V to maximum approximately 5.9 V, the high resistance value level starts decreasing to a low resistance state. Subsequently, if the positive pulse voltages step down from a point EL2 (+5.9 V), the resistance value R is increased as the positive pulse voltages step down. Here, the increase follows almost the same path as the pulse RV curve of the second step up. After that, if the positive pulse voltages further step down to approximately 0 V, application of the positive pulse voltage of approximately +2.8 V starts saturating the increase of the resistance value, and eventually keeps a high resistance state of approximately 13 kΩ.

After that, as shown in (a3) in FIG. 3A, the same pulse RV characteristics measurement is performed as the third loop. It is seen in the third loop that, once the crest of the point E is over and pulse resistance is changed in a unipolar region, any subsequent application of a positive pulse voltage cannot achieve a significantly high level (approximately 113 kΩ) of the high resistance value level, such as the point E.

Next, the pulse RV characteristics shown in (b1) to (b3) in FIG. 3B are explained. (b1) to (b3) in FIG. 3B have the same specimen conditions as those of (a1) to (a3) in FIG. 3A (refer to FIG. 2 and Table 1). Each of (b1) to (b3) in FIG. 3B shows pulse RV characteristics of another variable resistance element. (b1) in FIG. 3B performs evaluation using the same measurement flow as that in (a1) in FIG. 3A, except a difference in a maximum value of an absolute value of a negative pulse voltage (approximately 2.4 V in (b1) in FIG. 3B). Each of (b2) and (b3) in FIG. 3B performs evaluation using the same measurement flow as that in (a1) in FIG. 3A.

As shown in (b1) in FIG. 3B, negative pulse voltages having greater absolute values gradually increased up to −2.4 V are applied in a low resistance state obtained by a forming. Thereby, after the application of the negative pulse voltages, the high resistance value level becomes maximum (approximately 213 kΩ) at a point F in the first step up of a positive pulse voltage. However, a voltage region width G where the resistance value is approximately 20 kΩ or more is obviously smaller than a voltage region width H where the resistance value is approximately 20 kΩ or more which is seen in (a1) in FIG. 3A.

Furthermore, as shown in (b2) in FIG. 3B, the second loop of the pulse RV characteristics measurement shows almost the same pulse RV characteristics as that in (a2) in FIG. 3A. However, when negative pulse voltages are applied stepping up their absolute values to change a high resistance state (approximately 16 kΩ) to a low resistance state, the resistance state of the variable resistance nonvolatile memory device is changed to a low resistance state of approximately 3.8 kΩ at a point D3 where a negative pulse voltage of approximately −0.6 V is applied. After that, the absolute values of the negative pulse voltages step up to approximately −1.8 V to change the resistance state to a low resistance state (approximately 1.5 kΩ), then step down to approximately 0 V, and then positive pulse voltages step up to be applied. Thereby, when the positive pulse voltage of approximately 2.3 V is applied, the low resistance state starts changing to a high resistance state (approximately 10 kΩ). Furthermore, at a point E3 where a positive pulse voltage of approximately 2.5 V is applied, the high resistance value level becomes maximum (approximately 11 kΩ). After that, when the positive pulse voltages step up from approximately 2.5 V to maximum approximately 5.9 V, the high resistance value level starts decreasing to a low resistance state. Subsequently, if the positive pulse voltages step down from a point EL3 (+5.9 V), the resistance value R is increased as the positive pulse voltages step down. Here, the increase follows almost the same path as the pulse RV curve of the second step up. After that, if the positive pulse voltages further step down to approximately 0 V, application of the positive pulse voltages of approximately +2.6 V starts saturating the increase of the resistance value, and eventually keeps a high resistance state of approximately 11 kΩ. After that, as shown in (b3) in FIG. 3B, the same pulse RV characteristics measurement are performed as the third loop. Likewise the results of (a1) to (a3) in FIG. 3A, in the third loop, once the crest of the point F is over and pulse resistance is changed in the unipolar region, any subsequent application of a positive pulse voltage cannot achieve a significantly high level (approximately 213 kΩ) of the high resistance value level, such as the point F. Here, a difference between the point E (approximately 113 kΩ) seen in (a1) in FIG. 3A and the point F (approximately 213 kΩ) seen in (b1) in FIG. 3B results from variations of the variable resistance element. The difference is not significant.

Next, the pulse RV characteristics shown in (c1) to (c3) in FIG. 3C are explained. (c1) to (c3) in FIG. 3C have the same specimen conditions as those of (a1) to (a3) in FIG. 3A (refer to FIG. 2 and Table 1). Each of (c1) to (c3) in FIG. 3C shows pulse RV characteristics of still another variable resistance element. (c1) in FIG. 3C performs evaluation using the same measurement flow as that in (b1) in FIG. 3B, except a difference in a maximum value of an absolute value of a negative pulse voltage (approximately 2.8 V in (c1) in FIG. 3C). Each of (c2) and (c3) in FIG. 3C performs evaluation using the same measurement flow as that in (a1) in FIG. 3A.

As shown in (c1) in FIG. 3C, negative pulse voltages having greater absolute values gradually increased up to −2.8 V are applied in a low resistance state obtained by a forming. Thereby, after the application of the negative pulse voltages, the high resistance value level becomes maximal (approximately 7.8 kΩ) at a point I in the first step up of a positive pulse voltage. However, as shown in (c1) to (c3) in FIG. 3C, any subsequent application of a positive pulse voltage in the first and third step up cannot achieve the high resistance value level of 20 kΩ or more.

Next, the pulse RV characteristics shown in (d1) to (d3) in FIG. 3D are explained. (d1) to (d3) in FIG. 3D have the same specimen conditions as those of (a1) to (a3) in FIG. 3A (refer to FIG. 2 and Table 1). Each of (d1) to (d3) in FIG. 3D shows pulse RV characteristics of still another variable resistance element. (d1) in FIG. 3D performs evaluation using the same measurement flow as that in (c1) in FIG. 3C, except a difference in a maximum value of an absolute value of a negative pulse voltage (approximately 3.8 V in (d1) in FIG. 3D). As shown in (d1) in FIG. 3D, negative pulse voltages having greater absolute values gradually increased up to −3.8 V are applied in a low resistance state obtained by a forming. Thereby, after the application of the negative pulse voltages, a maximal point of a resistance value level is not observed in the first step up of a positive pulse voltage. As shown in (d1) to (d3) in FIG. 3D, any application of a positive pulse voltage in the first and third step up cannot achieve the high resistance value level of 20 kΩ or more.

According to the results of (a1) in FIG. 3A, (b1) in FIG. 3B, (c1) in FIG. 3C, and (d1) in FIG. 3D, Table 2 shows a relationship between (i) a forming margin Δ represented by a difference between a forming start voltage Vb (negative voltage) and an applied maximum LR writing pulse voltage VpLR (negative voltage), and (ii) a changeable maximum HR (high resistance value level).

TABLE 2

| FIGS. 3A to 3D | (a1) | (b1) | (c1) | (d1) |
|---|---|---|---|---|
| Vb | −1.5 V | −1.7 V | −2.0 V | −1.8 V |
| VpLR | −1.8 V | −2.4 V | −2.8 V | −3.8 V |
| Δ (= Vb − VpLR) | 0.3 V | 0.7 V | 0.8 V | 2.0 V |
| Changeable Maximum HR | approx. 113 kΩ | approx. 213 kΩ | approx. 13 kΩ | approx. 17 kΩ |
| Determination | OK | OK | NG | NG |

As shown in Table 2, it is learned from the experiment results that, when the forming margin Δ is equal to or lower than 0.7 V ((a1) in FIG. 3A, (b1) in FIG. 3B), a forming is possible without decreasing the changeable maximum HR. More specifically, the experiment results show a preferable voltage to be applied in a forming for changing a variable resistance element from (i) the first state after manufacture of the variable resistance element to (ii) the second state changeable between a high resistance state and a low resistance state depending on a polarity of an applied voltage pulse. Assuming that a voltage applied to the lower electrode 100a with reference to the upper electrode 100c is a positive voltage (or, if the voltage is represented by an absolute value of the voltage), this preferable voltage is equal to or higher than a forming start voltage Vb that is a minimum voltage required for a change from the first state to the second state, and also is equal to or lower than a voltage (having an absolute value of 2.4V or smaller, in this example) that is obtained by adding a predetermined voltage (forming margin of 0.7 V, in this example) to the forming start voltage Vb. In other words, in a forming, a preferable voltage pulse to be applied to the variable resistance element is a voltage pulse of a voltage having an absolute value not exceeding an absolute value maximum voltage. The absolute value maximum voltage is a voltage obtained by adding the predetermined voltage to the forming start voltage having a minimum absolute value required to change the variable resistance element from the first state to the second state.

In the experiment, a voltage pulse is applied to a series circuit in which a fixed resistance is connected in series to a variable resistance element. However, since a resistance value (1 kΩ) of the fixed resistance is ignorable as being smaller than an initial resistance value (approximately 20 MΩ) of the variable resistance element, it is possible to consider that almost the same voltage as that applied to the circuit is applied to the variable resistance element.

Next, the pulse RV characteristics shown in (e1) to (e3) in FIG. 3E are explained. (e1) to (e3) in FIG. 3E have the same specimen conditions as those of (a1) to (a3) in FIG. 3A (refer to FIG. 2 and Table 1). Each of (e1) to (e3) in FIG. 3E shows pulse RV characteristics of still another variable resistance element. (e1) to (e3) in FIG. 3E differ from (a1) to (a3) in FIG. 3A in that a maximum value of a positive pulse voltage is set to approximately 2.2 V after a forming in which a negative pulse voltage up to approximately −1.9 V is applied, so that the positive pulse voltage does not enter the unipolar region. As shown in (e1) to (e3) in FIG. 3E, relatively stable hysteresis loops are performed during the first to third loops, while keeping the high resistance value level (48 kΩ to 74 kΩ @ pulse voltage of +2.2 V) higher than that in (a1) to (a3) in FIG. 3A. Therefore, pulse resistance changes using, for example, a usual HR writing pulse voltage of +2.2 V (point J) and a LR writing pulse voltage −1.8 V (point K) result in a significantly wide operation window between a high resistance state (48 kΩ to 74 kΩ) and a low resistance state (approximately 1.5 kΩ to 1.8 kΩ).

Thus, as obvious from the pulse RV properties seen in (a1) in FIG. 3A to (d3) in FIG. 3D, as a negative voltage applied in a forming has a greater absolute value, a maximal resistance value level in first step up of a positive pulse voltage tends to be decreased. This means that there is the following problematic phenomenon not known conventionally. A forming using a negative pulse voltage having an adequately large absolute value in consideration of variations of a forming start voltage for a variable resistance element results in continuous excessive application of a negative pulse voltage for some kinds of variable resistance elements, thereby decreasing the changeable maximum high resistance value level by approximately one decade. As a result, a window between a high resistance state and a low resistance state is significantly narrowed.

In addition, from the pulse RV properties seen in (a1) to (a3) in FIG. 3A and (e1) to (e3) in FIG. 3E, it is obvious that there is another problematic phenomenon. When a resistance state of the variable resistance element is changed to a high resistance state by a pulse resistance change operation after a forming, application of a positive pulse voltage higher than that at the point EH (the point where a minimum voltage is applied to start a change to a high resistance state) causes a change to a high resistance state. Especially, application of a voltage similar to a voltage of the point E (point where a resistance value of the variable resistance element in a high resistance state becomes maximum) can achieve a higher resistance state. However, once the positive pulse voltage enters the unipolar region to cause pulse resistance change, any subsequent application of a positive pulse voltage cannot achieve a significantly high level of the high resistance value level such as the points E and F.

From the above, it is obvious that it is preferable to observe the following two control rules regarding a voltage application pattern, in order to achieve stable pulse resistance change with a wide operation window.

1) The first control rule is to control a forming not to apply excessive negative pulse voltage (forming margin Δ>voltage pulse of 0.7 V) to a variable resistance element (the forming under this control is hereinafter referred to as a "soft forming"). Thereby, it is possible to control the forming to set the changeable high resistance value level (maximal point E) to be higher, and not to sensitively depend on an applied pulse voltage near the maximal point.

2) The second control rule is to control a resistance change operation after a forming not to apply a pulse voltage for HR writing (hereinafter, referred to also as a "HR writing voltage") higher than voltages in the unipolar region (an applied voltage causing a maximum resistance value of a variable resistance element in a high resistance state). Thereby, it is possible to keep a high resistance value of a high resistance state of a variable resistance element. As a result, the variable resistance element can be used in a larger operation window.

Although it is preferable that both of the above two control rules are performed, it is not always necessary in the present invention to perform both of the rules. This is because performing of one of the rules is enough to generate an operation window larger than that in the case where none of the rules are performed.

[Basic Data 2 of Present Invention: Characteristics of 1T1R Memory Cell]

In the basic data 1, assuming on-resistance of a MOS transistor in a 1T1R memory cell is used, the basic characteristics of the variable resistance element 100 are evaluated by using a two-terminal method in an evaluation circuit in which the variable resistance element 100 is connected to an external resistance (1 kΩ). The following, however, describes basic data of a 1T1R memory cell used in the variable resistance nonvolatile memory device according to the present invention.

More specifically, even the use of a 1T1R memory cell can produce the effects of the soft forming as described above. Therefore, the following describes results of the experiment.

Figure 5:
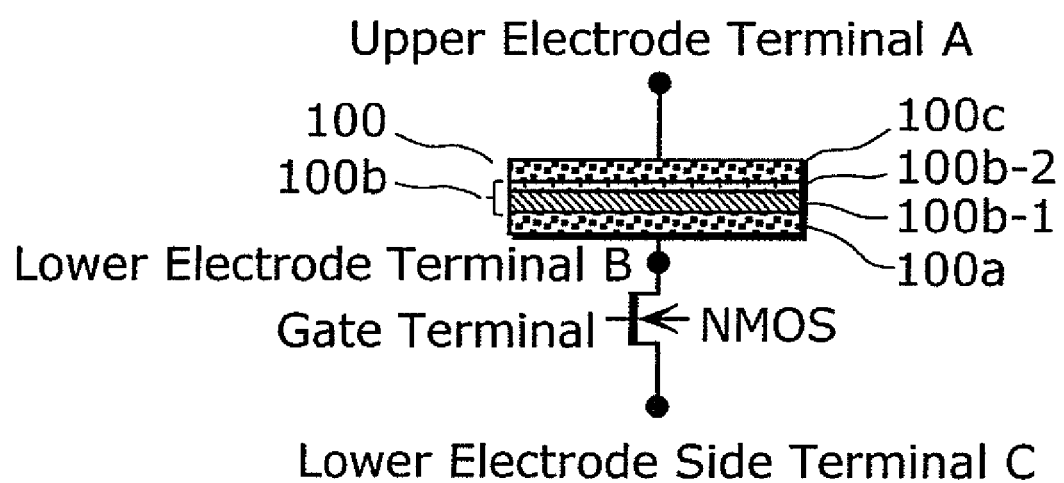
FIG. 5 is a block diagram showing a structure of a 1T1R memory cell according to the basic data of the present invention.

FIG. 5 is a block diagram showing a structure of a 1T1R memory cell including the variable resistance element 100 shown in FIG. 1 which is used in this experiment. The same reference numerals of FIG. 1 are assigned to the identical structural elements of FIG. 5, so that the identical structural elements are not explained again below. In FIG. 5, a NMOS transistor serving as a selection transistor has a gate terminal. The lower electrode terminal B of the variable resistance element 100 is connected in series to an N+ diffusion region of the NMOS transistor. Another N+ diffusion region not connected to the variable resistance element 100 extends from the NMOS transistor as the lower electrode side terminal C. The substrate terminal is connected to a ground potential. Here, it is characterized in that the second oxygen-deficient oxide layer 100b-2 having a high resistance is arranged close to the upper electrode terminal A, namely, arranged opposite to the NMOS transistor.

Figure 6A:
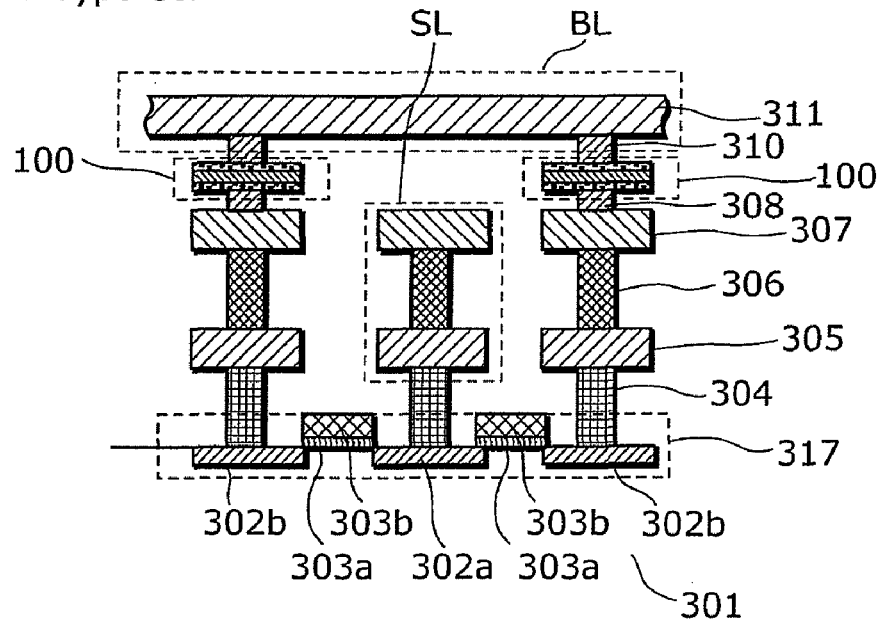
FIG. 6A is a cross-sectional view of one of two kinds of a basic memory cell structure of the 1T1R memory cell according to the basic data of the present invention.
Figure 6B:
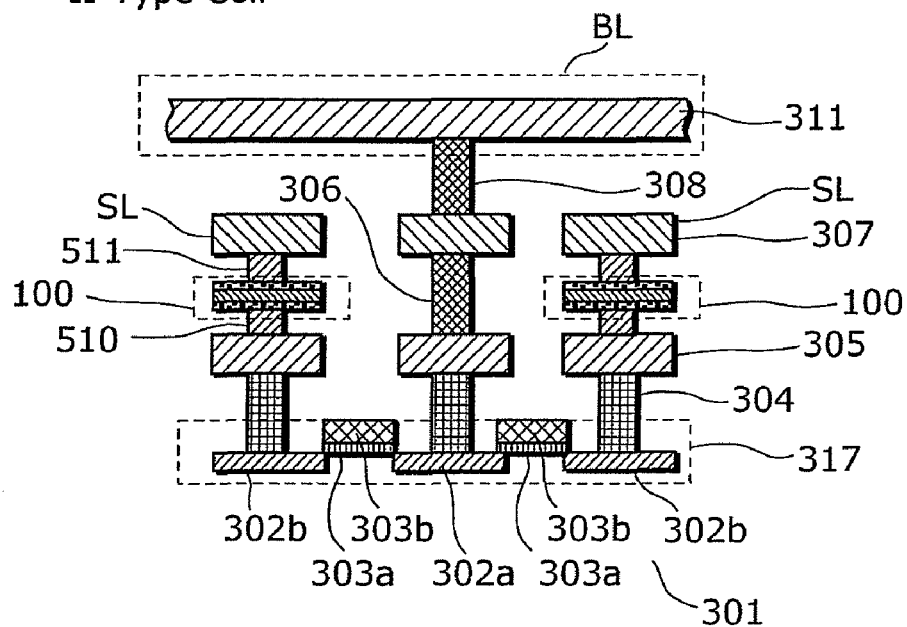
FIG. 6B is a cross-sectional view of the other one of the two kinds of the basic memory cell structure of the 1T1R memory cell according to the basic data of the present invention.

Each of FIGS. 6A and 6B is a cross-sectional view of the 1T1R memory cell including the variable resistance element 100 shown in FIG. 5. The same reference numerals of FIG. 5 are assigned to the identical structural elements of FIGS. 6A and 6B, so that the identical structural elements are not explained again below.

FIG. 6A is a cross-sectional view of a first basic structure for two bits of the 1T1R memory cell.

A transistor 317 corresponds to the NMOS transistor shown in FIG. 5.

On the semiconductor substrate 301, sequentially formed are the first N-type diffusion layer region 302a, the second N-type diffusion layer region 302b, the gate insulation film 303a, the gate electrode 303b, the first via 304, the first line layer 305, the second via 306, the second line layer 307, the third via 308, the variable resistance element 100, a fourth via 310, and the third line layer 311.

The third line layer 311 connected to the fourth via 310 corresponds to a bit line BL. The first line layer 305 and the second line layer 307 which are connected to the first N-type diffusion layer region 302a of the transistor 317 correspond to a source line SL vertically arranged in FIG. 6A.

A voltage of the semiconductor substrate 301 is 0 V, which is supplied from a commonly-known structure of a 0V power source line (not shown).

The variable resistance element 100 has a structure in which the lower electrode 100a, the variable resistance layer 100b, and the upper electrode 100c are sequentially stacked on the third via 308 to form a sandwich shape. The variable resistance element 100 contacts the fourth via 310 connected to the third line layer 311.

Here, a memory cell structure in which an upper electrode of the variable resistance element 100 (an electrode which corresponds to 100c in FIG. 5 and is connected to the second oxygen-deficient oxide layer (100b-2 in FIG. 5) having a greater oxygen content percentage and a high resistance) is connected to a bit line as shown in FIG. 6A is referred to as a I-type cell.

On the other hand, FIG. 6B is a cross-sectional view of the second basic structure for two bits of the 1T1R memory cell.

On the semiconductor substrate 301, sequentially formed are the first N-type diffusion layer region 302a, the second N-type diffusion layer region 302b, the gate insulation film 303a, the gate electrode 303b, the first via 304, the first line layer 305, the first resistance film via 510, the variable resistance element 100, the second resistance film via 511, the second via 306, the second line layer 307, the third via 308, and the third line layer 311.

The third line layer 311 connected to the first N-type diffusion layer region 302a of the transistor 317 corresponds to a bit line BL. The second line layer. 307 connected to the second resistance film via 511 corresponds to a source line SL vertically arranged in FIG. 6B.

A voltage of the semiconductor substrate 301 is 0 V, which is supplied from a commonly-known structure of a 0V power source line (not shown).

The variable resistance element 100 has a structure in which the lower electrode 100a, the variable resistance layer 100b, and the upper electrode 100c are sequentially stacked on the first resistance film via 510 to form a sandwich shape. The variable resistance element 100 contacts the second resistance film via 511 connected to the second line layer 307.

Here, a memory cell structure in which an upper electrode of the variable resistance element 100 (an electrode which corresponds to 100c in FIG. 5 and is connected to the second oxygen-deficient oxide layer (100b-2 in FIG. 5) having a greater oxygen content percentage and a high resistance) is connected to a source line as shown in FIG. 6B is referred to as a II-type cell.

It should be noted that a word line not shown in the structures of FIGS. 6A and 6B is arranged in parallel to the source line SL, in order to apply a gate voltage to the gate electrode 303b.

Here, in the 1T1R memory cell capable of constructing the I-type or II-type cell used in the experiment, the variable resistance element 100 is as indicated in Table 1. In addition, the NMOS transistor has a gate width W of 0.44 μm, a gate length L of 0.18 μm, and a gate oxide layer thickness of 3.5 nm.

The following describes the experiment of the soft forming using the 1T1R memory cell in detail.

Figure 7A:
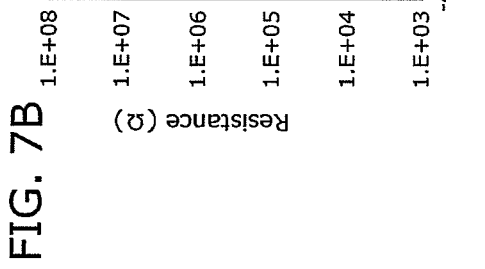
FIG. 7A is a graph plotting a relationship between a resistance value and an applied pulse voltage regarding the 1T1R memory cell according to the basic data of the present invention.
Figure 7B:
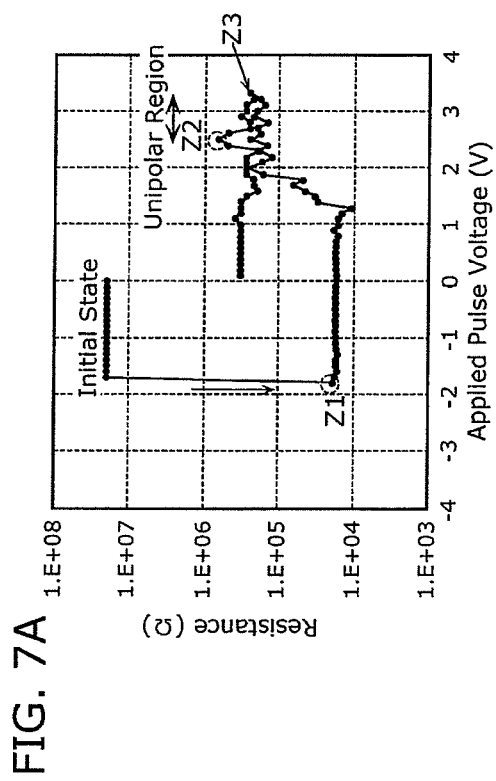
FIG. 7B is a graph plotting a relationship between a resistance value and an applied pulse voltage regarding the 1T1R memory cell according to the basic data of the present invention.
Figure 7C:
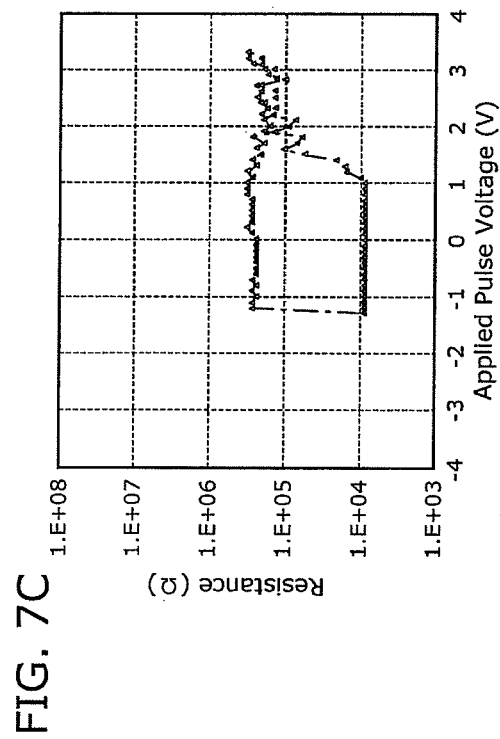
FIG. 7C is a graph plotting a relationship between a resistance value and an applied pulse voltage regarding the 1T1R memory cell according to the basic data of the present invention.

(1) The case that the soft forming is performed and HR writing voltages are applied stepping up to +3.3 V At first, the description is given for the case that the soft forming is performed as a forming and a high voltage belonging to the unipolar region is applied in HR writing (in other words, the case that only the first control rule of the above two control rules is performed). Each of FIGS. 7A to 7C is a graph plotting pulse RV characteristics changed from an initial value of the 1T1R memory cell shown in FIG. 5 and Table 1 with the voltage application pattern of the above case. In the figures, a horizontal axis represents a pulse voltage V (with a pulse width of 50 ns) applied between the upper electrode terminal A and the lower electrode side terminal C in the memory cell shown in FIG. 5. Here, application of a voltage higher than a voltage of the lower electrode side terminal C to the upper electrode terminal A with reference to the lower electrode side terminal C is referred to as positive pulse voltage application, while application of a voltage higher than a voltage of the upper electrode terminal A to the lower electrode side terminal C is referred to as negative pulse voltage application. A vertical axis represents a resistance value between the upper electrode terminal A and the lower electrode side terminal C after application of each pulse voltage (here, a gate voltage Vg=3.3 V). Here, a resistance measurement voltage is +0.4 V (here, a gate voltage Vg=1.8 V).

In FIG. 7A, at first, negative pulse voltages having absolute values gradually increased (step up) are applied from an initial state (approximately 20 MΩ) to perform a forming (LR writing as initialization) to form a conducting path. Then, at a point Z1 where a negative pulse voltage of −1.8 V is applied, the forming results in a low resistance state of approximately 19 kΩ. After the forming, the soft forming is performed by applying the negative pulse voltages stepping down not to have an absolute value higher than that of −1.8 V. Here, the situation of changing a high resistance state to a state having a resistance value less than 40 kΩ is defined as completion of the forming, and any negative pulse voltage having an absolute value greater than that used in the forming is not applied after the forming. Next, positive pulse voltages step up to be applied. When a positive pulse voltage of approximately 1.4 V is applied, the low resistance state is changed to a high resistance state having a resistance value of approximately 31 kΩ. Then, at a point Z2 where a positive pulse voltage of 2.5 V is applied, the high resistance value level becomes maximum (approximately 667 kΩ). Then, when positive pulse voltages step up from 2.5 V to maximum 3.3 V (point Z3), the high resistance value level starts decreasing. Subsequently, if the positive pulse voltages step down from the point Z3 (+3.3 V), the step down follows a path different from the pulse RV curve of the first step up. After that, if the positive pulse voltages further step down to approximately 0 V, the resistance value is eventually kept in a high resistance state of approximately 333 kΩ.

Furthermore, as shown in FIG. 7B, in the second loop of the pulse RV characteristics measurement, negative pulse voltages are applied stepping up their absolute values to change the high resistance state (approximately 333 kΩ) to a low resistance state. Thereby, at a point Z4 where a negative pulse voltage of approximately −1.3 V is applied, the resistance state is changed to a low resistance state of approximately 12.3 kΩ. After that, the absolute values of the negative pulse voltages step down to approximately 0 V, and then positive pulse voltages step up to be applied. Thereby, when a positive pulse voltage of approximately 1.2 V is applied, the low resistance state starts changing to a high resistance state (approximately 24.7 kΩ). Then, at a point Z5 where a positive pulse voltage of approximately 2.2 V is applied, the high resistance value level becomes maximum (approximately 222 kΩ). After that, if positive pulse voltages step up from approximately 2.2 V to maximum approximately 3.3 V, the high resistance value level becomes almost saturated. Subsequently, if the positive pulse voltages step down from a point Z6 (+3.3 V), the resistance value follows almost the same path as that of the saturated high resistance value in the second step up. After that, when positive pulse voltages step down to approximately 0 V to be applied, the resistance value is eventually kept in a high resistance state of approximately 250 kΩ.

After that, as shown in FIG. 7C, the same pulse RV characteristics measurement is performed as the third loop. In the third loop, once the crest of the point Z2 is over and pulse resistance change occurs between the point Z2 and the point Z3 (unipolar region), any subsequent application of a positive pulse voltage cannot achieve a significantly high level (approximately 667 kΩ) of the high resistance value level, such as the point Z2.

Figure 8A:
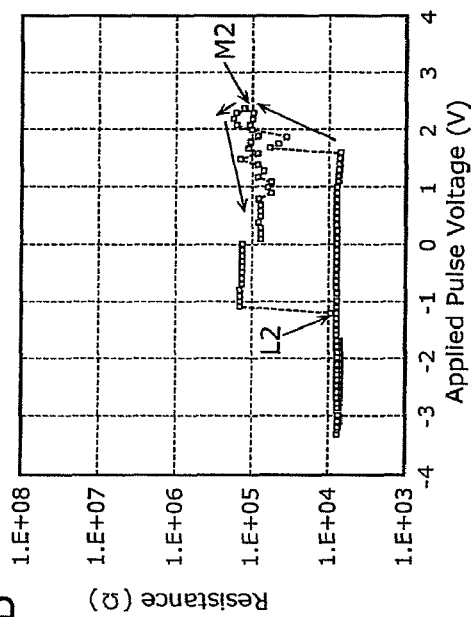
FIG. 8A is a graph plotting a relationship between a resistance value and an applied pulse voltage regarding the 1T1R memory cell according to the basic data of the present invention.
Figure 8C:
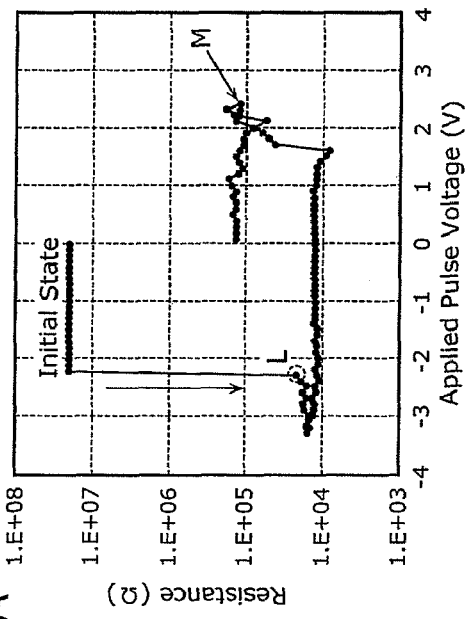
FIG. 8C is a graph plotting a relationship between a resistance value and an applied pulse voltage regarding the 1T1R memory cell according to the basic data of the present invention.
Figure 8B:
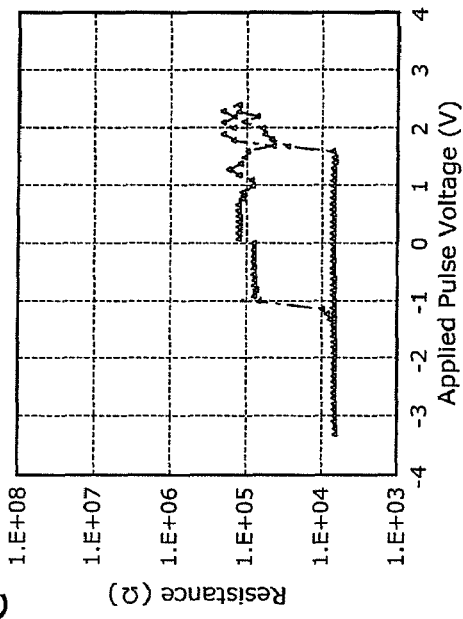
FIG. 8B is a graph plotting a relationship between a resistance value and an applied pulse voltage regarding the 1T1R memory cell according to the basic data of the present invention.

(2) The Case that LR Writing (Forming) Voltages are Applied Stepping Up to −3.3 V and HR Writing Voltages are Applied Stepping Up to +2.4 V Next, the description is given for the case that a voltage higher than that used in the soft forming is applied and a voltage (voltage not in the unipolar region) equal to or lower than a voltage having a maximum resistance value of the variable resistance element for HR writing (in other words, the case that only the second control rule of the above two control rules is performed). Each of FIGS. 8A to 8C is a graph plotting pulse RV characteristics changed from an initial value of the 1T1R memory cell shown in FIG. 5 and Table 1 with the voltage application pattern of the above case. In the figures, a horizontal axis and a vertical axis represent the same as those in FIGS. 7A to 7C, and are therefore not explained again below.

In FIG. 8A, at first, negative pulse voltages having absolute values gradually increased (step up) are applied from an initial state (approximately 20 MΩ) to perform a forming (LR writing as to initialization) to form a conducting path. Thereby, at a point L where a negative pulse voltage of approximately −2.3 V is applied, the forming results in a low resistance state of approximately 22.5 kΩ. After that, an absolute value of negative pulse voltages step up to approximately −3.3 V, then step down to approximately 0 V, and then positive pulse voltages step up to be applied. Thereby, when a positive pulse voltage of approximately 1.7 V is applied, a low resistance state is changed to a high resistance state (approximately 41.7 kΩ). Then, at a point M where a positive pulse voltage of approximately 2.4 V is applied, the high resistance value level is increased to approximately 118 kΩ. After that, when positive pulse voltages step down from +2.4 V, the resistance value is eventually kept in a high resistance state of approximately 133 kΩ.

Furthermore, as shown in FIG. 8B, in the second loop of the pulse RV characteristics measurement, negative pulse voltages are applied stepping up their absolute values from the high resistance state (approximately 133 kΩ) to write for low resistance. Thereby, at a point L2 where a negative pulse voltage of approximately −1.2 V is applied, the resistance state is changed to a low resistance state of approximately 9.6 kΩ. After that, the absolute values of the negative pulse voltages step up to approximately −3.3 V, then step down to approximately 0 V, and then positive pulse voltages step up to be applied. Thereby, when a positive pulse voltage of approximately 1.7 V is applied, a low resistance state is changed to a high resistance state (approximately 60.6 kΩ). Then, at a point M where a positive pulse voltage of approximately 2.4 V is applied, the high resistance value level is increased to approximately 113 kΩ. After that, when positive pulse voltages step down from +2.4 V, the high resistance value level is slightly decreased. Then, when positive pulse voltages step down to approximately 0 V to be applied, the resistance value is eventually kept in a high resistance state of approximately 80 kΩ.

After that, as shown in FIG. 8C, the same pulse RV characteristics measurement are performed as the third loop. The third loop shows the same pulse RV characteristics as seen in FIG. 8B. As described above, even if the applied positive pulse voltage is set to +2.4 V at maximum in order not to enter the unipolar region in the first and third loops, there is a situation that the maximum value (approximately 200 kΩ) of the changeable high resistance value level is lower than the high resistance value level (approximately 667 kΩ) at the point Z2 in FIG. 7A.

Figure 9:
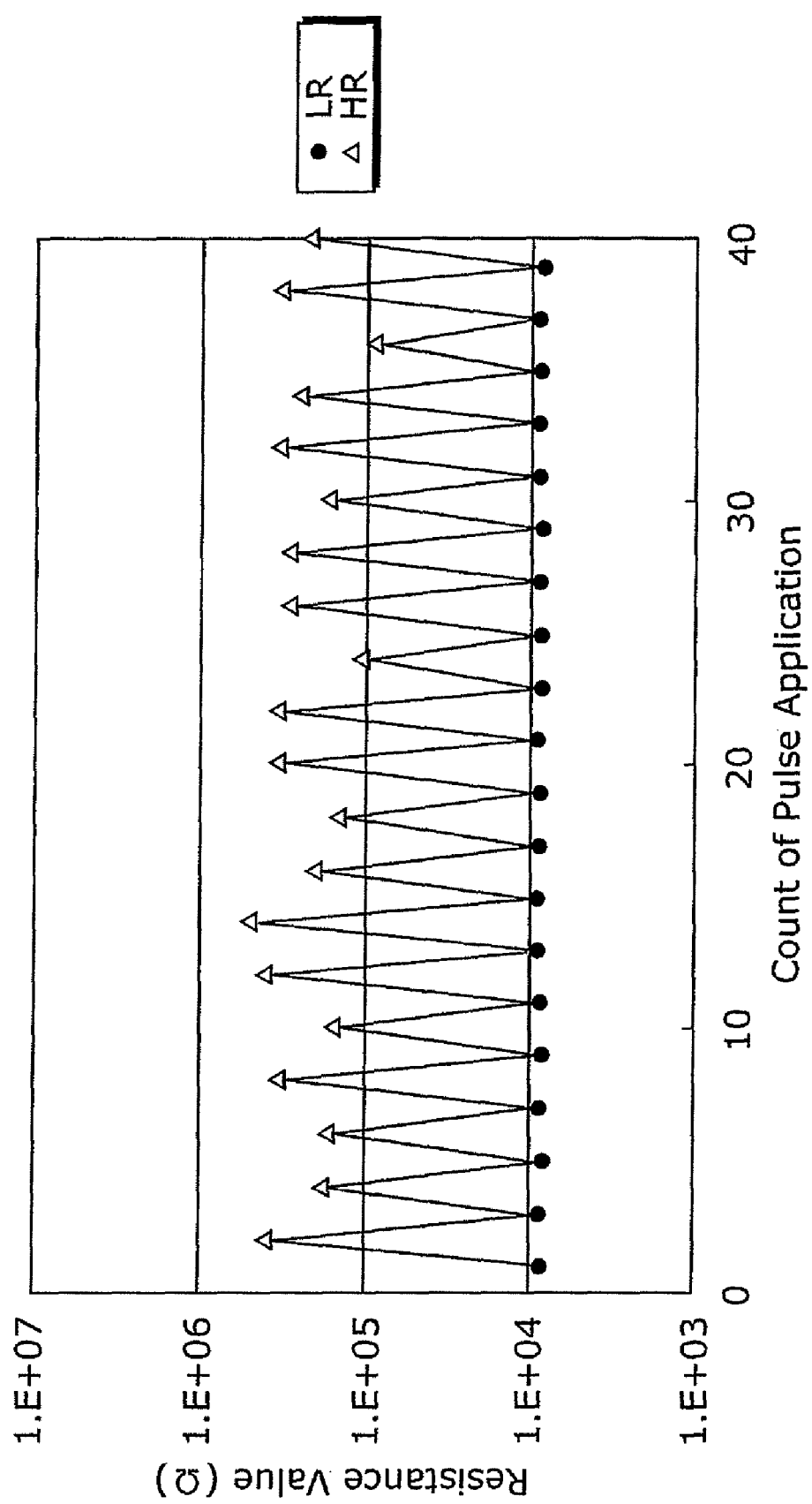
FIG. 9 is a graph plotting a relationship between a resistance value and an electrical pulse application count regarding the 1T1R memory cell according to the basic data of the present invention.

FIG. 9 is a graph plotting each resistance value (resistance measurement voltage of +0.4 V) when a pulse voltage causing LR writing and a pulse voltage causing HR writing are alternately applied to the 1T1R memory cell having the pulse RV characteristics shown in FIGS. 8A to 8C. In the figures, a horizontal axis and a vertical axis represent the same as those in FIG. 53, and are therefore not explained again below.

Figure 53:
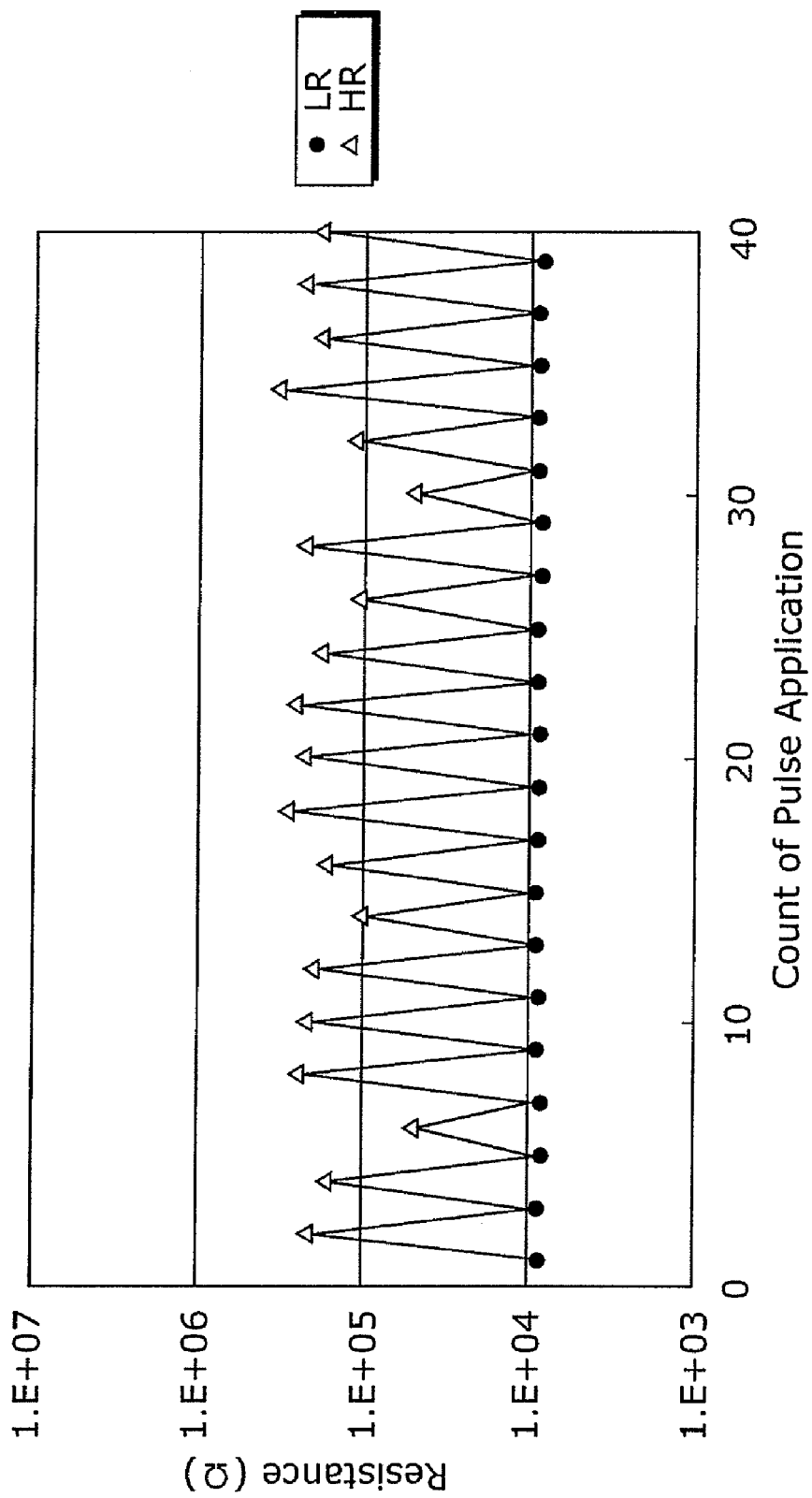
FIG. 53 is a graph showing a relationship between a resistance value and an electrical pulse application count according to the conventional 1T1R memory cell.
Figure 54:
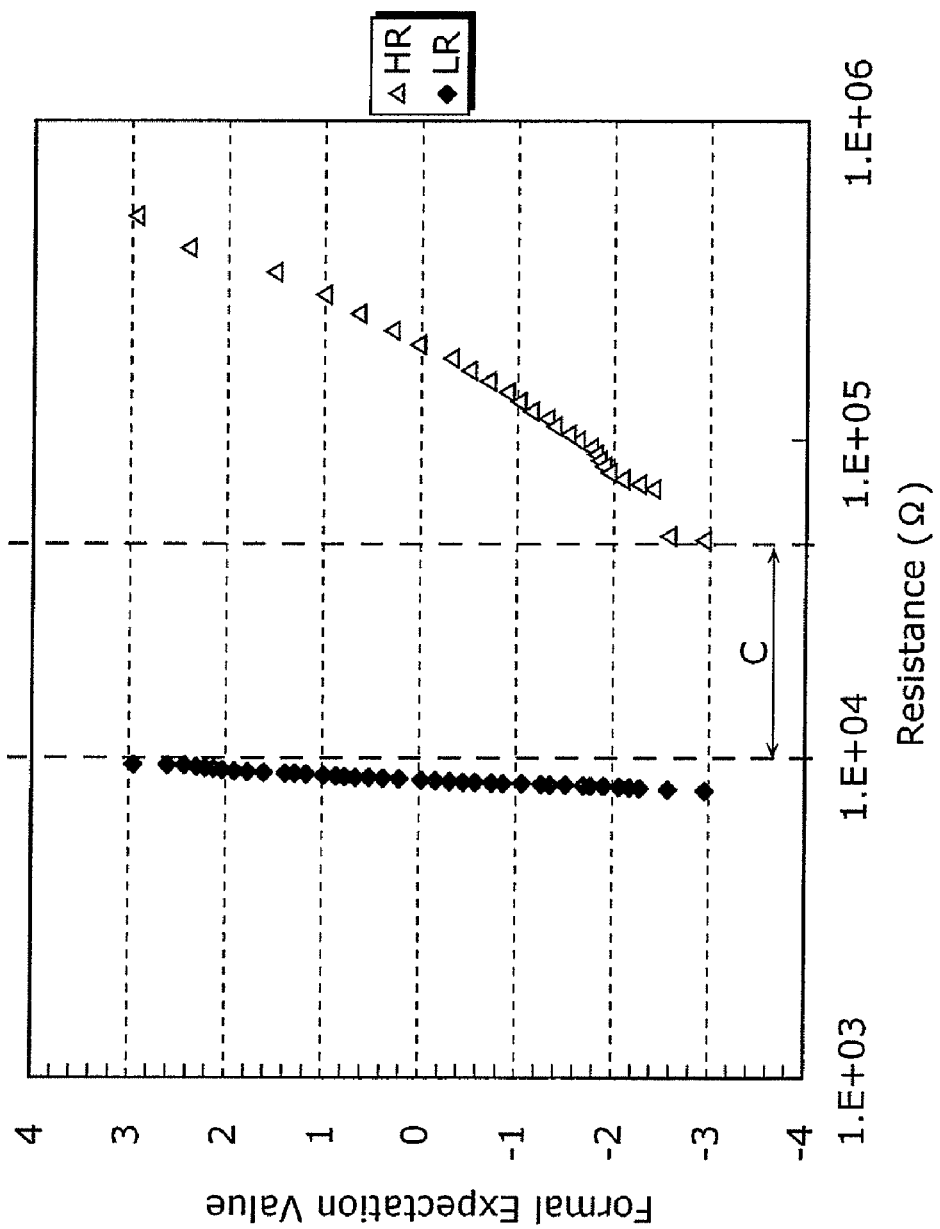
FIG. 54 is a graph showing a relationship between a resistance value and a normalized expectation value regarding a pulse change according to the conventional 1T1R memory cell.

Here, like the pulse change characteristics seen in FIG. 53, a gate voltage Vg=2.4 V is applied to the gate terminal. Then, application of a pulse voltage of +2.4 V (with a pulse width of 50 ns) to the upper electrode terminal A to change a low resistance state LR of approximately 8.8 kΩ(here, the lower electrode side terminal C has a ground potential), in other words, application of a positive pulse voltage of +2.4 V, changes the low resistance state LR to a high resistance state HR of approximately 91 kΩ to 500 kΩ(average 261 kΩ). Next, application of a pulse voltage of +2.4 V (with a pulse width of 50 ns) to the lower electrode side terminal C (here, the upper electrode terminal A has a ground potential), in other words, application of a negative pulse voltage of −2.4 V, changes the high resistance state HR to a low resistance state LR of approximately 8.8 kΩ. The HR writing caused by the positive pulse voltage application and the LR writing caused by the negative pulse voltage application are repeated.

Next, the description is given for experiment results of (a) pulse RV characteristics resulting from the soft forming and (b) pulse change characteristics after the soft forming.

Figure 10A:
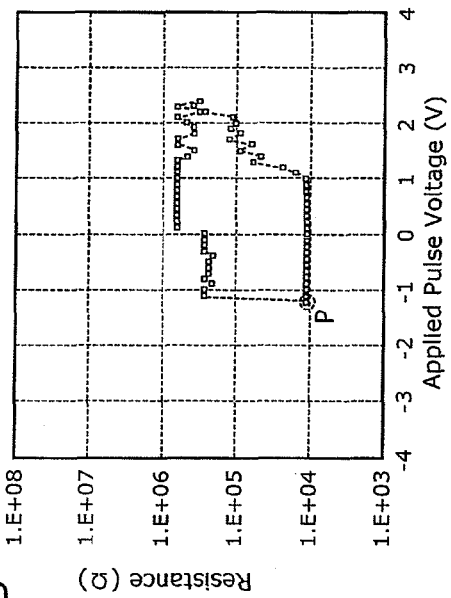
FIG. 10A is a graph plotting a relationship between a resistance value and an applied pulse voltage when the soft forming is performed for the 1T1R memory cell according to the basic data of the present invention.
Figure 10B:
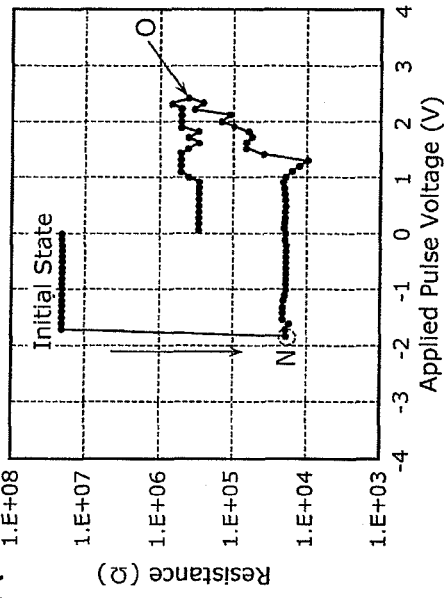
FIG. 10B is a graph plotting a relationship between a resistance value and an applied pulse voltage when the soft forming is performed for the 1T1R memory cell according to the basic data of the present invention.
Figure 10C:
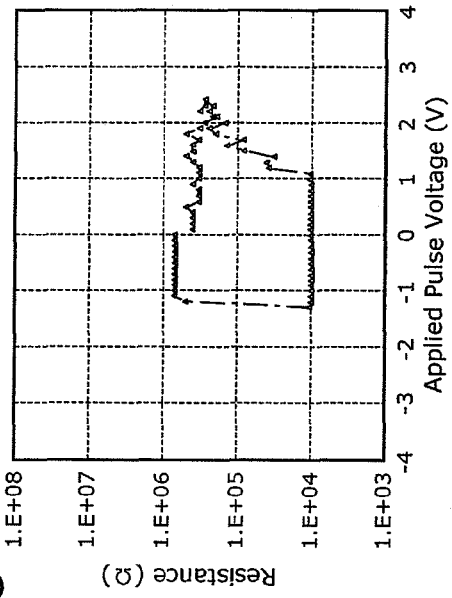
FIG. 10C is a graph plotting a relationship between a resistance value and an applied pulse voltage when the soft forming is performed for the 1T1R memory cell according to the basic data of the present invention.

(3) The Case that the Soft Forming is Performed and HR Writing Voltages are Applied Stepping Up to +2.4 V Next, the description is given to the case that the soft forming is performed as a forming and a voltage (voltage not in the unipolar region) equal to or lower than a voltage having a maximum resistance value of the variable resistance element in HR writing (in other words, the case that both of the two control rules are performed) d. Each of FIGS. 10A to 10C is a graph plotting pulse RV characteristics changed from an initial value of the 1T1R memory cell with the voltage application pattern of the above case. In the figures, a horizontal axis and a vertical axis represent the same as those in FIGS. 8A to 8C, and are therefore not explained again below.

FIG. 10A is a graph of measurement of pulse RV characteristics (the first loop) when the soft forming is performed. The pulse RV characteristics seen in FIG. 10A differ from the pulse RV characteristics seen in FIG. 8A in that negative pulse voltages are applied stepping up their absolute values to perform a forming, and when the forming (LR writing as initialization) is completed and the resistance value is changed to less than 40 kΩ, the absolute values of the negative pulse voltages step down from a point N not to have an absolute value higher than an absolute value of −1.8 V (point N).

Each of FIGS. 10B and 10C is a graph of measurement of pulse RV characteristics when the soft forming is performed. FIG. 10B shows the second loop, and FIG. 10C shows the third loop. The pulse RV characteristics seen in FIGS. 10B and 10C differ from the pulse RV characteristics seen in FIGS. 8B and 8C in that negative pulse voltages are applied stepping up their absolute values to change a high resistance state to a low resistance state, and when the resistance value in the low resistance state reaches less than 40 kΩ, the absolute values of the negative pulse voltages step down from a point P not to have an absolute value greater than an absolute value of the negative pulse voltage (for example, at the point P) causing the change to less than 40 kΩ.

Hereinafter, a minimum pulse voltage (having a minimum absolute value) when a forming is performed from the initial state of the variable resistance element after its manufacture and the resistance value reaches less than 40 kΩ at the first time is referred to as a forming start voltage Vb.

In FIG. 10A, at first, negative pulse voltages having absolute values gradually increased (step up) are applied from an initial state (approximately 20 MΩ) to perform a forming (LR writing as initialization) to form a conducting path. Thereby, at a point N where a negative pulse voltage of approximately −1.8 V is applied, the forming results in a low resistance state of approximately 18.3 kΩ (<40 kΩ). After that, negative pulse voltages are applied stepping down their absolute values in order not to be greater than the absolute value of approximately −1.8 V. Next, positive pulse voltages are applied stepping up their absolute values. When a positive pulse voltage of approximately 1.4 V is applied, the resistance value is changed from a low resistance state to a high resistance state having a resistance value of approximately 38 kΩ. Then, at a point O where a positive pulse voltage of approximately 2.4 V is applied, the high resistance value level is increased to approximately 400 kΩ. Here, likewise FIG. 8A, an applied positive pulse voltage is set to +2.4 V at maximum, in order not to enter the unipolar region. After that, when positive pulse voltages step down from +2.4 V, the resistance value is eventually kept in a high resistance state of approximately 286 kΩ. The second loop seen in FIG. 10B and the third loop seen in FIG. 10C differ from the first loop seen in FIG. 10A in that application of negative pulse voltages of approximately −1.3 V to −1.2 V changes a high resistance state to a low resistance state because the forming has already been performed. However, the changeable maximum high resistance value level caused by positive pulse voltage application hardly varies from the first loop to the third loop.

As described above, regarding the high resistance value level (FIG. 10A) after the application of the positive pulse voltage of +2.4V, the high resistance value level (approximately 400 kΩ) with the soft forming is controlled to have a resistance value approximately 3.4 times as high as the high resistance value level (approximately 118 kΩ) without the soft forming (FIG. 8A). Therefore, only the first control rule is enough to obtain a larger operation window, in comparison to the case that no control rule is performed.

Figure 11:
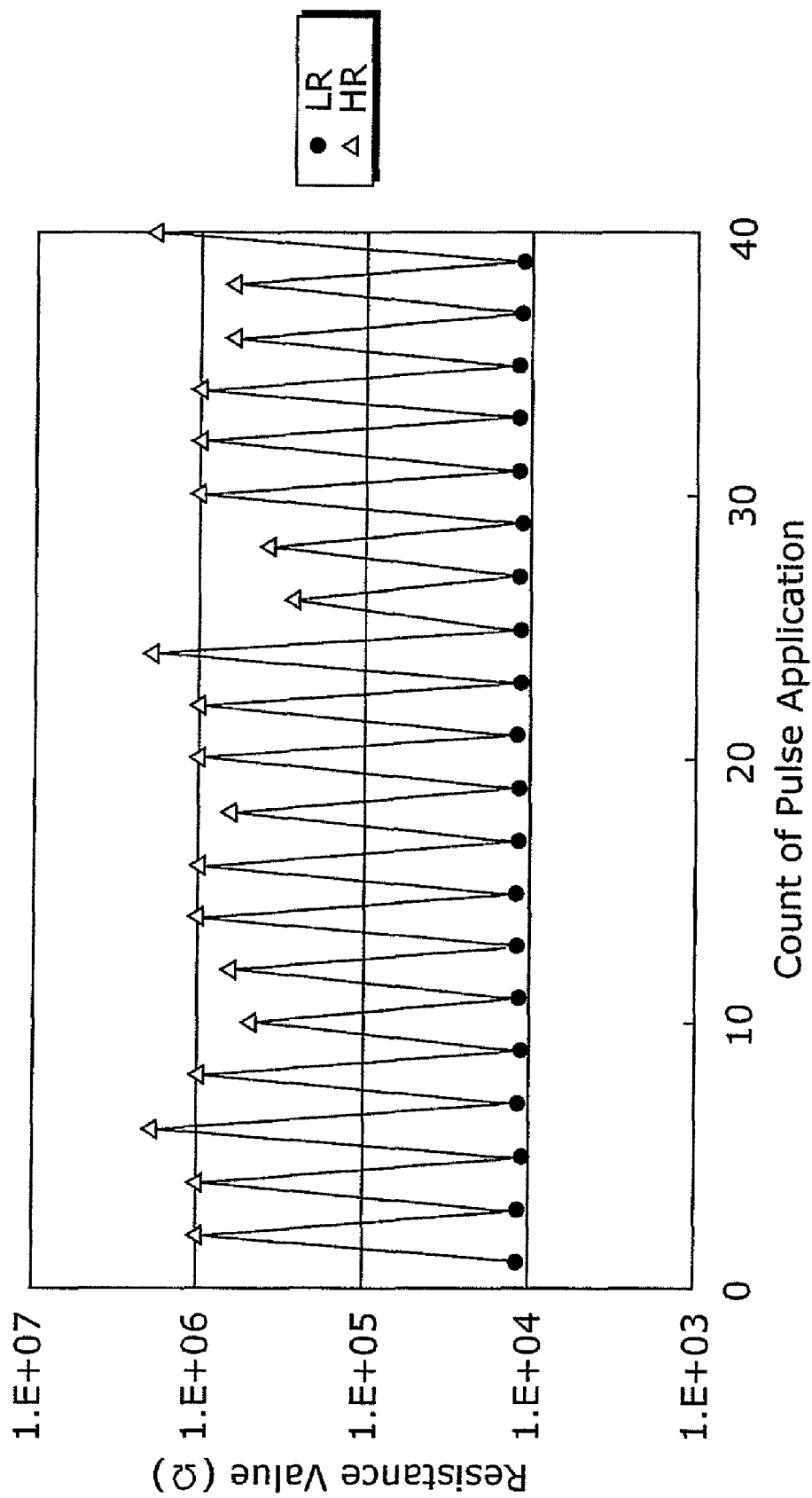
FIG. 11 is a graph plotting a relationship between a resistance value and an electrical pulse application count when the soft forming is performed for the 1T1R memory cell according to the basic data of the present invention.

FIG. 11 is a graph plotting a resistance value (a resistance measurement voltage is 0.4 V) of each application of a voltage to the 1T1R memory cell shown in FIG. 10A for which the soft forming has been performed, in the case that a pulse voltage causing LR writing and a pulse voltage causing HR writing is alternately applied. In FIG. 11, a horizontal axis and a vertical axis represent the same as those in FIG. 53, and are therefore not explained again below.

As seen in FIG. 11, likewise the pulse change characteristics seen in FIG. 9, a gate voltage Vg=2.4 V is applied to the gate terminal. Then, application of a pulse voltage of +2.4 V (with a pulse width of 50 ns) to the upper electrode terminal A to change a low resistance state LR of approximately 11 kΩ (here, the lower electrode side terminal C has a ground potential), in other words, application of a positive pulse voltage of +2.4 V, changes the low resistance state LR to a high resistance state HR of approximately 286 kΩ to 2 MΩ (average 993 kΩ). Next, application of a pulse voltage of +2.4 V (with a pulse width of 50 ns) to the lower electrode side terminal C (here, the upper electrode terminal A has a ground potential), in other words, application of a negative pulse voltage of −2.4 V, changes the high resistance state HR to a low resistance state LR of approximately 11 kΩ. The HR writing caused by the positive pulse voltage application and the LR writing caused by the negative pulse voltage application are repeated. However, since the gate voltage Vg=2.4 V is applied to a gate of the NMOS transistor in the application of the negative pulse voltage of −2.4 V, a voltage of approximately −1.7 V, which is dropped from the gate voltage Vg=2.4 V by a threshold voltage of the NMOS transistor increased by back-bias effects, is applied to both terminals of the variable resistance element 100. On the other hand, a pulse voltage applied to the variable resistance element 100 has an absolute value (1.7 V) smaller than the absolute value (1.8 V) of the forming start voltage Vb (approximately −1.8 V). Therefore, the usual pulse change operation does not decrease the changeable high resistance value level.

Here, when the pulse resistance change characteristics with the soft forming seen in FIG. 11 are compared to the pulse resistance change characteristics without the soft forming seen in FIG. 9, as obvious from the results of the pulse RV characteristics, the high resistance value level (approximately 993 kΩ in average) of a memory cell for which the soft forming has been performed can be controlled to have a high resistance value approximately 3.8 times as high as the high resistance value level (approximately 261 kΩ in average) of the case that the soft forming is not performed. Therefore, only the first control rule is enough to obtain a larger operation window, in comparison to the case that no control rule is performed.

Moreover, the inventors of this application found that, even in the 1T1R memory cell in the experiment, a HR writing voltage capable of setting a maximum high resistance value level is preferably from +2.4 V to +2.6 V close to the point Z in FIG. 7A. Therefore, in the experiment of the pulse VR in FIGS. 8A to 8C and 10A to 10C, a HR writing voltage is set to +2.4 V at maximum in order not to enter the unipolar region, thereby preventing decrease of the changeable high resistance value level. Therefore, only the second control rule is enough to obtain a larger operation window, in comparison to the case that no control rule is performed.

As seen in FIGS. 7A to 7C, the low resistance value level (approximately 9 kΩ to approximately 20 kΩ) in the 1T1R memory cell is higher than the low resistance value level (approximately 1.5 kΩ to approximately 2 kΩ) of the evaluation circuit in which the variable resistance element is connected in series to the fixed resistance (1 kΩ) seen in (a1) to (a3) in FIG. 3A. This is because on-resistance of the NMOS transistor is larger than the fixed resistance (1 kΩ) and a current flowing in LR writing is reduced (see Patent Reference 2). On the other hand, the maximum high resistance value level in the case of performing the soft forming is higher than the low resistance value level in any cases by approximately 2 decades.

In summary, likewise the case that the variable resistance element is connected to a fixed reference, the 1T1R memory cell for which the soft forming (the above-described first control rule) is performed can keep the high resistance value level to be higher than that of the case without the soft forming. Moreover, if pulse resistance change is occurred using a HR writing voltage not causing resistance change in the unipolar region (namely, the above-described second control rule is performed), it is possible to control the high resistance value level to be higher than the case of not performing the second control rule. Therefore, either one of these control rules is enough to enlarge an operation window between a low resistance state and a high resistance state, in comparison to the case that no control rule is performed. Although either one of the two control rules may be performed, it is preferable, of course, to perform both of them.

[Soft Forming of Present Invention (First Control Rule)]

The following summaries the soft forming described in the present invention.

1) Memory Cell Structure

Figure 12B:
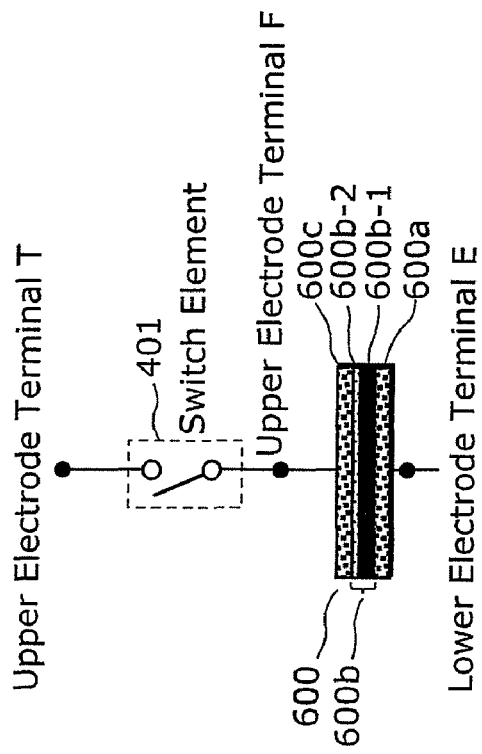
FIG. 12B is a schematic diagram of a memory cell including a variable resistance element satisfying structural requirements according to the basic data of the present invention.
Figure 12A:
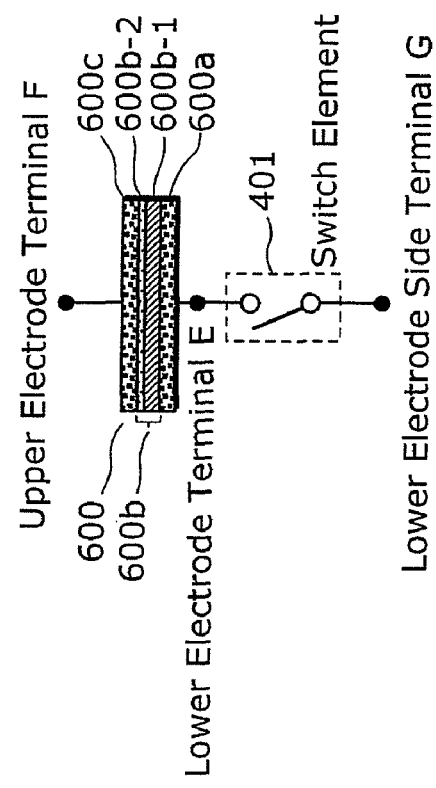
FIG. 12A is a schematic diagram of a memory cell including a variable resistance element satisfying structural requirements according to the basic data of the present invention.

Each of FIGS. 12A and 12B is a schematic diagram of a memory cell including a variable resistance element, which explains the soft forming according to the present invention. As shown in FIG. 12A, a variable resistance element 600 has a structure in which a lower electrode 600a, a variable resistance layer 600b, and an upper electrode 600c are sequentially stacked to form a sandwich shape. A lower electrode terminal E extends from the lower electrode 600a, and an upper electrode terminal F extends from the upper electrode 600c. The variable resistance layer 600b includes a first oxygen-deficient transition metal oxide layer 600b-1 contacting the lower electrode 600a, and a second oxygen-deficient transition metal oxide layer 600b-2 contacting the upper electrode 600c.

The lower electrode terminal E of the variable resistance element 600 is connected to a NMOS transistor, a Positive channel Metal Oxide Semiconductor (PMOS) transistor, or a switch element 401 made of a diode or the like. The other terminal of the switch element 401 which is not connected to the variable resistance element 600 extends as a lower electrode side terminal G.

FIG. 12B is a schematic diagram of a memory cell having a structure of FIG. 12A in which a connection relationship between the variable resistance element 600 and the switch element 401 is reversed. More specifically, the upper electrode terminal F of the variable resistance element 600 is connected to the switch element 401, and the other terminal of the switch element 401 which is not connected to the variable resistance element 600 extends as an upper electrode side terminal T.

Here, the lower electrode 600a comprises tantalum nitride (TaN), tungsten (W), nickel (Ni), tantalum (Ta), titanium (Ti), and aluminium (Al). The upper electrode 600c comprises platinum (Pt), iridium (Ir), palladium (Pd), silver (Ag), copper (Cu), gold (Au), and the like which are likely to occur resistance change.

The second oxygen-deficient transition metal oxide layer 600b-2 has an oxygen content percentage higher than that of the first oxygen-deficient transition metal oxide layer 600b-1. In other words, the second oxygen-deficient transition metal oxide layer 600b-2 has a resistance value higher than that of the first oxygen-deficient transition metal oxide layer 600b-1. Since the variable resistance element 600 therefore has a high initial resistance, resistance change needs application of a forming voltage (LR writing voltage as initialization) higher than usual rewriting voltages, in order to reduce the second oxygen-deficient transition metal oxide layer 600b-2 to form a conducting path.

As described above, the adoption of the memory cell structure shown in FIGS. 12A and 12B makes it possible to perform the soft forming.

2) Relationships among Resistance States

Next, relationships among resistance sates which are required for the soft forming are described.

Figure 13:
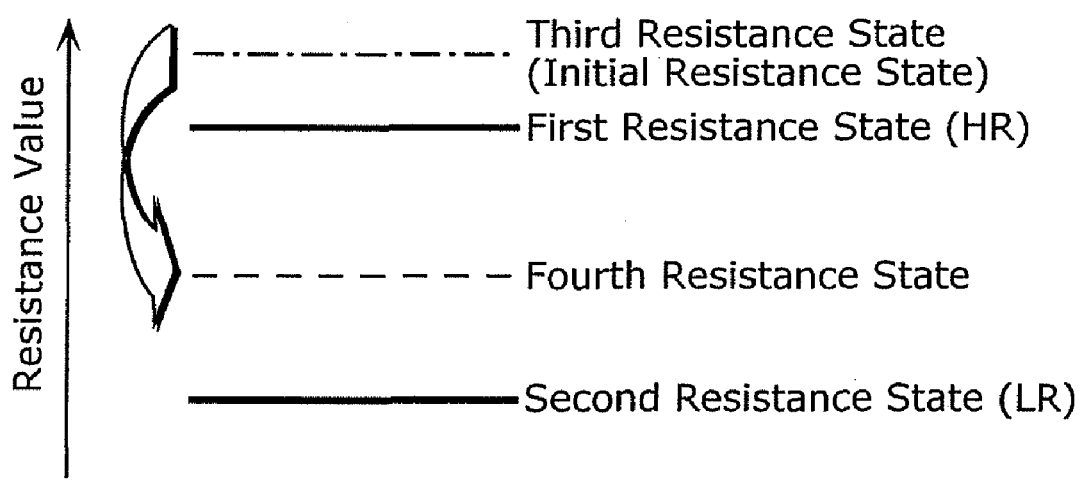
FIG. 13 is a diagram for explaining relationships among respective resistance states in a forming according to the basic data of the present invention.

FIG. 13 is a diagram for explaining relationships among respective resistance states of a variable resistance element in a forming. As seen in FIG. 13, the variable resistance element is in a high resistance state HR that is the first resistance state or in a low resistance state LR that is the second resistance state. In addition, the variable resistance element has an initial resistance state (resistance state of the variable resistance element for which a forming has not yet been performed) that is the third resistance state having a resistance value higher than that of the first resistance state. The state between the high resistance state HR and the low resistance state LR is called the fourth resistance state.

As explained in the experiment, the soft forming is performed in the following way. At first, LR writing voltages in a reduction direction are applied to each memory cell a plurality of times, gradually increasing values of the LR writing voltages to change the third resistance state (initial resistance state). Then, when the third resistance state is changed to the fourth resistance state, the application of the LR writing voltages is stopped not to flow excessive current to each variable resistance element. As described above, the soft forming is performed using a forming voltage Vb that differs depending on memory cells.

3) Distribution of Forming Voltage Vb

Figure 14:
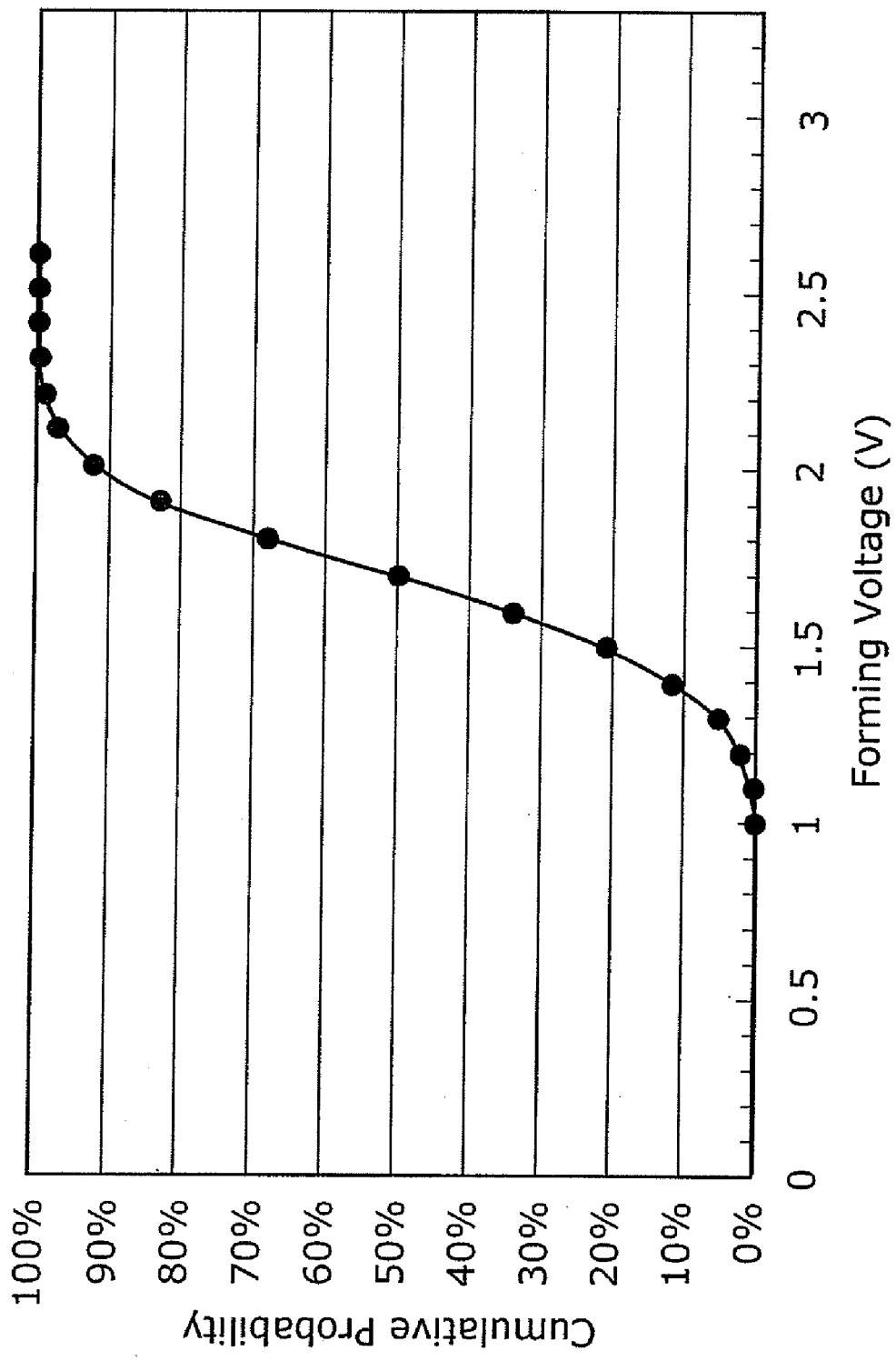
FIG. 14 is a graph plotting cumulative probability distribution of a forming voltage Vb according to the basic data of the present invention.

FIG. 14 shows cumulative probability distribution of a forming voltage Vb in the case that the soft forming is performed for a memory cell array (8 k bits) each including the variable resistance element 100 comprising an oxygen-deficient tantalum oxide which is shown in FIG. 5 and Table 1, gradually increasing voltages (absolute values of the voltages) for each memory cell. In FIG. 14, a horizontal axis represents a forming voltage Vb in the case that the soft forming is performed for each memory cell. A vertical axis represents a probability of completion of the soft forming for variable resistance elements with the use of the forming voltage Vb (here, the probability is a ratio of variable resistance elements for which the soft forming has been done to all variable resistance elements, namely, a cumulative probability). As seen in FIG. 14, the forming voltage Vb significantly varies between 1.1 V and 2.6 V depending on the memory cells. Therefore, it is necessary to perform the soft forming by verifying a resistance value of each variable resistance element.

4) Soft Forming Estimation Mechanism

Figure 15:
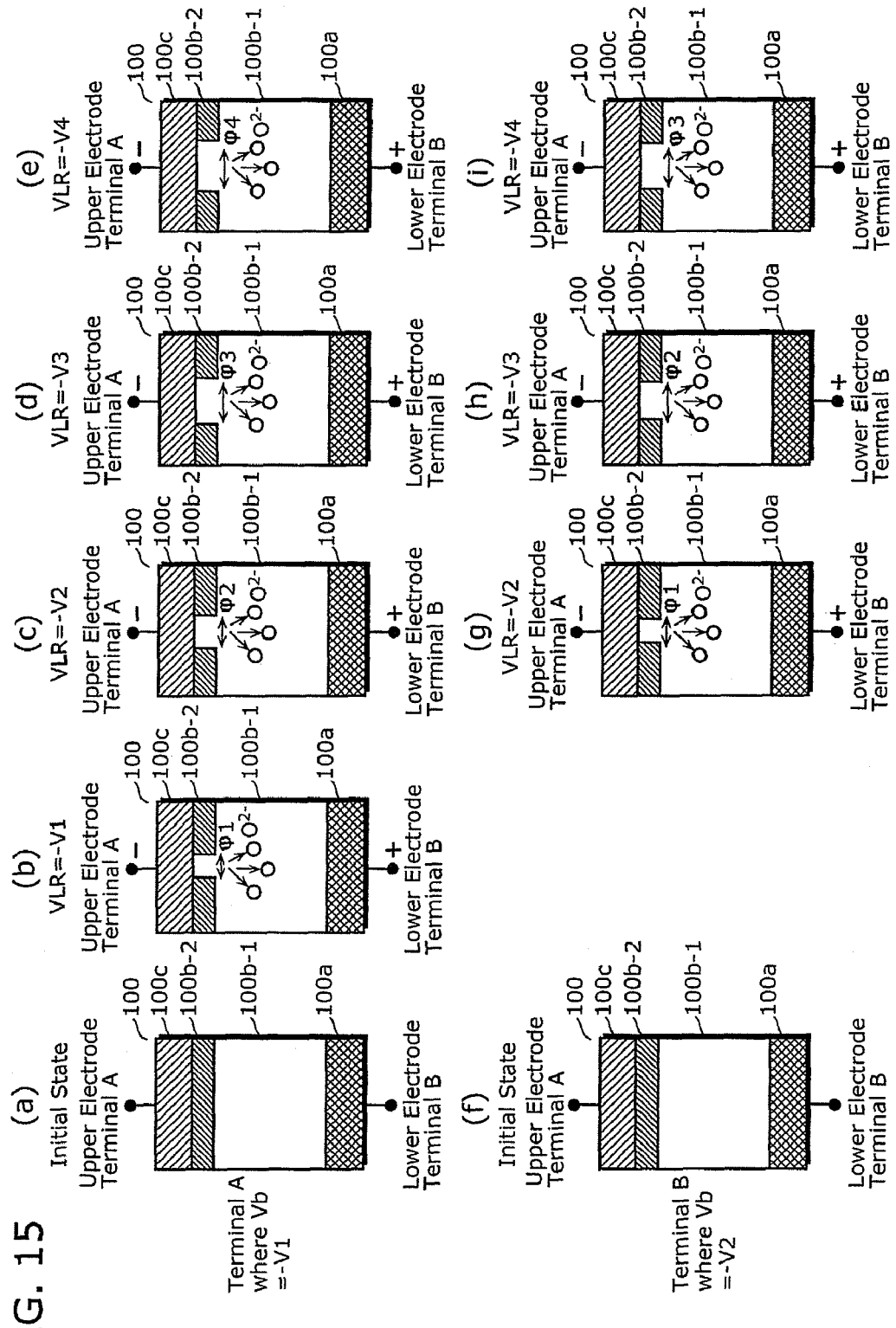
[FIG. 15] Each of (a) to (i) in FIG. 15 is a diagram for explaining an estimation mechanism of the soft forming according to the basic data of the present invention.

Each of (a) to (i) in FIG. 15 is a diagram for explaining a mechanism of estimating the soft forming. The same reference numerals of FIG. 1 are assigned to the identical structural elements of FIG. 15, so that the identical structural elements are not explained again below.

(a) to (e) in FIG. 15 are diagrams for explaining a variable resistance element A, while (f) to (i) in FIG. 15 are diagrams for explaining another variable resistance element B. (a) in FIG. 15 shows an initial state of a variable resistance element 100 (namely, a state where the soft forming has not yet been performed after manufacture). As shown in (b) in FIG. 15, negative voltage pulses is are applied to the variable resistance element 100, gradually increasing absolute values of the negative voltage pulses, and then when the applied negative pulse voltage VLR for LR writing reaches −V1, the second oxygen-deficient tantalum oxide layer 100b-2 as a high resistance layer is reduced by move of oxygen ion $O^{2-}$ towards the lower electrode 100a, thereby forming a conducting path. As a result, the variable resistance element 100 is changed to a low resistance and thereby the soft forming has been performed. Here, it is assumed that a diameter of the conducting path formed by the soft forming using the forming voltage Vb (=−V1) is $\phi 1$. Next, as shown in (c) in FIG. 15, a negative pulse voltage VLR (=−V2, where −V2<−V1) having a greater absolute value is applied to the variable resistance element 100 in the state where the soft forming has been done which is shown in (b) in FIG. 15. Thereby, the high resistance layer (the second oxygen-deficient tantalum oxide layer 100b-2) is further reduced. As a result, the diameter of the conducting path becomes $\phi 2$ (where $\phi 2 > \phi 1$), thereby enhancing the change to a lower resistance. Next, as shown in (d) in FIG. 15, a negative pulse voltage VLR (=−V3, where −V3<−V2) having a further greater absolute value is applied to the variable resistance element 100 in the state shown in (c) in FIG. 15. Thereby, the high resistance layer (the second oxygen-deficient tantalum oxide layer 100-b2) is further reduced. As a result, the diameter of the conducting path becomes $\phi 3$ (where $\phi 3 > \phi 2$), thereby further enhancing the change to a lower resistance. Next, as shown in (e) in FIG. 15, a negative pulse voltage VLR (=−V4, where −V4<−V3) having a still further greater absolute value is applied to the variable resistance element 100 in the state shown in (d) in FIG. 15. Thereby, the high resistance layer (the second oxygen-deficient tantalum oxide layer 100-b2) is further reduced. As a result, the diameter of the conducting path becomes $\phi 4$ (where $\phi 4 > \phi 3$), thereby further enhancing the change to a lower resistance. As shown in (c) to (e) in FIG. 15, application of more excessive negative pulse voltage after the soft forming ((b) in FIG. 15) causes excessive reduction of the second oxygen-deficient tantalum oxide layer 100b-2 as a high resistance layer, thereby increasing the diameter of the conducting path. Thereby, even if the second oxygen-deficient tantalum oxide layer 100b-2 is oxidized by application of HR writing pulse with an opposite polarity, the diameter of the conducting path is greater than $\phi 1$. Therefore, it is not possible to bury enough oxygen into the conducting path in comparison to the case that the soft forming is performed. As a result, it is estimated that the changeable high resistance value level is decreased.

On the other hand, (f) in FIG. 15 shows an initial state of another variable resistance element 100 (the variable resistance element B). As shown in (g) in FIG. 15, negative voltage pulses are applied to the variable resistance element 100, gradually increasing absolute values of the negative voltage pulses, and then when the applied negative pulse voltage VLR for LR writing reaches −V2, the second oxygen-deficient tantalum oxide layer 100b-2 as a high resistance layer is reduced, thereby forming a conducting path. As a result, the variable resistance element 100 is changed to a low resistance and thereby the soft forming has been performed. Here, it is assumed that a diameter of the conducting path formed by the soft forming using the forming voltage Vb (=−V2) is $\phi 1$. Next, as shown in (h) in FIG. 15, a negative pulse voltage VLR (=−V3, where −V3<−V2) having a greater absolute value is applied to the variable resistance element 100 in the state where the soft forming has been done which is shown in (g) in FIG. 15. Thereby, the high resistance layer (the second oxygen-deficient tantalum oxide layer 100b-2) is further reduced. As a result, the diameter of the conducting path becomes $\phi 2$ (where $\phi 2 > \phi 1$), thereby enhancing the change to a lower resistance. Next, as shown in (i) in FIG. 15, a negative pulse voltage VLR (=−V4, where −V4<−V3) having a still further greater absolute value is applied to the variable resistance element 100 in the state shown in (h) in FIG. 15. Thereby, the high resistance layer (the second oxygen-deficient tantalum oxide layer 100-b2) is further reduced. As a result, the diameter of the conducting path becomes φ3 (where φ3>φ2), thereby further enhancing the change to a lower resistance. As shown in (h) to (i) in FIG. 15, application of more excessive negative pulse voltage after the soft forming ((g) in FIG. 15) causes excessive reduction of the second oxygen-deficient tantalum oxide layer 100b-2 as a high resistance layer, thereby increasing the diameter of the conducting path. The soft forming for the variable resistance element B uses the forming start voltage Vb (=−V2) different from the forming start voltage used for the variable resistance element A. This is because the forming start voltage Vb varies depending on a difference of a local thickness of the high resistance layer (the second oxygen-deficient tantalum oxide layer 100b-2). In fact, as shown in FIG. 14, the forming start voltage Vb significantly varies depending on each element.

It should be noted that it has been described above that the variable resistance layer comprises an oxygen-deficient tantalum oxide as an example for explaining the mechanism of estimating the soft forming. However, the variable resistance layer may comprise an oxygen-deficient transition metal oxide for the same estimation mechanism.

[Writing Method of Present Invention (Second Control Rule)]

Figure 16:
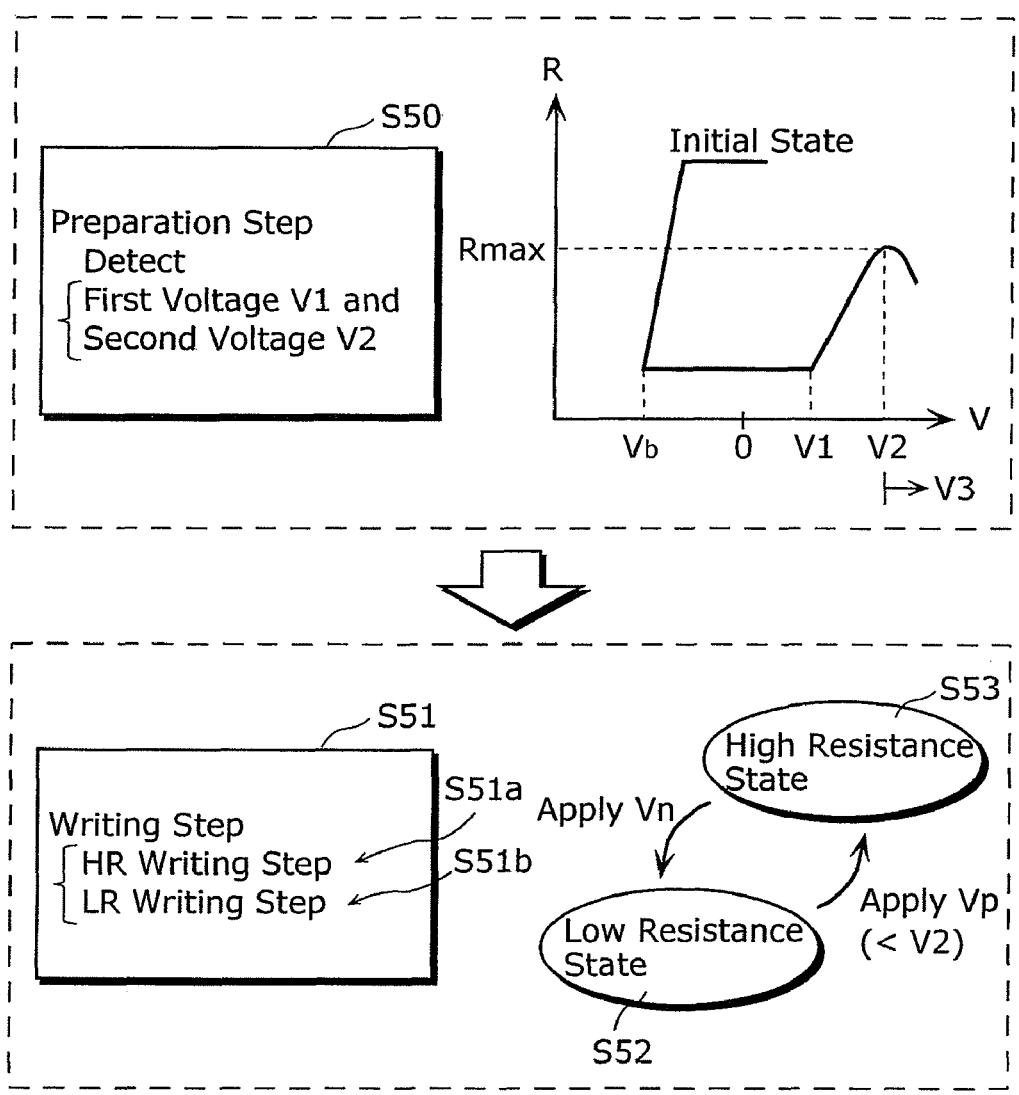
FIG. 16 is a diagram for explaining a writing method according to the basic data of the present invention.

The following describes a method of writing data into the variable resistance element according to the present invention with reference to FIG. 16.

The method of writing data into the variable resistance element according to the present invention is a method of writing data into a variable resistance element changing between a high resistance state and a low resistance state depending on a polarity of an applied voltage pulse (namely, a bipolar variable resistance element). The writing method is mainly divided into a preparation step S50 and a writing step S51 (a HR writing step S51a and a LR writing step S51b).

There is the following assumption. As seen in the pulse RV characteristics at the upper right corner of FIG. 16, when a voltage pulse having an absolute value equal to or greater than that of a first voltage V1 is applied to the variable resistance element, the variable resistance element changes from a low resistance state S52 to a high resistance state S53. Then, when a voltage pulse of a second voltage V2 having an absolute value greater than that of the first voltage V1 is applied to the variable resistance element, the variable resistance element becomes in a high resistance state S53 having a maximum resistance value Rmax. When a voltage pulse of a third voltage V3 having an absolute value greater than that of the second voltage V2 is applied to the variable resistance element, the variable resistance element becomes in a high resistance state having a resistance value smaller than the maximum resistance value Rmax. The above-described characteristics are called unipolar characteristics. In the assumption, each of the first voltage V1, the second voltage V2, and the third voltage V3 is a voltage having a first polarity (positive, for example).

At first, at the preparation step S50, voltage pulses having absolute values gradually increased are sequentially applied to the variable resistance element so as to measure resistance values of the variable resistance element. Thereby, the first voltage V1 and the second voltage V2 are determined.

After that, the variable resistance element is used as a memory element. The writing step S51 is a step for storing data in an operation mode in which the variable resistance element is used as a memory element. The writing step S51 includes the HR writing step S51a and the LR writing step S51b. At the HR writing step S51a, a voltage pulse Vp having a first polarity (positive, for example) is applied to the variable resistance element so that the variable resistance element is changed from the low resistance state S52 to the high resistance state S53. At the LR writing step S51b, a voltage pulse Vn having a second polarity (negative, for example) is applied to the variable resistance element so that the variable resistance element is changed from the high resistance state S53 to the low resistance state S52. Here, the HR writing step S51a is characterized in that the applied voltage pulse has a voltage Vp having an absolute value which is equal to greater than that of the first voltage V1 and equal to or smaller than that of the second voltage V2, more preferably in that the above-described voltage Vp is close to the second voltage V2.

Of course, the preparation step S50 may be eliminated when the characteristics (the first voltage V1 and the second voltage V2) of the variable resistance element is already known or can be predicted.

Although it is desirable that the voltage of the voltage pulse applied at the HR writing step S51a has an absolute value not exceeding that of the second voltage V2, the absolute value may exceed that of the second voltage V2 as long as a high resistance value can be kept in a certain range from the maximum resistance value Rmax of a high resistance state in practice. The range may be determined depending on a width of an operation window to be obtained. For example, if the applied voltage causes a resistance value that is 90% of the maximum resistance value Rmax, the voltage may have an absolute value exceeding that of the second voltage V2 to achieve HR writing.

In the above case, it is also possible that, positive voltage pulses are applied to the variable resistance element, being increased step by step (by 0.1 V increments, for example), so as to measure a resistance value for each application, and then a voltage causing a maximum resistance value from which the resistance value is decreased is determined as a HR writing voltage (or the second voltage V2). Thereby, at maximum, a voltage equal to or lower than a voltage that is a sum of the second voltage V2 and the above-mentioned increment voltage (0.1 V, for example) is determined as a HR writing voltage. Therefore, it is possible to determine an optimum HR writing voltage (preparation step), and perform HR writing by the determined HR writing voltage (writing step). It is also possible that, in order to determine a relationship between a voltage of an applied voltage pulse and a resistance value of the variable resistance element for which the voltage is applied, a plurality of measured points (resistance values obtained by a plurality of voltage applications) are smoothed and a maximum point of the resistance values is determined from the smoothed measurement points in consideration with variations of the resistance values.

It should be noted that the variable resistance element used in the preparation step S50 may be different from the variable resistance element used at the following writing step S51, although they are the same kind. In other words, the variable resistance element used in the preparation step S50 and the variable resistance element used at the following writing step S51 are different elements that have been manufactured under the same manufacture conditions (namely, the variable resistance element used in the preparation step S50 is used only at the preparation step). Since the third voltage V3 having an absolute value exceeding that of the second voltage V2 is applied to the variable resistance element at the preparation step S50, the above-described unipolar characteristics do not allow any subsequent application of voltage pulse to the variable resistance element to recover the resistance value in the high resistance state to reach the maximum resistance value Rmax. However, if the variable resistance element used in the preparation step S50 is different from the variable resistance element used in the writing step S51 (here, these variable resistance elements have been manufactured under the same manufacture condition to have the same characteristics), application of a voltage having an absolute value not exceeding that of the second voltage V2 obtained at the preparation step S50 can cause the HR writing step S51a. As a result, it is possible to change the variable resistance element to the high resistance state S53 having the maximum resistance value Rmax (or close to the maximum resistance value Rmax).

[Variable Resistance Nonvolatile Memory Device according to First Embodiment]

The following describes the 1T1R nonvolatile memory device using the above-described variable resistance elements according to the first embodiment of the present invention.

Figure 17:
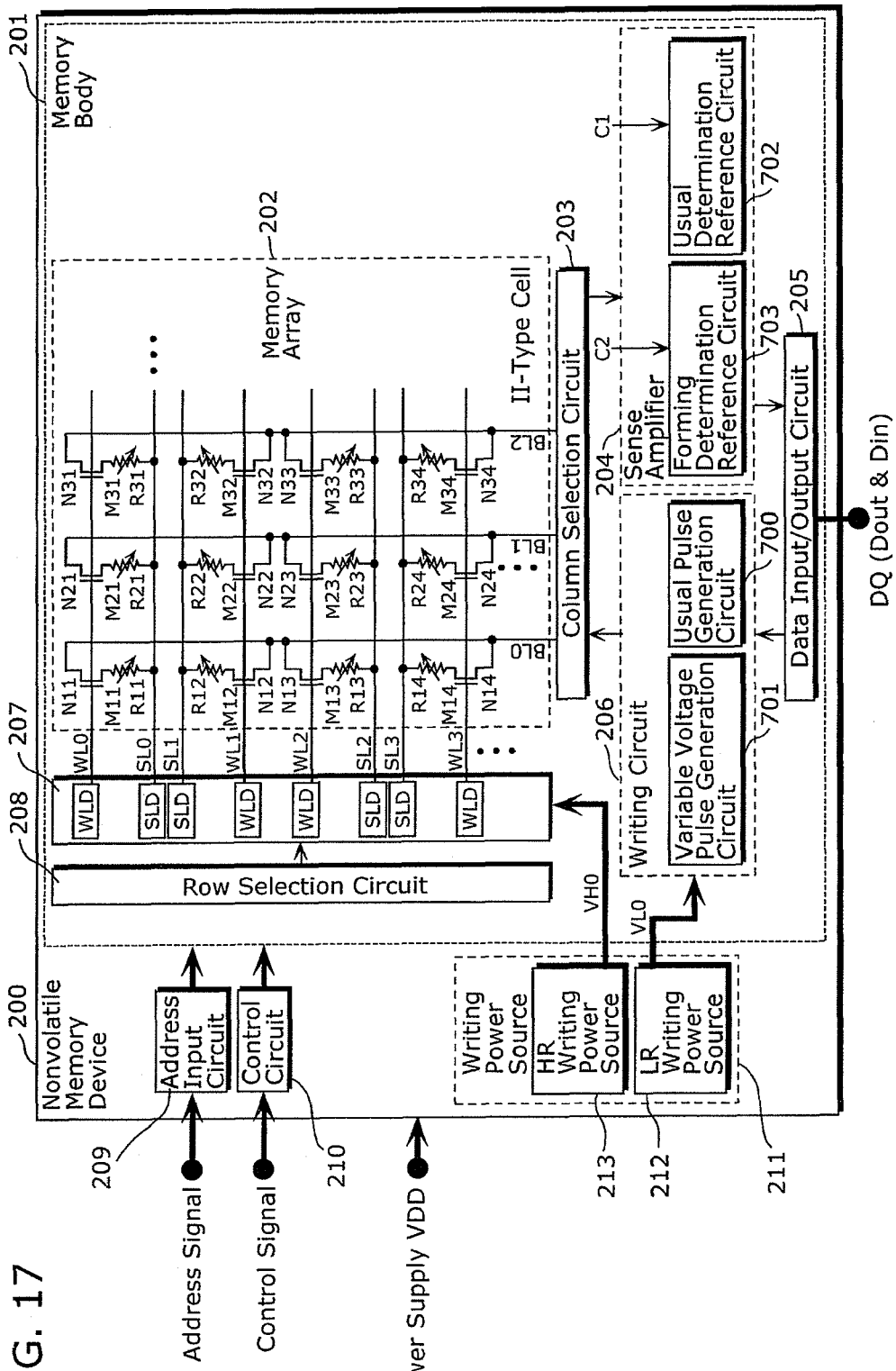
FIG. 17 is a block diagram showing a structure of a variable resistance nonvolatile memory device according to a first embodiment of the present invention.

FIG. 17 is a block diagram showing a structure of the nonvolatile memory device according to the first embodiment of the present invention.

As shown in FIG. 17, the nonvolatile memory device 200 according to the first embodiment includes a memory body 201 formed on a semiconductor substrate. The memory body 201 includes: a memory array 202 including the II-type cells shown in FIG. 6B; a row selection circuit 208; a row driver 207 including word line drivers WLD (referred to also as "word line driver circuits WLD)" and source line drivers SLD (referred to also as "source line driver circuits SLD"); a column selection circuit 203; a writing circuit 206 for data writing; a sense amplifier 204 that detects an amount of current flowing in a selected bit line and thereby determines whether a resistance state is a high resistance state as data "0" or a low resistance state as data "1"; and a data input/output circuit 205 that receives and outputs input/output data via a terminal DQ.

In addition, the nonvolatile memory device 200 includes a HR writing power source 213 and a LR writing power source 212 which form a writing power source 211.

The nonvolatile memory device 200 further includes: an address input circuit 209 that receives address signals from the outside; and a control circuit 210 that controls operations of the memory body 201 based on control signals provided from the outside.

The memory array 202 includes a plurality of word lines WL0, WL1, WL2, . . . and a plurality of bit lines BL0, BL1, BL2, . . . , on the semiconductor substrate. The word lines WL0, WL1, WL2, . . . cross the bit lines BL0, BL1, BL2, . . . , respectively. The memory array 202 also includes a plurality of NMOS transistors N11, N12, N13, N21, N22, N23, N31, N32, N33, . . . (hereinafter, referred to as "transistors N11, N12, . . . ") at respective cross-points between the word lines WL0, WL1, WL2, . . . and the bit lines BL0, BL1, BL2, . . . . The memory array 202 further includes a plurality of variable resistance elements R11, R12, R13, R21, R22, R23, R31, R32, R33, . . . (hereinafter, referred to as "variable resistance elements R11, R12, . . . ") each of which is connected in series to a corresponding one of the transistors N11, N12, . . . to form a pair. As a result, each of the pairs serves as a corresponding one of memory cells M11, M12, M13, M21, M22, M23, M31, M32, M33, . . . (hereinafter, referred to as "memory cells M11, M12, . . . ").

As shown in FIG. 17, gates of the transistors N11, N21, N31, . . . are connected to the word line WL0, gates of the transistors N12, N22, N32, . . . are connected to the word line WL1, gates of the transistors N13, N23, N33, . . . are connected to the word line WL2, and gates of the transistors N14, N24, N34, . . . are connected to the word line WL3.

Furthermore, drains of the transistors N11, N12, N13, N14, . . . are connected to the bit line BL0, drains of the transistors N21, N22, N23, N24, . . . are connected to the bit line BL1, and drains of the transistors N31, N32, N33, N34, . . . are connected to the bit line BL2.

Moreover, the variable resistance elements R11, R21, R31, . . . are connected to the source line SL0, the variable resistance elements R12, R22, R32, . . . are connected to the source line SL1, the variable resistance elements R13, R23, R33, . . . are connected to the source line SL2, and the variable resistance elements R14, R24, R34, . . . are connected to the source line SL3.

The address input circuit 209 receives address signals from an external circuit (not shown). Based on the address signals, the address input circuit 209 provides row address signals to the row selection circuit 208 and column address signals to the column selection circuit 203. Here, the address signals are signals indicating an address of a certain memory cell selected from the plurality of memory cells M11, M12, . . . .

In a data writing cycle, the control circuit 210 provides the writing circuit 206 with a write command signal instructing application of a writing voltage, based on input data Din provided to the data input/output circuit 205. On the other hand, in a data reading cycle, the control circuit 210 provides the sense amplifier 204 with a read command signal instructing a reading operation.

The row selection circuit 208 receives row address signals from the address input circuit 209. Based on the row address signals, the row selection circuit 208 causes the row driver 207 to apply a predetermined voltage to a word line selected in the row address signals, by using a word line driver circuit WLD corresponding to one of the plurality of word lines WL0, WL1, WL2, . . . .

At the same time, when the row selection circuit 208 receives the row address signals from the address input circuit 209, the address input circuit 209 causes, based on the row address signals, the row driver 207 to apply a predetermined voltage to a source line selected in the row address signals, by using a source line driver circuit SLD corresponding to one of the plurality of source lines SL0, SL1, . . . .

The column selection circuit 203 receives column address signals from the address input circuit 209. Based on the column address signals, the column selection circuit 203 selects one of the plurality of bit lines BL0, BL1, BL2, . . . , and applies a writing voltage or a reading voltage to the selected bit line.

The writing circuit 206 includes a usual pulse generation circuit 700 and a variable voltage pulse generation circuit 701. When the writing circuit 206 receives a usual write command signal from the control circuit 210, the usual pulse generation circuit 700 is activated to apply a writing voltage (writing voltage pulse) to the bit line selected by the column selection circuit 203. When the writing circuit 206 receives a forming signal from the control circuit 210, the variable voltage pulse generation circuit 701 is activated to apply a forming voltage (forming voltage pulse) to the bit line selected by the column selection circuit 203.

The sense amplifier 204 is an example of a reading unit which determines (detects) a resistance value of a variable resistance element in the memory cell selected by the row selection circuit 208 and the column selection circuit 203. The sense amplifier 204 includes a usual determination reference circuit 702 and a forming determination reference circuit 703. The usual determination reference circuit 702 has a determination level used for usual reading operations, and the forming determination reference circuit 703 has a determination level used for forming. The usual determination reference circuit 702 and the forming determination reference circuit 703 are controlled by a reading enable signal C1 and a forming enable signal C2, respectively, provided from the control circuit 210, so that one of the determination levels is selected to determine whether data in the selected cell is "1" or "0". The determination result is provided as output data DO to an external circuit via the data input/output circuit 205. Here, the usual reading refers to determination of a resistance state (high resistance state/low resistance state) of a variable resistance element for which a forming has been performed.

The writing power source 211 includes the HR writing power source 213 and the LR writing power source 212. An output VHO of the HR writing power source 213 is provided to the row driver 207, while an output VLO of the LR writing power source 212 is provided to the writing circuit 206.

Figure 18:
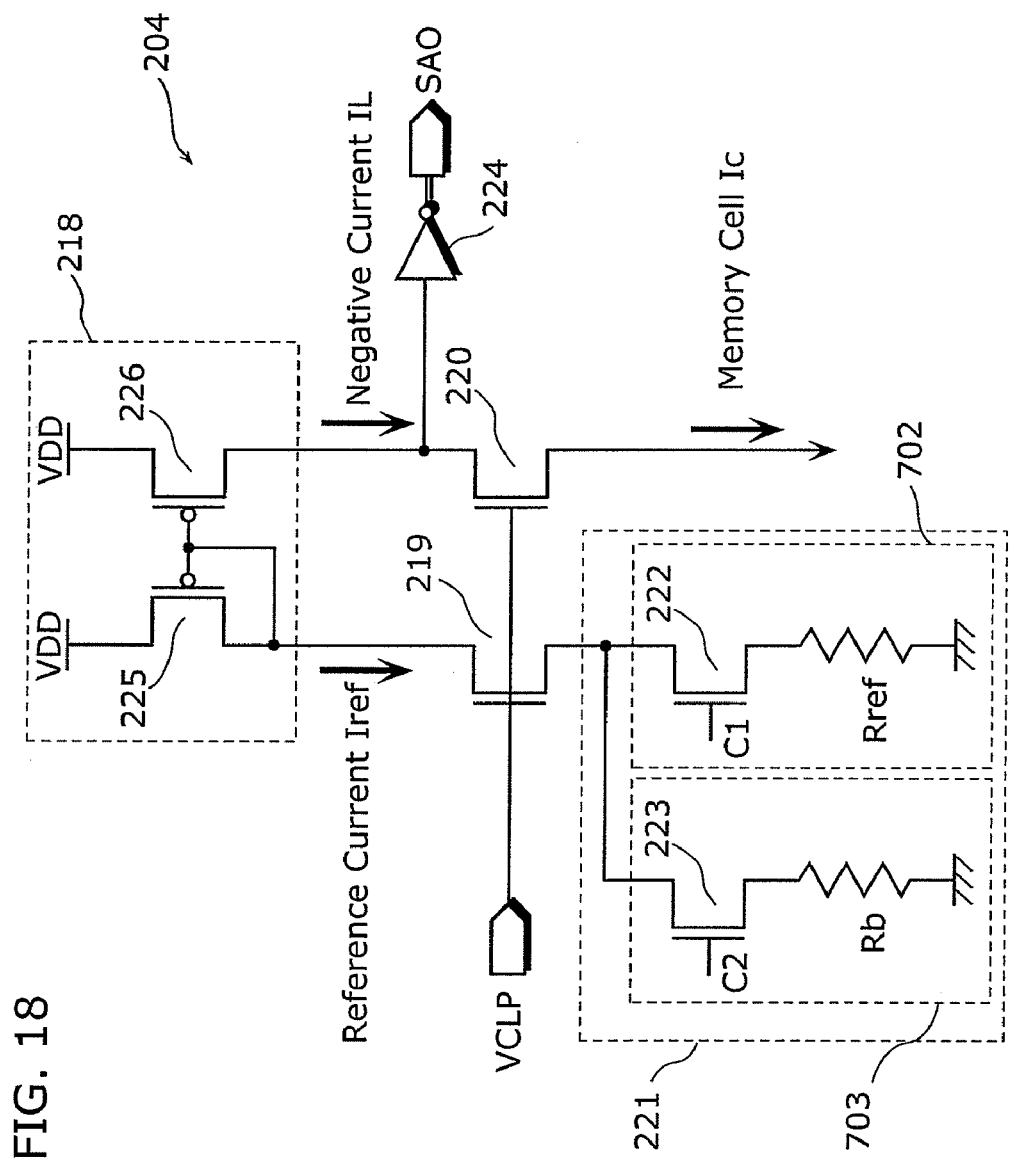
FIG. 18 is a circuit diagram showing an example of a structure of a sense amplifier according to according to the first embodiment of the present invention.

FIG. 18 is a circuit diagram showing an example of a structure of the sense amplifier 204 in FIG. 17 in more detail. The sense amplifier 204 includes clamp transistors 219 and 220, a reference circuit 221, and an inverter 224. The clamp transistors 219 and 220 have the same size as that of the current mirror circuit 218 having a one-to-one mirror ratio. The reference circuit 221 includes the usual determination reference circuit 702 and the forming determination reference circuit 703. In the usual determination reference circuit 702, one end of a branch in which a selection transistor 222 is connected in series to a usual reading reference resistance Rref (20 kΩ) is connected to a ground potential. The other end of the branch is connected to a source terminal of the clamp transistor 219. A gate terminal of the selection transistor 222 receives a reading enable signal C1. Based on the reading enable signal C1, the selection transistor 222 switches between a conducting state and a non-conducting state. In the similar manner, in the forming determination reference circuit 703, one end of a branch in which a selection transistor 223 is connected in series to a forming reference resistance Rb (90 kΩ) is connected to a ground potential. The other end of the branch is connected to a source terminal of the clamp transistor 219. A gate terminal of the selection transistor 223 receives a forming enable signal C2. Based on the forming enable signal C2, the selection transistor 223 switches between a conducting state and a non-conducting state.

A gate terminal of each of the clamp transistors 219 and 220 receives a clamp voltage VCLP (0.9 V). A source terminal of the clamp transistor 220 is connected to the memory cells via the column selection circuit 203 and the bit lines. Drain terminals of the clamp transistors 219 and 220 are connected to drain terminals of transistors 225 and 226, respectively, which are included in the current mirror circuit 218. The inverter 224 performs inverting amplification to a potential of the drain terminal of the clamp transistor 220, so as to generate a sense amplifier output SAO to be provided to the data input/output circuit 205.

Figure 19:
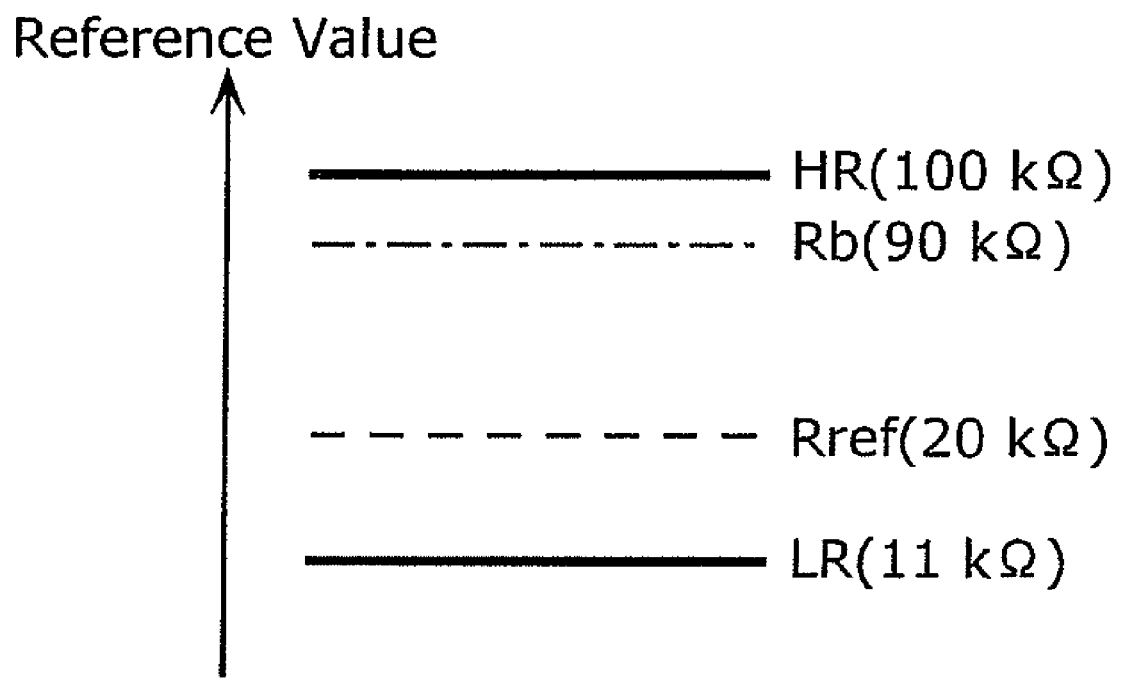
FIG. 19 is a diagram for explaining determination levels of the sense amplifier according to the first embodiment of the present invention.

FIG. 19 is a diagram for explaining the determination levels of the sense amplifier 204. As shown in FIG. 19, the sense amplifier 204 has two determination levels which are (a) the usual reading reference resistance Rref (20 kΩ) and (b) the forming reference resistance Rb (90 kΩ) greater than the usual reading reference resistance Rref, between a high resistance state HR (100 kΩ) and a low resistance state LR (11 kΩ). In order to determine whether or not a forming has been completed for a variable resistance element, the forming reference resistance Rb is set to have a resistance value smaller than a resistance value of the high resistance state HR. Preferably, the forming reference resistance Rb is set to have a resistance value smaller than a minimum possible resistance value of the variable resistance element in the high resistance state HR. On the other hand, in order to determine whether or not the variable resistance element is in a high resistance state or in a low resistance state, the usual reading reference resistance Rref is set to have a resistance value that is smaller than a resistance value of the high resistance state HR and that is greater than a resistance value of the low resistance state LR. Preferably, the usual reading reference resistance Rref is set to have a resistance value that is smaller than a minimum possible resistance value of the variable resistance element in the high resistance state HR and that is greater than a maximum possible resistance value of the variable resistance element in the low resistance state LR.

Figure 20:
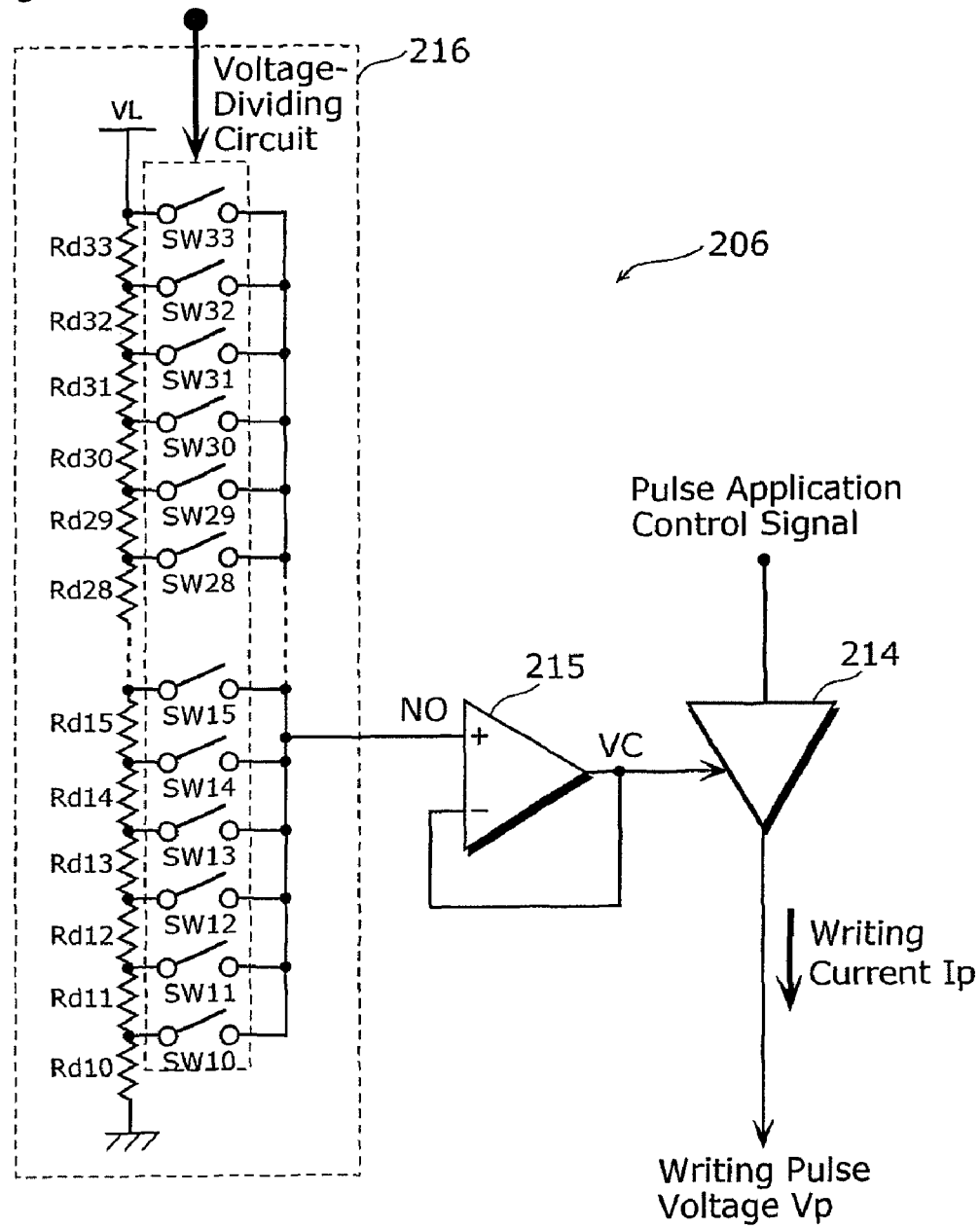
FIG. 20 is a circuit diagram showing an example of a structure of a writing circuit according to the first embodiment of the present invention.

FIG. 20 is a diagram showing an example of a structure of the writing circuit 206 in FIG. 17 in more detail. The writing circuit 206 includes a writing driver circuit 214, a voltage follower circuit 215, and a voltage-dividing circuit 216.

In the voltage-dividing circuit 216, 24 fixed resistances Rd10 to Rd33 are connected in series to one another, between an output terminal VLO of the LR writing power source 212 and a ground potential. There are switches SW10 to SW33 at nodes among the fixed resistances Rd10 to Rd33 and at a node between the output terminal VLO of the LR writing power source 212 and the fixed resistance Rd33, respectively. Terminals of the switches SW10 to SW33 which are not connected to the fixed resistances Rd10 to Rd33 are connected to a common node NO. Each of the switches SW10 to SW33 can be independently controlled to be ON/OFF, by a corresponding one of voltage-dividing switch signals TRM10, TRM11, . . . , TRM33 provided from the control circuit 210. The common node NO is connected to an input terminal of the voltage follower circuit 215. An output terminal VC of the voltage follower circuit 215 which outputs a potential of the common node NO is connected to the writing driver circuit 214.

The writing driver circuit 214 receives, as a power source, a voltage of the output terminal VC of the voltage follower circuit 215. An input terminal of the writing driver circuit 214 receives a pulse application control signal from the control circuit 210. An output terminal of the writing driver circuit 214 provides a writing pulse voltage Vp to the column selection circuit 203 in FIG. 17. The writing voltage pulse is a voltage pulse that becomes a voltage of the output terminal VC of the voltage follower circuit 215 only in a predetermined time period (50 ns, for example) (0 V in other time periods).

Therefore, in writing pulse application, the control circuit 210 controls the voltage-dividing switch signals TRM10, TRM11, . . . , TRM33 so as to control only a target one of the switches SW10 to SW33 to be ON. Thereby, it is possible to control an output voltage of the voltage-dividing circuit 216 by multiple stages, thereby controlling a voltage of the output terminal VC of the voltage follower circuit 215 also by multiple stages. As a result, it is possible to output writing pulse voltages Vp, which are outputs of the writing driver circuits 214, by multiple stages depending on the pulse application control signals.

[Operations of Variable Resistance Nonvolatile Memory Device according to First Embodiment]

Regarding the variable resistance nonvolatile memory device having the above-described structure, at first, the description is given for operations performed by main circuit blocks. Next, the description is given for (a) a writing cycle used for a data writing operation and a forming and (b) a reading cycle used for a usual reading operation and a verification reading operation.

At first, an operation performed by the sense amplifier 204 shown in FIG. 18 is described. In a forming for forming a conducting path in a variable resistance element, the sense amplifier 204 is connected to a target memory cell via the column selection circuit 203 and a bit line, and the target memory cell receives a voltage not exceeding 0.4 V that is decreased from the clamp voltage VCLP (0.9 V) by a threshold voltage (0.5 V) of the clamp transistors 219 and 220. On the other hand, in the reference circuit 221, the selection transistor 223 is activated by the forming enable signal C2 to be in a conducting state, so that the forming reference resistance Rb (90 kΩ) is selected. The other selection transistor 222 is activated by the reading enable signal C1 to be in a non-conducting state, so that a reference current Iref of approximately 4.4 μA (=(0.9 V–0.5 V)/90 kΩ) flows. Therefore, the reference current Iref is inverted by the current mirror circuit 218. Thereby, the load current IL of approximately 4.4 μA flows. The clamp transistor 200 compares an amount of the load current IL to an amount of a memory cell current Ic. Based on a result of the comparison, it is detected whether a voltage of the drain terminal of the clamp transistor 220 is higher or lower than the inverted voltage (input threshold voltage) of the inverter 224. The inverter 224 outputs the detection result as a sense amplifier output SAO. Here, assuming that the initial resistance value is 20 MΩ, the memory cell current Ic becomes 0.02 μA (=0.4 V/20 MΩ), where the load current IL (approximately 4.4 μA)>the memory cell current Ic (0.02 μA). Thereby, the voltage of the drain terminal of the clamp transistor 220 becomes higher than the inverted voltage of the inverter 224 after a predetermined time period. Therefore, a low (L) level is outputted as the sense amplifier output SAO. In short, when the selected memory cell is in an initial state (20 MΩ) that is higher than the forming reference resistance Rb (90 kΩ), the sense amplifier 204 determines that the data in the memory sell is "0", namely, failed. On the other hand, if after a forming, the resistance value of the selected memory cell becomes 50 kΩ that is smaller than the forming reference resistance Rb (90 MΩ), the memory cell current Ic becomes 8 μA (=0.4 V/50 kΩ), where the load current IL (approximately 4.4 μA)<the memory cell current Ic (8 μA). Thereby, the voltage of the drain terminal of the clamp transistor 220 becomes lower than the inverted voltage of the inverter 224 after a predetermined time period. Therefore, a high (H) level is outputted as the sense amplifier output SAO. In short, when the selected memory cell is in a low resistance state that is lower than the forming reference resistance Rb (90 kΩ), the sense amplifier 204 determines that the data in the memory cell is "1", namely, passed. The determined "1" indicates that a forming has already been performed for the selected memory cell.

On the other hand, in a usual reading, in the reference circuit 221, the selection transistor 222 is activated by the reading enable signal C1 to be in a conducting state, so that the usual reading reference resistance Rref is selected. The other selection transistor 223 is activated by the forming enable signal C2 to be in a non-conducting state, so that the reference current Iref of 20 μA (=(0.9 V–0.5 V)/20 kΩ) flows. Therefore, the reference current Iref is inverted by the current mirror circuit 218. Thereby, the load current IL of approximately 20 μA flows. An amount of the load current IL is compared to an amount of the memory cell current Ic. Based on a result of the comparison, it is detected whether the voltage of the drain terminal of the clamp transistor 220 is higher or lower than the inverted voltage (input threshold voltage) of the inverter 224. The inverter 224 outputs the detection result as a sense amplifier output SAO. Here, assuming that the selected memory cell is in the high resistance state when the high resistance state is 100 kΩ and the low resistance state is 11 kΩ, the memory cell current Ic becomes 4 μA (=0.4 V/100 kΩ2), where the load current IL (20 μA)>the memory cell current Ic (4 μA). Thereby, the voltage of the drain terminal of the clamp transistor 220 becomes higher than the inverted voltage of the inverter 224. Therefore, a L level is outputted as the sense amplifier output SAO. In short, when the selected memory cell is in the high resistance state (100 kΩ) that is higher than the usual reading reference resistance Rref (20 kΩ), the sense amplifier 204 determines that the data in the memory sell is "0". On the other hand, if the selected memory cell is in the low resistance state, the memory cell current Ic is approximately 36.4 μA (=0.4 V/11 kΩ), where the load current IL (20 μA)<the memory cell current Ic (approximately 36.4 μA). Thereby, the voltage of the drain terminal of the clamp transistor 220 becomes lower than the inverted voltage of the inverter 224. Therefore, a H level is outputted as the sense amplifier output SAO. In short, when the selected memory cell is in the low resistance state (11 kΩ) that is lower than the usual reading reference resistance Rref (20 kΩ), the sense amplifier 204 determines that the data in the memory cell is "1".

Next, an operation performed by the writing circuit 206 shown in FIG. 20 is described.

Now, it is assumed that a potential of the output VLO of the LR writing power source 212 is 3.3 V, the resistance Rd10 is 100 kΩ, each of the resistances Rd11 to Rd33 is 10 kΩ, and a voltage amplification of the pulse application control signal is 3.3 V. Under the assumption, in the writing circuit 206, if only the switch SW10 is turned ON by the voltage-dividing switch signal TRM10, a potential of the common node NO is 1.0 V (=3.3 V×100 kΩ/330 kΩ) from a voltage-dividing relationship formula. Thereby, the output terminal VC is controlled to have a voltage of 1.0 V. As a result, the writing driver circuits 214 can output a writing pulse voltage Vp of 1.0 V according to the pulse application control signal.

Figure 21:
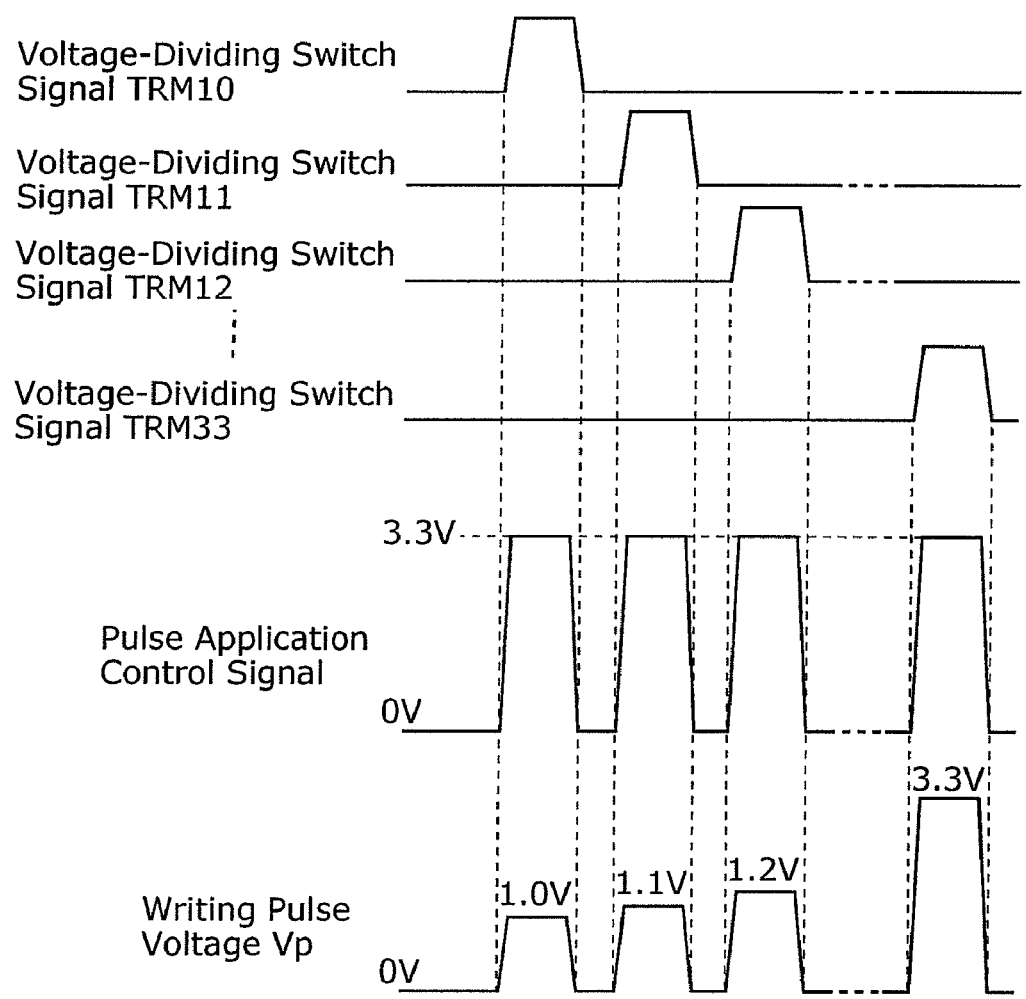
FIG. 21 is a timing diagram showing a waveform of step-up writing pulse voltage application according to the first embodiment of the present invention.

FIG. 21 is a timing diagram of the step-up writing pulse voltage Vp which the writing circuit 206 can output. In FIG. 21, by the voltage-dividing switch signals TRM10, TRM11, ..., TRM33 outputted from the control circuit 210, the switches SW10 to SW33 are sequentially and independently controlled to be in a conducting state. Thereby, voltages of the output terminal VC are gradually increased from 1.0 V to 3.3 V by 0.1 V increments. As a result, in synchronization with a pulse application control signal, the writing pulse voltages Vp are applied, stepping up from 1.0 V to 3.3 V by 0.1 V increments.

Next, FIG. 22 shows a list of various setting voltages (for a II-type cell) which are: a voltage of a word line (WL) in various operation modes including a forming, a verification reading, a LR writing, a HR writing, and a reading; a voltage of a source line (SL) (hereinafter, a SL voltage); a voltage of a bit line (BL) (hereinafter, a BL voltage); a voltage of the output VHO of the HR writing power source 213; and a voltage of the output VLO of the LR writing power source 212. In FIG. 22, the BL voltage in a forming is the step-up writing pulse voltage Vp shown in FIG. 21, and the BL voltage in LR or HR writing is a writing pulse voltage Vp of 2.4 V amplification. Here, the verification reading refers to a verification reading in a forming.

In HR writing, Vp (2.4 V) is a writing pulse voltage applied from the writing circuit 206, VL is a voltage generated in the LR writing power source 212 which is supplied to the writing circuit 206, VH is a voltage generated in the HR writing power source 213. VH is set to be a voltage (+2.4 V) at the point O in the pulse RV characteristics seen in FIG. 10A, in order not to enter the unipolar region determined by the preparation evaluation (the above-described preparation step). In short, control is performed to observe the above-described second control rule.

It should be noted that, although a voltage of the output VHO of the HR writing power source 213 is applied to the source lines with reference to the bit lines, it is also possible to set the voltage to be relatively high so that a maximum voltage of the source lines is effectively within a range not exceeding the voltage (+2.4 V) of the point O, in consideration of decrease of the voltage due to parasitic resistance occurred between the HR writing power source 213 and the source lines.

In LR writing, VH is set to be 2.4 V likewise in HR writing, Vp (2.4 V) is a writing pulse voltage occurred in the writing circuit 206. Vp is a writing pulse voltage that exceeds the point P and does not exceed the point N in the pulse RV properties seen in FIGS. 10A and 10B, and is effectively applied to the memory cells M11, M12, . . . .

In the forming, Vp is a step-up writing pulse voltage applied from the writing circuit 206, and VH is a voltage generated in the HR writing power source 213. VH is set to be 3.3 V so that a writing pulse voltage Vp having a high voltage can be applied in the forming.

In verification reading and in reading, Vread is a reading voltage (0.4 V) clamped by the sense amplifier 204. Vread is in a negative voltage direction in the pulse RV properties seen in FIGS. 10A to 10C, thereby corresponding to a voltage value (−0.4 V) adjusted not to disturb the reading (namely, not to change a resistance state of a target variable resistance element). VDD corresponds to a voltage of the power supplied to the nonvolatile memory device 200.

Figure 23:
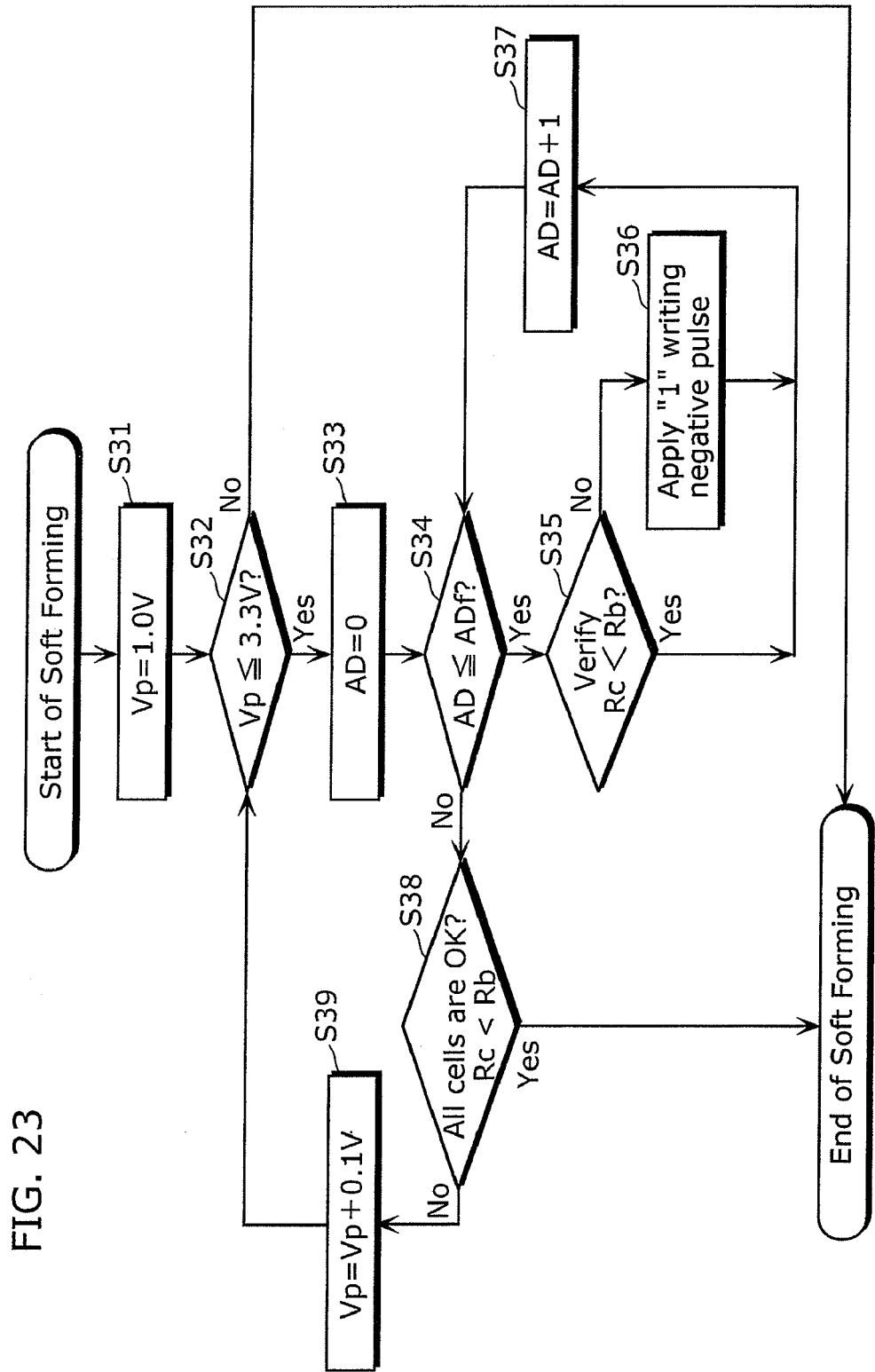
FIG. 23 is a flowchart of the soft forming performed by the variable resistance nonvolatile memory device according to the first embodiment of the present invention.

Next, the description is given for an example of the soft forming for the variable resistance nonvolatile memory device with reference to a flowchart of the soft forming in FIG. 23. As indicated in FIG. 23, at first, the LR writing pulse voltage Vp is set to 1.0 V (S31: the first step). Then, it is determined whether or not the writing pulse voltage Vp is equal to or lower than 3.3 V (S32: the second step). If the writing pulse voltage Vp is higher than 3.3 V (No at the second step), then the soft forming operation is terminated as being a failure. On the other hand, if the writing pulse voltage Vp is equal to or lower than 3.3 V (Yes at the second step), then an address AD of a selected memory cell is initialized (AD=0) (S33: the first step). Next, it is determined whether or not the address AD of the selected memory cell M11 is equal to or smaller than a final address ADf in the memory array 202 (S34: the fourth step). If the address AD is equal to or smaller than the final address ADf (Yes at the fourth step), then a verification reading is performed to verify whether or not a resistance value Rc of the selected memory cell is smaller than a reference resistance Rb (Rc<Rb) (S35: the fifth step (determination step)). If the resistance value Rc of the selected memory cell is smaller than the forming reference resistance Rb (Rc<Rb) (Yes at the fifth step), then it is determined that the resistance value has been decreased enough not to require a forming, thereby the address AD of the selected memory cell is incremented (S37: the seventh step), and a memory cell having a next address AD is selected. On the other hand, if the resistance value Rc of the selected memory Cell is equal or greater than the forming reference resistance Rb (Rc≦Rb) (No at the fifth step), then the set writing pulse voltage Vp is used to apply a negative voltage pulse (−1.0 V with a pulse width of 50 ns) for performing a forming to write ("1") to the selected memory cell (S36: the sixth step (voltage application step). After that, the address AD of the selected memory cell is incremented (S37: the seventh step), and a memory cell having a next address AD is selected. Subsequently, the processing from the fourth step (S34) to the seventh step (S37) is repeated until the address AD of the selected memory cell becomes greater than the final address ADf. Referring back to the fourth step (S34), if the address AD of the selected memory cell is greater than the final address ADf (AD>ADf) (No at the fourth step), then an external device such as a memory tester determines whether or not each of resistance values Rc of all memory cells in the memory array 202 is smaller than the forming reference resistance Rb (Rc<Rb) (S38: the eighth step). If all of the resistance values Rc are not smaller than the forming reference resistance Rb (No at the eighth step), then the writing pulse voltage Vp is incremented by +0.1 V to be +1.1 V (S39: the night step). Next, it is determined whether or not the writing pulse voltage Vp is equal to or less than 3.3 V (S32: the second step). After that, the processing from the second step (S32) to the ninth step (S39) is repeated until the writing pulse voltage Vp becomes higher than a maximum writing pulse voltage of 3.3 V or until the soft forming has been performed for all memory cells at the eighth step (S38).

As described above, the flow of the forming includes: (a) the determination step S35 to determine whether or not a resistance value of the variable resistance element 100 is smaller than a resistance value in a high resistance state; and (b) the voltage application step S36 to apply a voltage pulse not exceeding a sum of a forming voltage and a forming margin (0.7 V) when the determination step S35 determines that the resistance value of the variable resistance element 100 is smaller than the resistance value in a high resistance state (No at S35). The determination step S35 and the voltage application step S36 are repeated to process all memory cells in the memory array 202 (S34 to S37). After completion of applying a voltage pulse having the same voltage to a target memory cell for which a forming is to be performed, the voltage is increased by 0.1 V that does not exceed the forming margin (0.7 V). Then, again, the determination step S35 and the voltage application step S36 are repeated to process all memory cells (S34 to S37). By adopting the above-described flow for a forming, an applied forming voltage is increased by voltage (0.1 V) increment that is lower than the forming margin (0.7 V) for the soft forming. Thereby, the soft forming can be achieved using an appropriate forming voltage Vb for each of the memory cells M11, M12, . . . , without causing an excessive voltage and current stress to the variable resistance element (in other words, the above-described first control rule is observed.) Moreover, according to the flow of the soft forming shown in FIG. 23, it is possible to apply a writing pulse voltage Vp only to memory cells requiring the forming, and also possible to minimize the voltage switch (increment) operations for the writing pulse voltage Vp. As a result, the soft forming can be performed at a high speed for the memory array.

It should be noted that it has been described in the above example that the writing pulse voltage Vp for performing a forming is incremented by +0.1 V (the ninth step), but, in the present invention, the writing pulse voltage Vp may be incremented not only by the increment voltage (0.1 V) but also by a voltage that is smaller than the forming margin (here, 0.7 V). Thereby, assuming that a minimum voltage for a sum of a forming and the forming margin (here, 0.7 V) is a maximum voltage (an example of a voltage having a maximum absolute value), a writing voltage pulse for a forming is applied to surely perform the soft forming.

Examples of the operations in a data writing cycle, a reading cycle, and the soft forming for the variable resistance nonvolatile memory device having the above-described structure are described with reference to timing diagrams shown in FIGS. 24A to 24C and 25, the block diagram of the variable resistance nonvolatile memory device according to the first embodiment of the present invention in FIG. 17, and the graphs for explaining the pulse RV properties in FIGS. 10A to 10C.

Figure 24A:
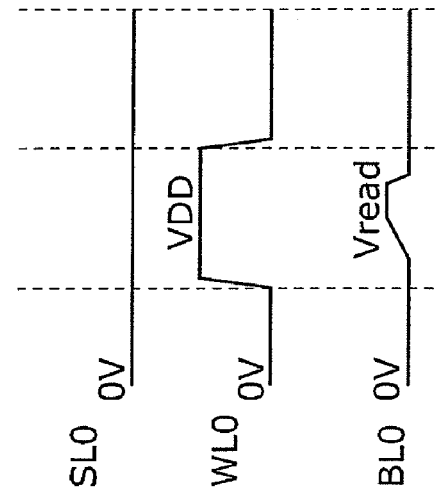
FIG. 24A is a timing diagram of an operation performed by the variable resistance nonvolatile memory device according to the first embodiment of the present invention.
Figure 24B:
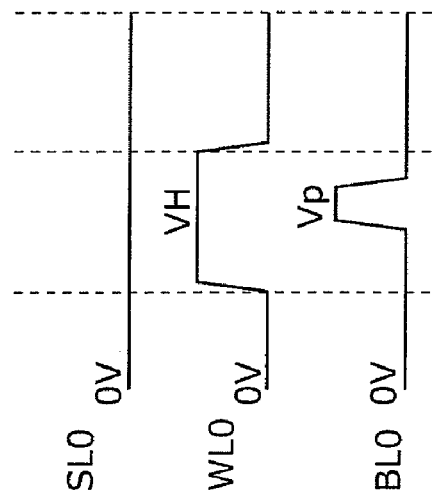
FIG. 24B is a timing diagram of an operation performed by the variable resistance nonvolatile memory device according to the first embodiment of the present invention.
Figure 24C:
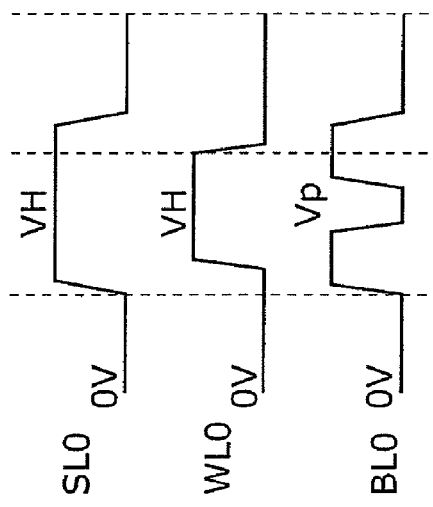
FIG. 24C is a timing diagram of an operation performed by the variable resistance nonvolatile memory device according to the first embodiment of the present invention.

FIGS. 24A to 24C are timing diagrams of operation examples performed by the nonvolatile memory device according to the first embodiment of the present invention. In the operation examples, it is assumed that data is "0" when the variable resistance layer is in a high resistance state, and that data is "1" when the variable resistance layer is in a low resistance state. The description is given only for the situation that data is written to and read from the memory cell M11.

In a cycle of writing data "0" to the memory cell M11 shown in FIG. 24A, at first, the selected bit line BL0 is set to have a voltage VH (2.4 V) and the selected source line SL0 is set to have a voltage Vp (2.4 V). Next, the selected word line WL0 is set to have a voltage VH (2.4 V). Here, the NMOS transistor N11 in the selected memory cell M11 in FIG. 17 is still OFF. At this state, the voltage of 2.4 V is applied to both the drain and source terminals of the NMOS transistor N11 in FIG. 17. Therefore, current does not flow regardless of ON/OFF of the transistor.

Next, the selected bit line BL0 is set to have a voltage of 0 V in a predetermined time period. After the predetermined time period, a pulse waveform is applied to cause the selected bit line BL0 to have the voltage Vp (2.4 V) again. At this state, a positive pulse voltage (+2.4 V) at the point O in the pulse RV characteristics seen in FIG. 10A is applied to the memory cell M11 in FIG. 17. Therefore, writing performs to change a low resistance value to a high resistance value. After that, the word line WL0 is set to have a voltage of 0 V. As a result, data "0" has been written in the memory cell M11. In other words, a memory cell is selected in a row direction by the source line and the word line, and then a pulse waveform in a negative voltage direction is applied to a certain bit line, so that a positive voltage pulse is applied to a variable resistance element in the memory cell selected by the source line, the word line, and the bit line, thereby achieving HR writing.

In writing data "1" to the memory cell M11 shown in FIG. 24B, at first, the selected bit line BL0 and the selected source line SL0 are set to have a voltage of 0 V. Next, the selected word line WL0 is set to have a voltage VH (2.4 V), thereby turning ON the NMOS transistor N11 of the selected memory cell M11 in FIG. 17.

Next, the selected bit line BL0 is set to have a voltage Vp (2.4 V) in a predetermined time period. After the predetermined time period, a pulse waveform is applied to cause the selected bit line BL0 to have a voltage of 0 V again. At this state, a negative pulse voltage that exceeds the point P and does not exceed the point N in the pulse RV properties shown in FIGS. 10A and 10B is applied to the memory cell M11 in FIG. 17. Therefore, writing performs to change a high resistance value to a low resistance value. After that, the word line WL0 is set to have a voltage of 0 V. As a result, data "1" has been so written in the memory cell M11. In other words, a memory cell is selected in a row direction by the source line and the word line, and then a pulse waveform in a positive voltage direction is applied to a certain bit line, so that a negative voltage pulse is applied to a variable resistance element in the memory cell selected by the source line, the word line, and the bit line, thereby achieving LR writing. However, the present invention is not limited to the above method.

In a data reading cycle for the memory cell M11 shown in FIG. 24C, at first, the selected bit line BL0 and the selected source line SL0 are set to have a voltage of 0 V. Next, the selected word line WL0 is set to have a voltage VDD (1.8 V), thereby turning ON the NMOS transistor N11 of the selected memory cell M11.

Next, the selected bit line BL0 is set to have the reading voltage Vread of 0.4 V in a predetermined time period, and the sense amplifier 204 detects a value of the current flowing in the selected memory cell M11 to determine whether the data stored in the selected memory cell M11 is data "0" or data "1". After that, the word line WL0 is set to have a voltage of 0 V. As a result, the data reading operation is completed.

Next, the soft forming operation performed by the nonvolatile memory device according to the first embodiment of the present invention is described.

Figure 25:
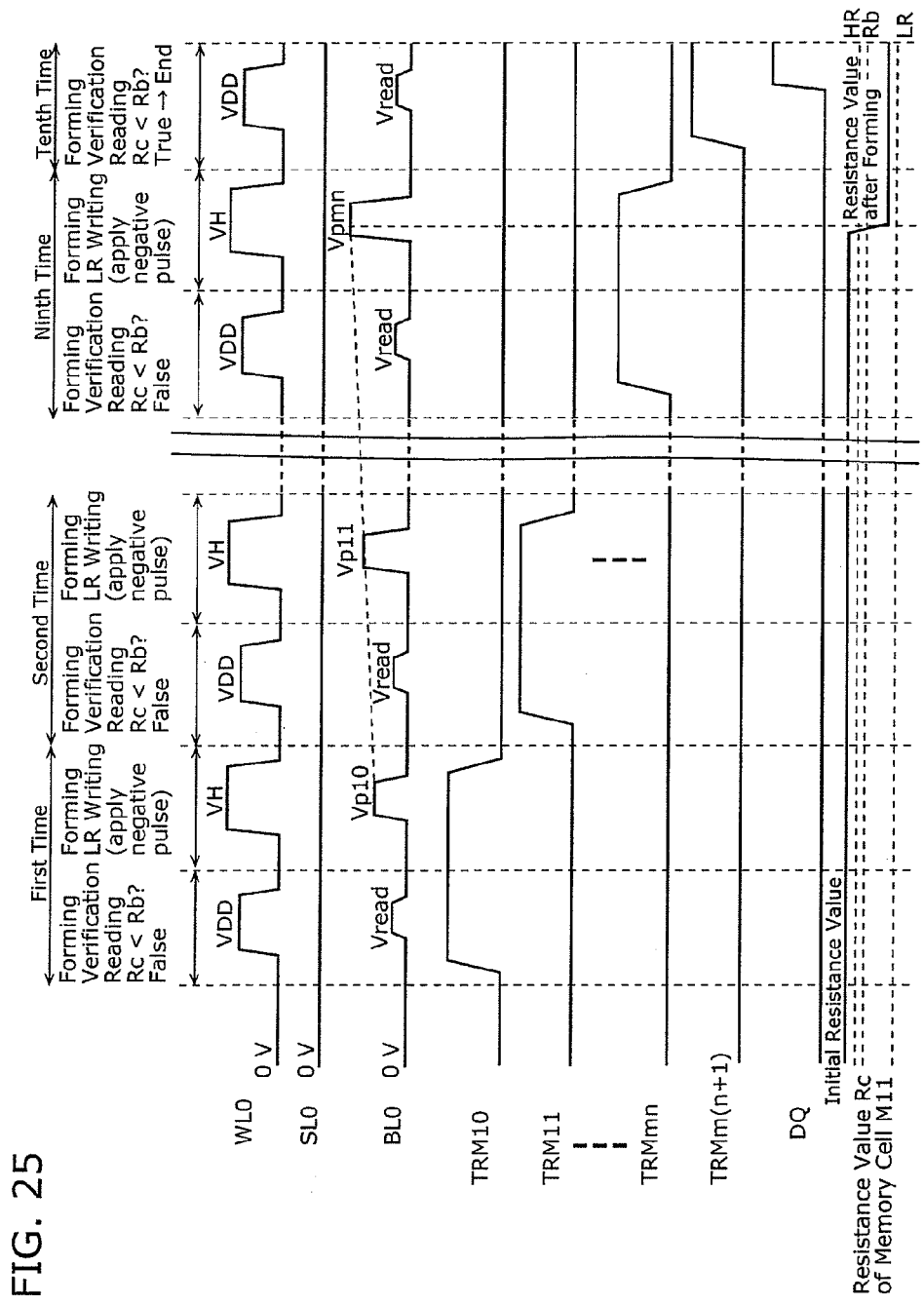
FIG. 25 is a timing diagram of the soft forming performed by the variable resistance nonvolatile memory device according to the first embodiment of the present invention.

FIG. 25 is a timing diagram of the soft forming operation performed by the nonvolatile memory device according to the first embodiment of the present invention. In the soft forming operation (soft forming) shown in FIG. 25, by accessing only one bit of the memory cell M11 having the address AD of 0, the flow of the soft forming shown in FIG. 23 is achieved for the bit, not for the array (however, the fourth and seventh steps are eliminated because of the one-bit access).

In FIG. 25, when the soft forming starts, each voltage of the word line WL0, the bit line BL0, and the source line SL0 of the target memory cell M11 is 0 V. Each of the voltage-dividing switch signals TRM10, TRM11, . . . , TRMmn (where m is an integer from 1 to 3, and n is an integer from 0 to 9) and the terminal DQ is a L level. The memory cell M11 is in an initial state.

At first, at the first step in FIG. 23, only the voltage-dividing switch signal TRM10 is set to be a H level, so that the writing circuit 206 can apply a voltage pulse Vp10 (=1.0 V) as a writing pulse voltage Vp.

Next, at the second step, it is determined that the writing pulse voltage Vp is equal to or lower than 3.3 V. At the third step, the address AD of the memory cell is initialized (AD=0), and then the processing proceeds to the fifth step.

At the fifth step, in order to perform a verification reading to verify whether or not the resistance value Rc of the selected memory cell is smaller than the forming reference resistance Rb (Rc<Rb), the selected word line WL0 is set to have a voltage VDD (1.8 V), thereby turning ON the NMOS transistor N11 in the selected memory cell M11.

Next, the selected bit line BL0 is set to have the reading voltage Vread of 0.4 V in a predetermined time period, and the sense amplifier 204 detects a value of the current flowing in the selected memory cell M11 to determine whether or not the reference value Rc of the selected memory cell M11 is smaller than the forming reference resistance Rb (Rc<Rb). Here, since it is determined that the reference value Rc is equal to or greater than the forming reference resistance Rb, the sense amplifier output (terminal) SAO outputs a L level, provides data "0" to the terminal DQ, and informs the external device (a memory tester, for example) of that the forming fails (false). After that, each of the word line WL0 and the bit line BL0 is set to have a voltage of 0 V, and the verification reading operation is completed.

Next, the LR writing for a forming (hereinafter, referred to as a "forming LR writing") (the sixth step) shown in FIG. 23 is described. In order to apply a negative voltage pulse (−1.0 V with a pulse width of 50 ns) for the forming LR writing to the selected memory cell, at first, each voltage of the selected bit line BL0, source line SL0, and word line WL0 is set to be 0 V. Next, the selected word line WL0 is set to have a voltage VH (3.3 V), thereby turning ON the NMOS transistor N11 of the selected memory cell M11 in FIG. 17. Next, the selected bit line BL0 is set to have a voltage Vp (1.0 V) in a predetermined time period. After the predetermined time period, a pulse waveform (negative voltage pulse) is applied to cause the selected bit line BL0 to have a voltage of 0 V again. At this state, a negative pulse voltage higher (namely, having an absolute value smaller than that of) the voltage at the point N (a forming start voltage Vb=−1.8 V) in the pulse RV characteristics seen in FIG. 10A is applied to the memory cell M11 in FIG. 17. However, the selected memory cell M11 is still in the initial state and a forming is not performed for the selected memory cell M11. In short, the forming fails. After that, the word line WL0 is set to have a voltage of 0 V. As a result, the forming LR writing is completed.

Next, at the eighth step, the determination at the fifth step is made that the forming fails (false), and therefore the processing proceeds to the ninth step. Only the voltage-dividing switch signal TRM11 is set to be a H level, so that the writing circuit 206 can apply a voltage pulse Vp11 (=1.1 V) as a writing pulse voltage Vp.

Next, at the second step, it is determined that the writing pulse voltage Vp is equal to or lower than 3.3 V. At the third step, the address AD of the memory cell is initialized (AD=0), and then the processing proceeds to the fifth step.

At the fifth step in the second loop, the verification reading operation (Rc<Rb or not) is performed in the same manner as the fifth step in the first loop. However, since the resistance value Rc is currently still in the initial resistance state and is equal to or greater than the forming reference resistance Rb, the sense amplifier output (terminal) SAO outputs a L level, provides data "0" to the terminal DQ, and informs the external device (a memory tester, for example) of that a forming fails (false). As a result, the verification reading operation is completed.

Next, the forming LR writing (the second loop) at the sixth step shown in FIG. 23 is described. In order to apply a negative voltage pulse (−1.1 V with a pulse width of 50 ns) for the forming LR writing to the selected memory cell, at first, each voltage of the selected bit line BL0, source line SL0, and word line WL0 is set to be 0V. Next, the selected word line WL0 is set to have a voltage VH (3.3 V), thereby turning ON the NMOS transistor N11 of the selected memory cell M11 in FIG. 17. Next, the selected bit line BL0 is set to have a voltage Vp (1.1 V) in a predetermined time period. After the predetermined time period, a pulse waveform (negative voltage pulse) is applied to cause the selected bit line BL0 to have a voltage of 0 V again. At this state, a negative pulse voltage higher (namely, having an absolute value smaller than that of) the voltage at the point N (a forming start voltage Vb=−1.8 V) in the pulse RV characteristics seen in FIG. 10A is applied to the memory cell M11 in FIG. 17. However, the selected memory cell M11 is still in the initial state and a forming is not performed. In short, the forming fails. After that, the word line WL0 is set to have a voltage of 0 V. As a result, the forming LR writing in the second loop is completed.

After that, the loop from the second step to the ninth step (except the fourth and seventh steps) in FIG. 23, namely, a set of the verification reading operation and the forming LR writing operation, is repeated from three to eight times (loops). However, the resistance value Rc of the memory cell M11 is still in the initial state and is equal to or greater than the forming reference resistance Rb. In short, the forming fails.

Next, at the ninth step, only the voltage-dividing switch signal TRMmn (where m=1 and n=8) is set to be a H level, so that the writing circuit 206 can apply a voltage pulse Vpmn (where m=1 and n=8) (=1.8 V) as a writing pulse voltage Vp.

Next, at the second step, it is determined that the writing pulse voltage Vp is equal to or lower than 3.3 V. At the third step, the address AD of the memory cell is initialized (AD=0), and then the processing proceeds to the fifth step.

At the fifth step in the ninth loop, the verification reading operation (Rc<Rb or not) is performed. However, since the resistance value Rc is currently still in the initial resistance state and is equal to or greater than the forming reference resistance Rb, the sense amplifier output (terminal) SAO outputs a L level, provides data "0" to the terminal DQ, and informs the external device (a memory tester, for example) of that a forming fails (false). As a result, the verification reading operation is completed.

Next, the forming LR writing (the ninth loop) at the sixth step shown in FIG. 23 is described. In order to apply a negative voltage pulse (−1.8 V with a pulse width of 50 ns) for the forming LR writing to the selected memory cell, at first, each voltage of the selected bit line BL0, source line SL0, and word line WL0 is set to be 0V. After that, the selected word line WL0 is set to have a voltage VH (3.3 V), thereby turning ON the NMOS transistor N11 of the selected memory cell M11 in FIG. 17. Next, the selected bit line BL0 is set to have a voltage Vp (1.8 V) in a predetermined time period. After the predetermined time period, a pulse waveform (negative voltage pulse) is applied to cause the selected bit line BL0 to have a voltage of 0 V again. At this state, a negative pulse voltage corresponding to the point N (the forming start voltage Vb=−1.8 V) in the pulse RV characteristics seen in FIG. 10A is applied to the memory cell M11 in FIG. 17. Thereby, in the selected memory cell M11, a conducting path is formed from the initial high resistance state, so that the resistance value is changed to a resistance value after the forming that is between the high resistance state HR and the low resistance state LR. As a result, a forming is performed. Thereby, the forming is success at the first time. After that, the word line WL0 is set to have a voltage of 0 V. As a result, the forming LR writing in the ninth loop is completed.

After that, at the eighth step, the determination at the fifth step before the forming LR writing is made that the forming fails (false), and therefore the processing proceeds to the ninth step. Only the voltage-dividing switch signal TRMm (n+1) (where m=1 and n=8) is set to be a H level, so that the writing circuit 206 can apply a voltage pulse Vpm (n+1) (where m=1 and n=8) (=1.9 V) as a writing pulse voltage Vp.

Next, at the second step, it is determined that the writing pulse voltage Vp is equal to or lower than 3.3 V. At the third step, the address AD of the memory cell is initialized (AD=0), and then the processing proceeds to the fifth step.

At the fifth step in the tenth loop, the verification reading operation (Rc<Rb ?) is performed. However, since the resistance value Rc of the selected memory cell M11 is currently smaller than the forming reference resistance Rb, the sense amplifier output (terminal) SAO outputs a H level, provides data "1" to the terminal DQ, and informs the external device (a memory tester, for example) of that a forming is successful (true). As a result, the verification reading operation is completed.

After that, at the eight step, it is confirmed that the determination of the immediately previous fifth step is made that the forming is successful (true), and thereby the soft forming is completed.

As described above, negative voltage pulses are applied, gradually increasing its absolute value by 0.1 V increments. For each application, completion of a forming is examined. Thereby, a negative voltage pulse equal to or higher than the above voltage is not applied after the completion of the forming. As a result, after a forming using a predetermined writing pulse voltage Vp, any excessive pulse voltage is not applied to the memory cell M11.

After the soft forming, as shown in FIG. 22, each of a HR writing pulse voltage and a LR writing pulse voltage is set to be 2.4 V, and their pulse widths are set to be 50 ns. Thereby, a usual data "0" writing (HR writing) and a usual data "1" writing (LR writing) are possible.

As described above, based on the flow of the soft forming shown in FIG. 23, the soft forming is performed for each memory cell (in other words, the above-described first control rule is observed). Thereby, the changeable high resistance value level can be controlled to be higher. In addition, a HR writing voltage near a maximal point which is not in the unipolar region is used to perform HR writing (in other words, the above-described second control rule is observed). Thereby, the high resistance value level can be set to be possible maximum (see FIGS. 10A to 10C and 11). As a result, it is possible to expand an operation window between a low resistance state and a high resistance state. Thereby, a high-speed reading and data reliability can be improved, and a risk of erroneous reading can be significantly reduced.

It should be noted that the LR writing voltage for data "1" writing (LR writing) is, of course, set not to decrease the changeable high resistance value level due to the forming margin Δ greater than 0.7 V.

It should also be noted that, in the case that the range close to the maximal point of the high resistance value level is relatively smooth, actual problems do not occur even if a HR writing voltage slightly entering the unipolar region is used to perform data "0" writing (HR writing). For example, even in the case that the HR writing voltage exceeds the maximal point of the high resistance value level, actual problems do not occur if the HR writing voltage causes a resistance value of 90% or more of a resistance value of the maximal point of the high resistance value level.

It should also be noted that it has been described in the first embodiment that, in usual writing of data "0" and "1", the voltage (=2.4 V) of the word line WL0, the LR writing pulse voltage Vp (=2.4 V), and the HR writing pulse voltage VH (=2.4 V) are set to be the same voltage, but these voltages are not necessarily the same.

[Variable Resistance Nonvolatile Memory Device according to Second Embodiment]

The following describes a 1T1R nonvolatile memory device using the above-described I-type cell, according to the second embodiment of the present invention.

Figure 26:
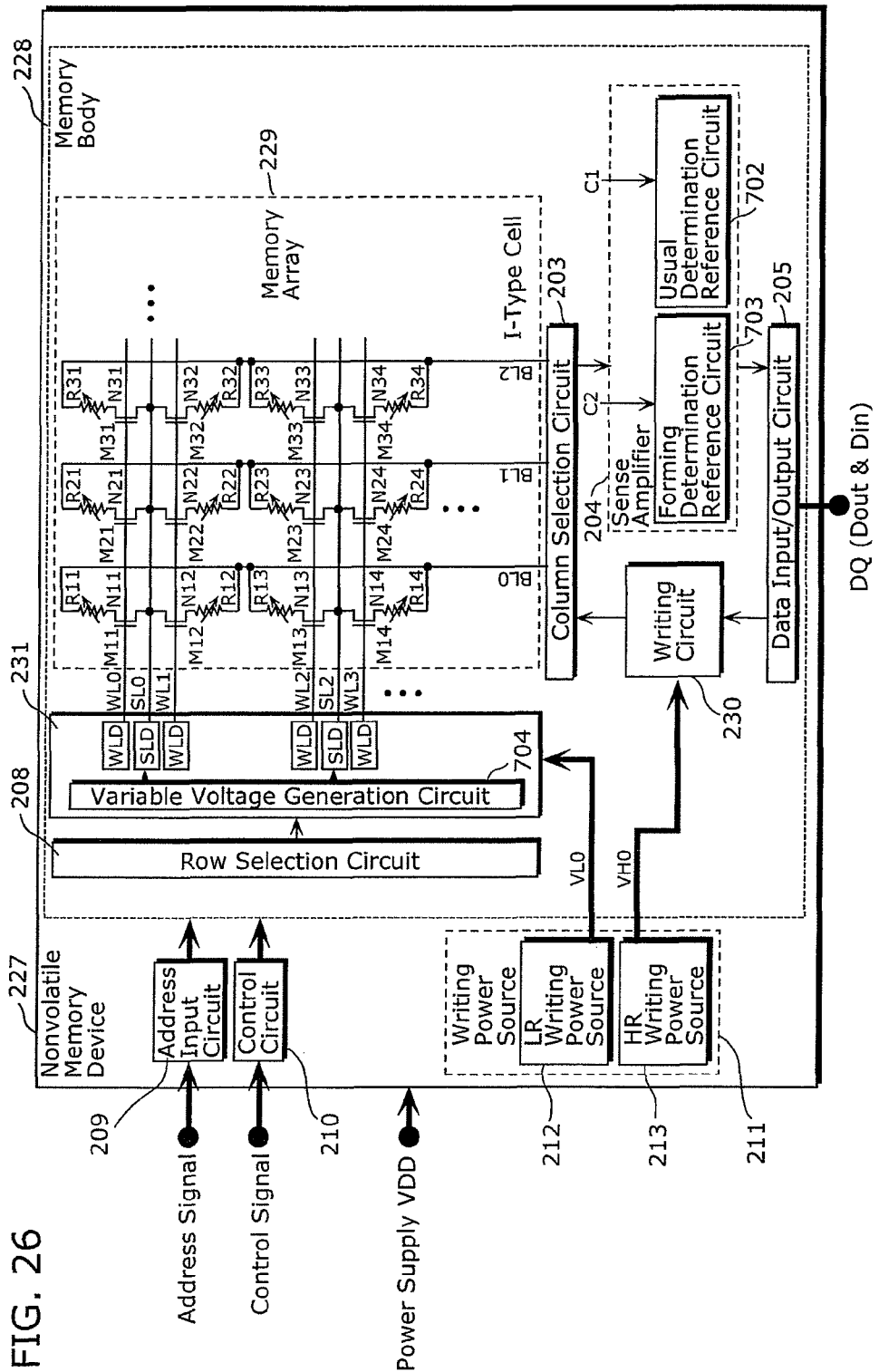
FIG. 26 is a block diagram showing a structure of a variable resistance nonvolatile memory device according to a second embodiment of the present invention.

FIG. 26 is a block diagram showing a structure of the nonvolatile memory device according to the second embodiment of the present invention.

The same reference numerals of FIG. 17 are assigned to the identical structural elements of FIG. 26, so that the identical structural elements are not explained again below.

The nonvolatile memory device 227 shown in FIG. 26 differs from the nonvolatile memory device 200 according to the first embodiment in that the memory array 202 is replaced by a memory array 229 including the I-type cells shown in FIG. 6A, that the writing circuit 206 is replaced by a writing circuit 230, and that the row driver 207 is replaced by a row driver 231.

The memory body 228 includes: the memory array 229; the row selection circuit 208; the row driver 231 including the word line drivers WLD, the source line drivers SLD, and a variable voltage pulse generation circuit 704; the column selection circuit 203; the writing circuit 230 for data writing; the sense amplifier 204 that detects an amount of current flowing in a selected bit line and thereby determines whether a resistance state is a high resistance state as data "0" or a low resistance state as data "1"; and the data input/output circuit 205 that receives and outputs input/output data via the terminal DQ.

The memory array 229 includes the plurality of word lines WL0, WL1, WL2, . . . and the plurality of bit lines BL0, BL1, BL2, . . . , on the semiconductor substrate. The word lines WL0, WL1, WL2, . . . cross the bit lines BL0, BL1, BL2, . . . , respectively. The memory array 229 also includes the plurality of NMOS transistors N11, N12, N13, N21, N22, N23, N31, N32, N33, . . . (hereinafter, referred to as "transistors N11, N12, . . . ") at respective cross-points between the word lines WL0, WL1, WL2, . . . and the bit lines BL0, BL1, BL2, . . . . The memory array 229 further includes the plurality of variable resistance elements R11, R12, R13, R21, R22, R23, R31, R32, R33, . . . (hereinafter, referred to as "variable resistance elements R11, R12, . . . ") each of which is connected in series to a corresponding one of the transistors N11, N12, . . . to form a pair. As a result, each of the pairs serves as a corresponding one of the memory cells M11, M12, M13, M21, M22, M23, M31, M32, M33, . . . (hereinafter, referred to as "memory cells M11, M12, . . . ").

As shown in FIG. 26, gates of the transistors N11, N21, N31, . . . are connected to the word line WL0, gates of the transistors N12, N22, N32, . . . are connected to the word line WL1, gates of the transistors N13, N23, N33, . . . are connected to the word line WL2, and gates of the transistors N14, N24, N34, . . . are connected to the word line WL3.

Furthermore, the transistors N11, N21, N31, . . . and the transistors N12, N22, N32, . . . are connected to the same source line SL0. The transistors N13, N23, N33, . . . and the transistors N14, N24, N34 are connected to the same source line SL2.

The variable resistance elements R11, R12, R13, R14, . . . are connected to the same bit line BL0, the variable resistance elements R21, R22, R23, R24, . . . are connected to the same bit line BL1, and the variable resistance elements R31, R32, R33, R34, . . . are connected to the same bit line BL2. As described above, in comparison to the memory array 202 according to the first embodiment, the memory array 229 according to the second embodiment has a structure (I-type cell structure) in which each of the variable resistance elements R11, R12, R13, . . . is connected directly to a corresponding one of the bit lines BL0, BL1, BL2, . . . not through the NMOS transistors N11, N12, . . . .

In a data writing cycle, the control circuit 210 provides the writing circuit 230 with a write command signal instructing application of a writing voltage, based on input data Din provided to the data input/output circuit 205. On the other hand, in a data reading cycle, the control circuit 210 provides the sense amplifier 204 with a read command signal instructing a reading operation.

The row selection circuit 208 receives row address signals from the address input circuit 209. Based on the row address signals, the row selection circuit 208 causes the row driver 231 to apply a predetermined voltage to a word line selected in the row address signals, by using a word line driver circuit WLD corresponding to one of the plurality of word lines WL0, WL1, WL2, . . . .

At the same time, when the row selection circuit 208 receives the row address signals from the address input circuit 209, the address input circuit 209 causes, based on the row address signals, the row driver 231 to apply a predetermined voltage generated by the variable voltage pulse generation circuit 704 to a source line selected in the row address signals, by using a source line driver circuit SLD corresponding to one of the plurality of source lines SL0, SL2, . . . .

In receiving a write command signal from the control circuit 210, the writing circuit 230 applies a writing voltage (writing voltage pulse Vp) to the bit line selected by the column selection circuit 203.

The writing power source 211 includes the LR writing power source 212 and the HR writing power source 213. The output VLO of the LR writing power source 212 is provided to the row driver 231, while the output VHO of the HR writing power source 213 is provided to the writing circuit 230.

Figure 27:
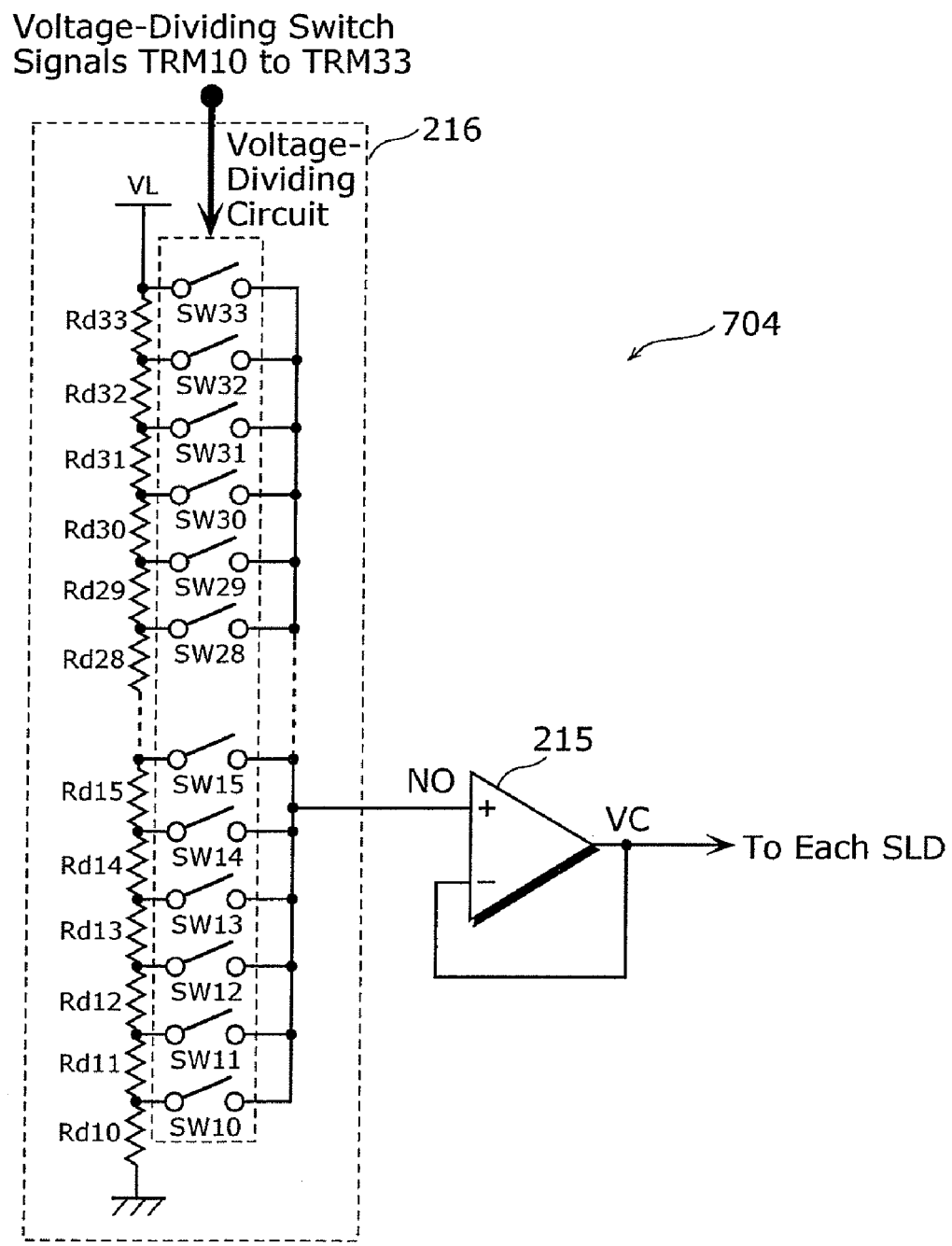
FIG. 27 is a circuit diagram showing an example of a structure of a variable oltage generation circuit according to the second embodiment of the present invention.

FIG. 27 is a diagram showing an example of the structure of the variable voltage generation circuit 704 shown in FIG. 26. The same reference numerals of FIG. 20 are assigned to the identical structural elements of FIG. 27, so that the identical structural elements are not explained again below. In the variable voltage pulse generation circuit 704, the output terminal VC of the voltage follower circuit 215 is connected to respective power source terminals of the source line driver circuits SLD. Therefore, regarding the source line driver control signals, the following is possible. In writing pulse application, the control circuit 210 controls the voltage-dividing switch signals TRM10, TRM11, ..., TRM33 so as to control only a target one of the switches SW10 to SW33 to be ON. Thereby, it is possible to control an output voltage of the voltage-dividing circuit 216 by multiple stages, thereby controlling a voltage of the output terminal VC of the voltage follower circuit 215 also by multiple stages. As a result, it is possible to output writing pulse voltages Vp, which are outputs of the writing driver circuits 214, by multiple stages depending on source line driver control signals provided to the source line driver circuits SLD.

[Operations of Variable Resistance Nonvolatile Memory Device according to Second Embodiment]

Regarding the variable resistance nonvolatile memory device having the above-described structure, at first, the description is given for operations performed by main circuit blocks. Next, the description is given for (a) a writing cycle used for a data writing operation and a forming and (b) a reading cycle used for a usual reading operation and a verification reading operation.

At first, an operation performed by the variable voltage pulse generation circuit 704 is described.

Now, as shown in FIG. 27, it is assumed that a potential of the output VLO of the LR writing power source 212 is 3.3 V, the resistance Rd10 is 100 kΩ, each of the resistances Rd11 to Rd33 is 10 kΩ, and a voltage amplification of the pulse application control signal is 3.3 V. Under the assumption, in the variable voltage pulse generation circuit 704, if only the switch SW10 is turned ON by the voltage-dividing switch signal TRM10, a potential of the common node NO is 1.0 V (=3.3 V×100 kΩ/330 kΩ) from a voltage-dividing relationship formula. Thereby, the output terminal VC is controlled to have a voltage of 1.0 V. As a result, the source line driver circuits SLD can output a writing pulse voltage Vp of 1.0 V according to the source line driver control signal.

Figure 28:
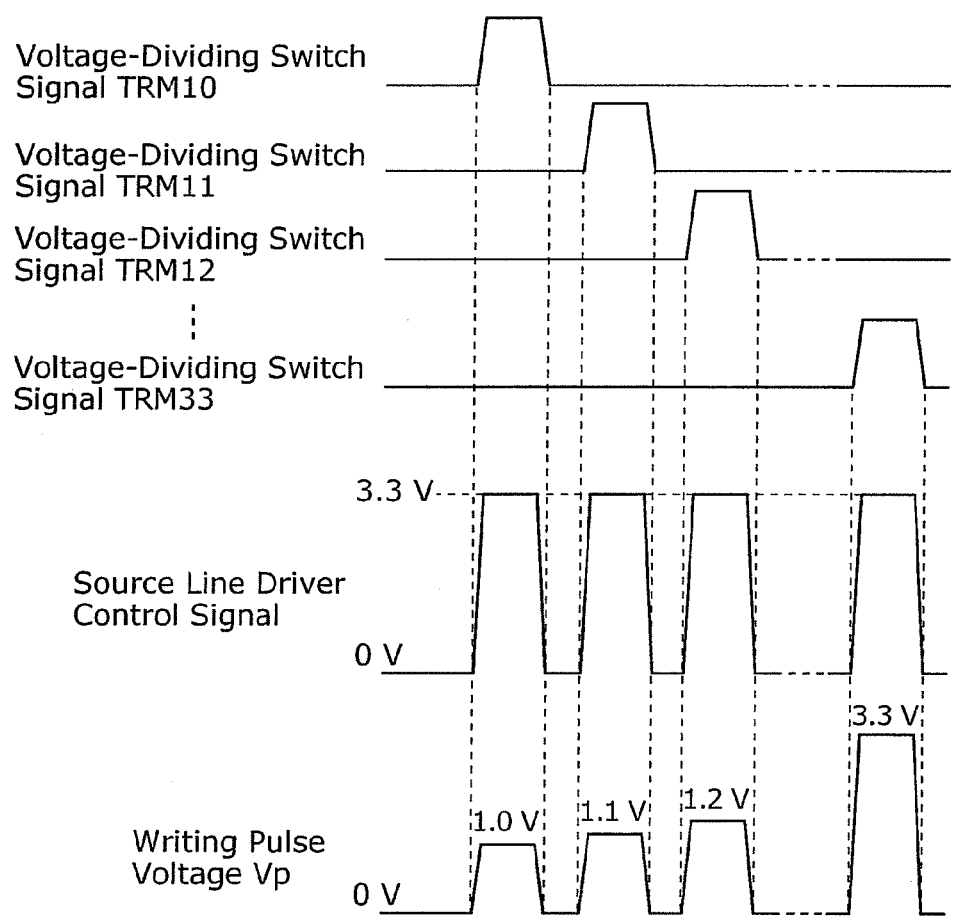
FIG. 28 is a timing diagram showing a waveform of step-up writing pulse voltage application according to the second embodiment of the present invention.

FIG. 28 is a timing diagram of a step-up writing pulse voltage Vp which the source line driver circuits SLD can output. In FIG. 28, by the voltage-dividing switch signals TRM10, TRM11, ... TRM33 outputted from the control circuit 210, the switches SW10 to SW33 are sequentially and independently controlled to be in a conducting state. Thereby, voltages of the output terminal VC are gradually increased from 1.0 V to 3.3 V by 0.1 V increments. As a result, in synchronization with the source line driver control signal, the writing pulse voltages Vp are applied, stepping up from 1.0 V to 3.3 V by 0.1 V increments.

Next, FIG. 29 shows a list of various setting voltages (for a I-type cell) which are: a voltage of a word line (WL) in various operation modes including a forming, a verification reading, a LR writing, a HR writing, and a reading; a voltage of a source line (SL) (hereinafter, a SL voltage); a voltage of a bit line (BL) (hereinafter, a BL voltage); a voltage of the output VHO of the HR writing power source 213; and a voltage of the output VLO of the LR writing power source 212. In FIG. 29, the SL voltage in a forming is the step-up writing pulse voltage Vp shown in FIG. 28, and the BL voltage in LR or HR writing is a pulse voltage of 2.4 V amplification. The SL voltage in LR writing controls, in the variable voltage pulse generation circuit 704, only the switch SW33 to be turned ON by the voltage-dividing switch signal TRM33. Thereby, the potential of the common node NO becomes 2.4 V (=VL), and the output terminal VC is controlled to have a voltage of 2.4 V. As a result, the source line driver circuit SLD can output a writing pulse voltage Vp of 2.4 V (=VL).

In LR writing, VL is a voltage generated in the LR writing power source 212, Vp (2.4 V) is a writing pulse voltage applied from the source line driver circuit SLD, and VH is a voltage generated in the HR power source 213 to be supplied to the writing circuit 230. Vp is a writing pulse voltage that exceeds the point P and does not exceed the point N in the pulse RV properties seen in FIGS. 10A and 10B, and is effectively applied to the memory cells M11, M12, ....

In HR writing, VL is a voltage generated in the LR writing power source 212, VH is a voltage generated in the HR writing power source 213 to be supplied to the writing circuit 230. VH is set to be a voltage (+2.4 V) at the point O in the pulse RV characteristics seen in FIG. 10A, in order not to enter the unipolar region determined by the preparation evaluation. In short, control is performed to observe the above-described second control rule.

It should be noted that, although a voltage of the output VHO of the HR writing power source 213 is applied to the source lines with reference to the bit lines, it is also possible to set the voltage to be relatively high so that a maximum voltage of the source lines is effectively within a range not exceeding the voltage (+2.4 V) of the point O, in consideration of decrease of the voltage due to parasitic resistance occurred between the HR writing power source 213 and the source lines.

In the forming, Vp is a step-up writing pulse voltage applied from the source line driver circuit SLD, and VL is a voltage generated in the LR writing power source 212. VL is set to be 3.3 V so that a writing pulse voltage Vp having a high voltage can be applied in the forming.

In verification reading and in reading, Vread is a reading voltage (0.4 V) clamped by the sense amplifier 204. Vread is in a positive voltage direction in the pulse RV properties seen in FIGS. 10A to 10C, thereby corresponding to a voltage value (+0.4 V) adjusted not to disturb the reading (namely, not to change a resistance state of a target variable resistance element). VDD corresponds to a voltage of the power supplied to the nonvolatile memory device 227.

The flowchart of the soft forming performed in the nonvolatile memory device 227 is the same as the flowchart of FIG. 23. Therefore, the flowchart is not explained again below.

Examples of the operations in a data writing cycle, a reading cycle, and the soft forming for the variable resistance nonvolatile memory device having the above-described structure are described with reference to timing diagrams shown in FIGS. 30A to 30C and 31, the block diagram of the variable resistance nonvolatile memory device according to the second embodiment of the present invention in FIG. 26, and the graphs for explaining the pulse RV properties in FIGS. 10A to 10C.

Figure 30C:
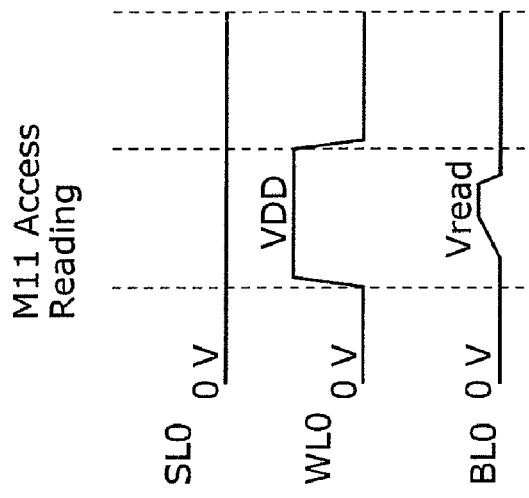
FIG. 30C is a timing diagram of an operation performed by the variable resistance nonvolatile memory device according to the second embodiment of the present invention.
Figure 30B:
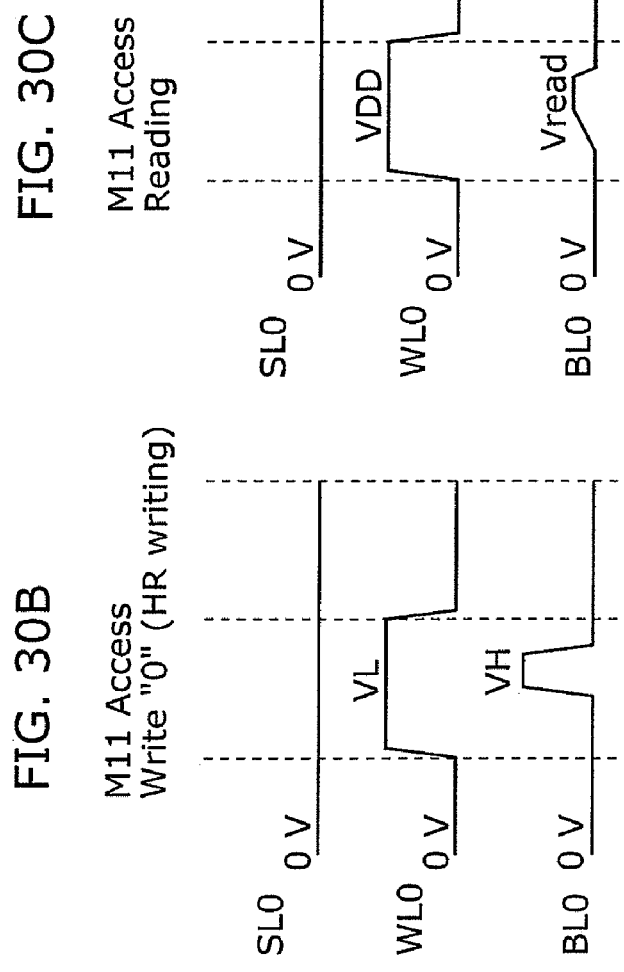
FIG. 30B is a timing diagram of an operation performed by the variable resistance nonvolatile memory device according to the second embodiment of the present invention.
Figure 30A:
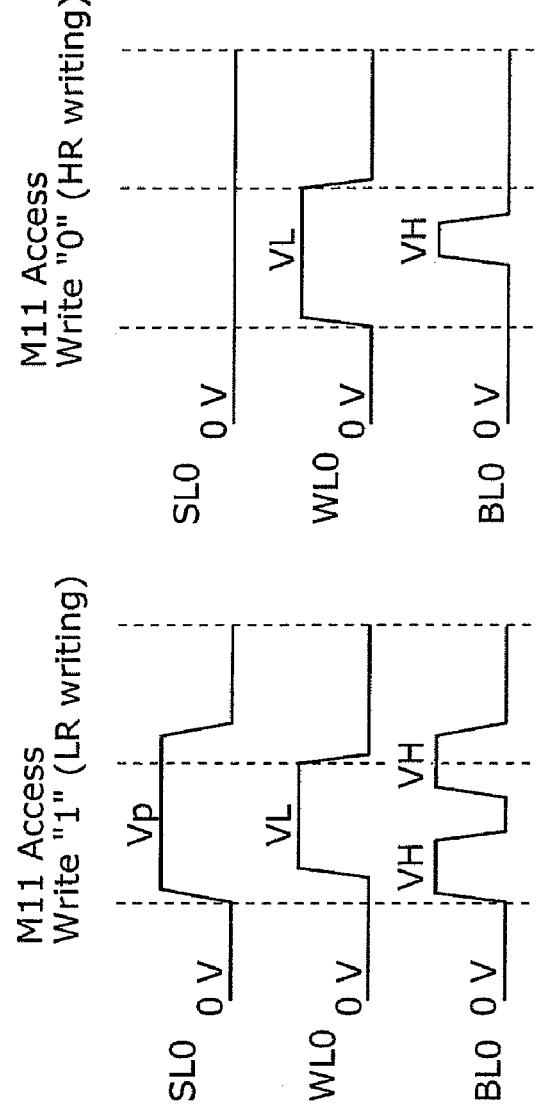
FIG. 30A is a timing diagram of an operation performed by the variable resistance nonvolatile memory device according to the second embodiment of the present invention.

FIGS. 30A to 30C are timing diagrams of operation examples performed by the nonvolatile memory device according to the second embodiment of the present invention.

In the operation examples, it is assumed that data is "0" when the variable resistance layer is in a high resistance state, and that data is "1" when the variable resistance layer is in a low resistance state. The description is given only for the situation that data is written to and read from the memory cell M11.

In a cycle of writing data "1" to the memory cell M11 shown in FIG. 30A, at first, the selected bit line BL0 is set to have a voltage VH (2.4 V) and the selected source line SL0 is set to have a voltage Vp (2.4 V). Next, the selected word line WL0 is set to have a voltage VL (2.4 V). Here, the NMOS transistor N11 in the selected memory cell M11 in FIG. 26 is still OFF. At this state, the voltage of 2.4 V is applied to both the drain and source terminals of the NMOS transistor N11 in FIG. 26. Therefore, current does not flow regardless of ON/OFF of the transistor.

Next, the selected bit line BL0 is set to have a voltage of 0 V in a predetermined time period. After the predetermined time period, a pulse waveform is applied to cause the selected bit line BL0 to have the voltage VH (2.4 V) again. At this state, a negative pulse voltage that exceeds the point P and does not exceed the point N in the pulse RV properties shown in FIGS. 10A and 10B is applied to the memory cell M11 in FIG. 26. Therefore, writing performs to change a high resistance value to a low resistance value. After that, the word line WL0 is set to have a voltage of 0 V. As a result, data "1" has been written in the memory cell M11. In other words, a memory cell is selected in a row direction by the source line and the word line, and then a pulse waveform in a negative voltage direction is applied to a certain bit line, so that a negative voltage pulse is applied to a variable resistance element in the memory cell selected by the source line, the word line, and the bit line, thereby achieving LR writing.

In writing data "0" to the memory cell M11 shown in FIG. 30B, at first, the selected bit line BL0 and the selected source line SL0 are set to have a voltage of 0 V. Next, the selected word line WL0 is set to have a voltage VL (2.4 V), thereby turning ON the NMOS transistor N11 of the selected memory cell M11 in FIG. 26.

Next, the selected bit line BL0 is set to have the voltage VH (2.4 V) in a predetermined time period. After the predetermined time period, a pulse waveform is applied to cause the selected bit line BL0 to have 0 V again. At this state, a positive pulse voltage (+2.4 V) at the point O in the pulse RV characteristics seen in FIG. 10A is applied to the memory cell M11 in FIG. 26. Therefore, writing performs to change a low resistance value to a high resistance value. After that, the word line WL0 is set to have a voltage of 0 V. As a result, data "0" has been written in the memory cell M11. In other words, a memory cell is selected in a row direction by the source line and the word line, and then a pulse waveform in a positive voltage direction is applied to a certain bit line, so that a positive voltage pulse is applied to a variable resistance element in the memory cell selected by the source line, the word line, and the bit line, thereby achieving HR writing.

In a data reading cycle for the memory cell M11 shown in FIG. 30C, at first, the selected bit line BL0 and the selected source line SL0 are set to have a voltage of 0 V. Next, the selected word line WL0 is set to have a voltage VDD (1.8 V), thereby turning ON the NMOS transistor N11 of the selected memory cell M11.

Next, the selected bit line BL0 is set to have the reading voltage Vread of 0.4 V in a predetermined time period, and the sense amplifier 204 detects a value of the current flowing in the selected memory cell M11 to determine whether the data stored in the selected memory cell M11 is data "0" or data "1". After that, the word line WL0 is set to have a voltage of 0 V. As a result, the data reading operation is completed.

Next, the soft forming operation performed by the nonvolatile memory device according to the second embodiment of the present invention is described.

Figure 31:
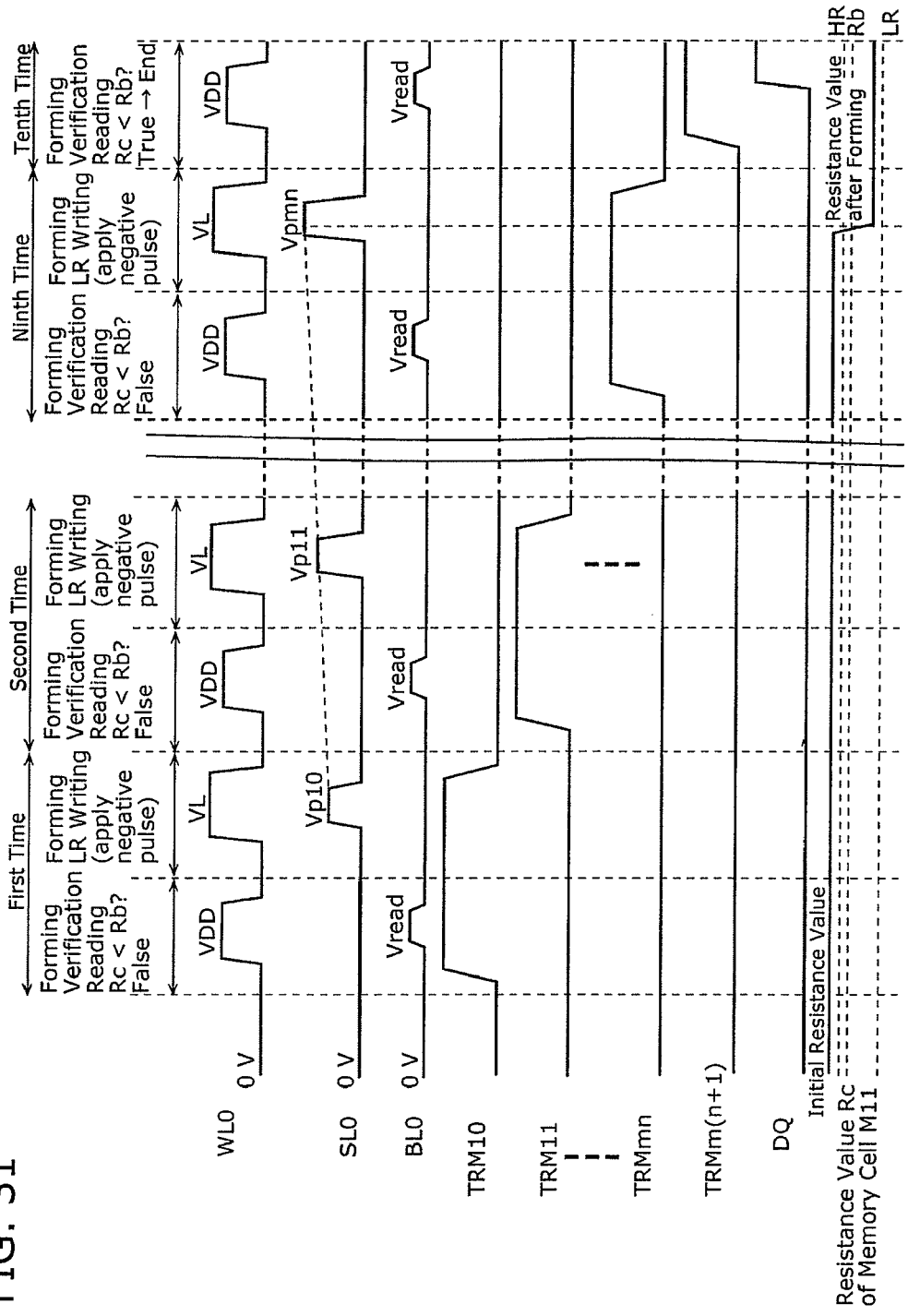
FIG. 31 is a timing diagram of the soft forming performed by the variable resistance nonvolatile memory device according to the second embodiment of the present invention.

FIG. 31 is a timing diagram of the soft forming operation performed by the nonvolatile memory device according to the second embodiment of the present invention. In the soft forming operation shown in FIG. 31, by accessing only one bit of the memory cell M11 having the address AD of 0, the flow of the soft forming shown in FIG. 23 is achieved for the bit, not for the array (however, the fourth and seventh steps are eliminated because of the one-bit access).

In FIG. 31, when the soft forming starts, each voltage of the word line WL0, the bit line BL0, and the source line SL0 of the target memory cell M11 is 0 V. Each of the voltage-dividing switch signals TRM10, TRM11, . . . , TRMmn (where m is an integer from 1 to 3, and n is an integer from 0 to 9) and the terminal DQ is a L level. The memory cell M11 is in an initial state.

At first, at the first step in FIG. 23, only the voltage-dividing switch signal TRM10 is set to be a H level, so that the source line driver circuit SLD can apply a voltage pulse Vp10 (=1.0 V) as a writing pulse voltage Vp.

Next, at the second step, it is determined that the writing pulse voltage Vp is equal to or lower than 3.3 V. At the third step, the address AD of the memory cell is initialized (AD=0), and then the processing proceeds to the fifth step.

At the fifth step, in order to perform a verification reading to verify whether or not the resistance value Rc of the selected memory cell is smaller than the forming reference resistance Rb (Rc<Rb), the selected word line WL0 is set to have a voltage VDD (1.8 V), thereby turning ON the NMOS transistor N11 in the selected memory cell M11.

Next, the selected bit line BL0 is set to have the reading voltage Vread of 0.4 V in a predetermined time period, and the sense amplifier 204 detects a value of the current flowing in the selected memory cell M11 to determine whether or not the reference value Rc of the selected memory cell M11 is smaller than the forming reference resistance Rb (Rc<Rb). Here, since it is determined that the reference value Rc is equal to or greater than the forming reference resistance Rb, the sense amplifier output (terminal) SAO outputs a L level, provides data "0" to the terminal DQ, and informs the external device (a memory tester, for example) of that the forming fails (false). After that, each of the word line WL0 and the bit line BL0 is set to have a voltage of 0 V, and the verification reading operation is completed.

Next, the forming LR writing (the sixth step) shown in FIG. 23 is described. In order to apply a negative voltage pulse (−1.0 V with a pulse width of 50 ns) for the forming LR writing to the selected memory cell, at first, each voltage of the selected bit line BL0, source line SL0, and word line WL0 is set to be 0 V. After that, the selected word line WL0 is set to have a voltage VL (3.3 V), thereby turning ON the NMOS transistor N11 of the selected memory cell M11 in FIG. 26. Next, the selected source line SL0 is set to have a voltage Vp (1.0 V) in a predetermined time period. After the predetermined time period, a pulse waveform (a negative voltage pulse for the source line) is applied to cause the selected source line SL0 to have a voltage of 0 V again. At this state, a negative pulse voltage higher (namely, having an absolute value smaller than that of) the voltage at the point N (a forming start voltage Vb=−1.8 V) in the pulse RV characteristics seen in FIG. 10A is applied to the memory cell M11 in FIG. 26. However, the selected memory cell M11 is still in the initial state and a forming is not performed. In short, the forming fails. After that, the word line WL0 is set to have a voltage of 0 V. As a result, the forming LR writing is completed.

Next, at the eighth step, the determination at the fifth step is made that the forming fails (false), and therefore the processing proceeds to the ninth step. Only the voltage-dividing switch signal TRM11 is set to be a H level, so that the source line driver circuit SLD can apply a voltage pulse Vp11 (=1.1 V) as a writing pulse voltage Vp.

Next, at the second step, it is determined that the writing pulse voltage Vp is equal to or lower than 3.3 V. At the third step, the address AD of the memory cell is initialized (AD=0), and then the processing proceeds to the fifth step.

At the fifth step in the second loop, the verification reading operation (Rc<Rb or not) is performed in the same manner as the fifth step in the first loop. However, since the resistance value Rc is currently still in the initial resistance state and is equal to or greater than the forming reference resistance Rb, the sense amplifier output (terminal) SAO outputs a L level, provides data "0" to the terminal DQ, and informs the external device (a memory tester, for example) of that a forming fails (false). As a result, the verification reading operation is completed.

Next, the forming LR writing (the second loop) at the sixth step shown in FIG. 23 is described. In order to apply a negative voltage pulse (−1.1 V with a pulse width of 50 ns) for the forming LR writing to the selected memory cell, at first, each voltage of the selected bit line BL0, source line SL0, and word line WL0 is set to be 0V. After that, the selected word line WL0 is set to have a voltage VL (3.3 V), thereby turning ON the NMOS transistor N11 of the selected memory cell M11 in FIG. 26. Next, the selected source line SL0 is set to have a voltage Vp (1.1 V) in a predetermined time period. After the predetermined time period, a pulse waveform (negative voltage pulse) is applied to cause the selected source line SL0 to have a voltage of 0 V again. At this state, a negative pulse voltage higher (namely, having an absolute value smaller than that of) the voltage at the point N (a forming start voltage Vb=−1.8 V) in the pulse RV characteristics seen in FIG. 10A is applied to the memory cell M11 in FIG. 26. However, the selected memory cell M11 is still in the initial state and a forming is not performed. In short, the forming fails. After that, the word line WL0 is set to have a voltage of 0 V. As a result, the forming LR writing in the second loop is completed.

After that, the loop from the second step to the ninth step (except the fourth and seventh steps) in FIG. 23, namely, a set of the verification reading operation and the forming LR writing operation, is repeated from three to eight times (loops). However, the resistance value Rc of the memory cell M11 is still in the initial state and is equal to or greater than the forming reference resistance Rb. In short, the forming fails.

Next, at the ninth step, only the voltage-dividing switch signal TRMmn (where m=1 and n=8) is set to be a H level, so that the source line driver circuit SLD can apply a voltage pulse Vpmn (where m=1 and n=8) (=1.8 V) as a writing pulse voltage Vp.

Next, at the second step, it is determined that the writing pulse voltage Vp is equal to or lower than 3.3 V. At the third step, the address AD of the memory cell is initialized (AD=0), and then the processing proceeds to the fifth step.

At the fifth step in the ninth loop, the verification reading operation (Rc<Rb or not) is performed. However, since the resistance value Rc is currently still in the initial resistance state and is equal to or greater than the forming reference resistance Rb, the sense amplifier output (terminal) SAO outputs a L level, provides data "0" to the terminal DQ, and informs the external device (a memory tester, for example) of that a forming fails (false). As a result, the verification reading operation is completed.

Next, the forming LR writing (the ninth loop) at the sixth step shown in FIG. 23 is described. In order to apply a negative voltage pulse (−1.8 V with a pulse width of 50 ns) for the forming LR writing to the selected memory cell, at first, each voltage of the selected bit line BL0, source line SL0, and word line WL0 is set to be 0V. After that, the selected word line WL0 is set to have a voltage VL (3.3 V), thereby turning ON the NMOS transistor N11 of the selected memory cell M11 in FIG. 26. Next, the selected source line SL0 is set to have a voltage Vp (1.8 V) in a predetermined time period. After the predetermined time period, a pulse waveform (negative voltage pulse) is applied to cause the selected source line SL0 to have a voltage of 0 V again. At this state, a negative pulse voltage corresponding to the point N (the forming start voltage Vb=−1.8 V) in the pulse RV characteristics seen in FIG. 10A is applied to the memory cell M11 in FIG. 26. Thereby, in the selected memory cell M11, a conducting path is formed from the initial high resistance state, so that the resistance value is changed to a resistance value after the forming that is between the high resistance state HR and the low resistance state LR. As a result, a forming is performed. Thereby, the forming is success at the first time. After that, the word line WL0 is set to have a voltage of 0 V. As a result, the forming LR writing in the ninth loop is completed.

After that, at the eighth step, the determination at the fifth step before the forming LR writing is made that the forming fails (false), and therefore the processing proceeds to the ninth step. Only the voltage-dividing switch signal TRMm (n+1) (where m=1 and n=8) is set to be a H level, so that the source line driver circuit SLD can apply a voltage pulse Vpm (n+1) (where m=1 and n=8) (=1.9 V) as a writing pulse voltage Vp.

Next, at the second step, it is determined that the writing pulse voltage Vp is equal to or lower than 3.3 V. At the third step, the address AD of the memory cell is initialized (AD=0), and then the processing proceeds to the fifth step.

At the fifth step in the tenth loop, the verification reading operation (Rc<Rb or not) is performed. However, since the resistance value Rc of the selected memory cell M11 is currently smaller than the forming reference resistance Rb, the sense amplifier output (terminal) SAO outputs a H level, provides data "1" to the terminal DQ, and informs the external device (a memory tester, for example) of that a forming is successful (true). As a result, the verification reading operation is completed.

After that, at the eighth step, it is confirmed that the determination of the immediately previous fifth step is made that the forming is successful (true), and thereby the soft forming is completed.

As described above, negative voltage pulses are applied, gradually increasing their absolute value by 0.1 V increments. For each application, completion of a forming is examined. Thereby, a negative voltage pulse equal to or higher than the above voltage is not applied after the completion of the forming. As a result, after a forming using a predetermined writing pulse voltage Vp, any excessive pulse voltage is not applied to the memory cell M11.

After the soft forming, as shown in FIG. 29, each of a HR writing pulse voltage and a LR writing pulse voltage is set to be 2.4 V, and their pulse widths are set to be 50 ns. Thereby, a usual data "0" writing (HR writing) and a usual data "1" writing (LR writing) are possible.

As described above, also in the I-type cell, application of step-up forming pulses from the source line side can produce the same effects as described in the first embodiment (II-type cell with application of step-up forming pulses from the bit line side). More specifically, if the soft forming is performed for each memory cell (in other words, if the above-described first control rule is observed), the changeable high resistance value level can be controlled to be higher. In addition, if a HR writing voltage near a maximal point which is not in the unipolar region is used to perform HR writing (in other words, if the above-described second control rule is observed), the high resistance value level can be set to be possible maximum (see FIGS. 10A to 10C and 11). As a result, it is possible to expand an operation window between a low resistance state and a high resistance state. Thereby, a high-speed reading and data reliability can be improved, and a risk of erroneous reading can be significantly reduced.

It should be noted that the LR writing voltage for data "1" writing (LR writing) is, of course, set not to decrease the changeable high resistance value level due to the forming margin Δ greater than 0.7 V.

It should also be noted that, in the case that the range close to the maximal point of the high resistance value level is relatively smooth, actual problems do not occur even if a HR writing voltage slightly entering the unipolar region is used to perform data "0" writing (HR writing). For example, even in the case that the HR writing voltage exceeds the maximal point of the high resistance value level, actual problems do not occur if the HR writing voltage causes a resistance value of 90% or more of a resistance value of the maximal point of the high resistance value level.

It should also be noted that it has been described in the second embodiment that, in the usual writing of data "0" and "1", the voltage (=2.4V) of the word line WL0, the LR writing pulse voltage Vp (=2.4 V), and the HR writing pulse voltage VH (=2.4 V) are set to be the same voltage, but these voltages are not necessarily the same.

[Variable Resistance Nonvolatile Memory Device According to Third Embodiment]

The following describes a 1T1R nonvolatile memory device which includes the I-type cells and step-up pulse voltages are applied from the bit line side to perform the soft forming, according to the third embodiment of the present invention.

Figure 32:
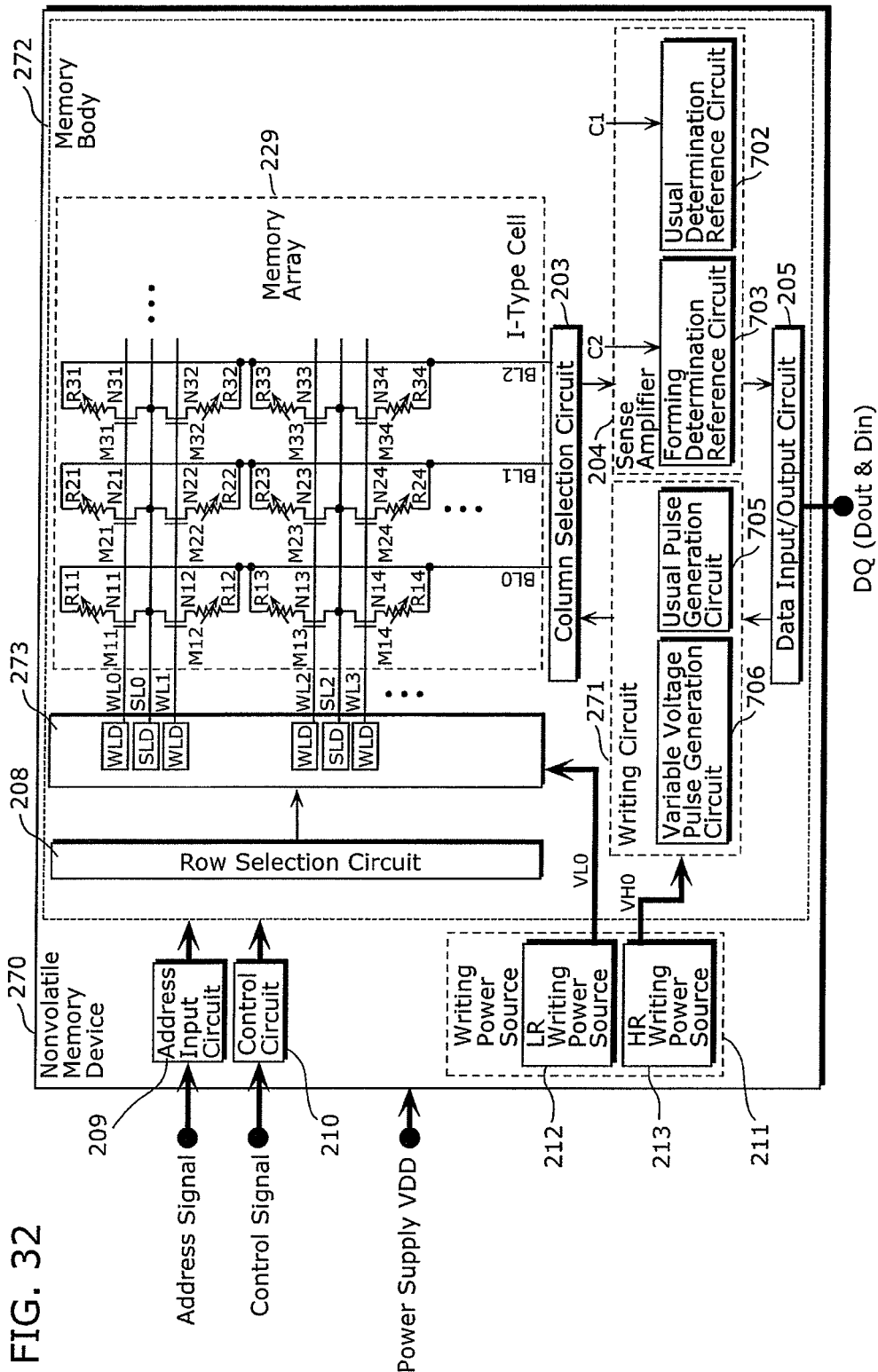
FIG. 32 is a block diagram showing a structure of a variable resistance nonvolatile memory device according to a third embodiment of the present invention.

FIG. 32 is a block diagram showing a structure of the nonvolatile memory device according to the third embodiment of the present invention.

The same reference numerals of FIG. 26 are assigned to the identical structural elements of FIG. 32, so that the identical structural elements are not explained again below.

The nonvolatile memory device 270 shown in FIG. 32 differs from the nonvolatile memory device 227 according to the second embodiment in that the writing circuit 230 is replaced by a writing circuit 271 including a variable voltage pulse generation circuit 706, and that the row driver 231 is replaced by a row driver 273.

The memory body 272 includes: the memory array 229; the row selection circuit 208; the row driver 273 including the word line drivers WLD and the source line drivers SLD; the column selection circuit 203; the writing circuit 271 for data writing; the sense amplifier 204 that detects an amount of current flowing in a selected bit line and thereby determines whether a resistance state is a high resistance state as data "0" or a low resistance state as data "1"; and the data input/output circuit 205 that receives and outputs input/output data via the terminal DQ.

In a data writing cycle, the control circuit 210 provides the writing circuit 271 with a write command signal instructing application of a writing voltage, based on input data Din provided to the data input/output circuit 205. On the other hand, in a data reading cycle, the control circuit 210 provides the sense amplifier 204 with a read command signal instructing a reading operation.

The row selection circuit 208 receives row address signals from the address input circuit 209. Based on the row address signals, the row selection circuit 208 causes the row driver 273 to apply a predetermined voltage to a word line selected in the row address signals, by using a word line driver circuit WLD corresponding to one of the plurality of word lines WL0, WL1, WL2, . . . .

At the same time, when the row selection circuit 208 receives the row address signals from the address input circuit 209, the address input circuit 209 causes, based on the row address signals, the row driver 273 to apply a predetermined voltage to a source line selected in the row address signals, by using a source line driver circuit SLD corresponding to one of the plurality of source lines SL0, SL2, . . . .

In receiving a write command signal from the control circuit 210, the writing circuit 271 applies a writing voltage to the bit line selected by the column selection circuit 203.

The writing power source 211 includes the LR writing power source 212 and the HR writing power source 213. The output VLO of the LR writing power source 212 is provided to the row driver 273, while the output VHO of the HR writing power source 213 is provided to the writing circuit 271.

Figure 33:
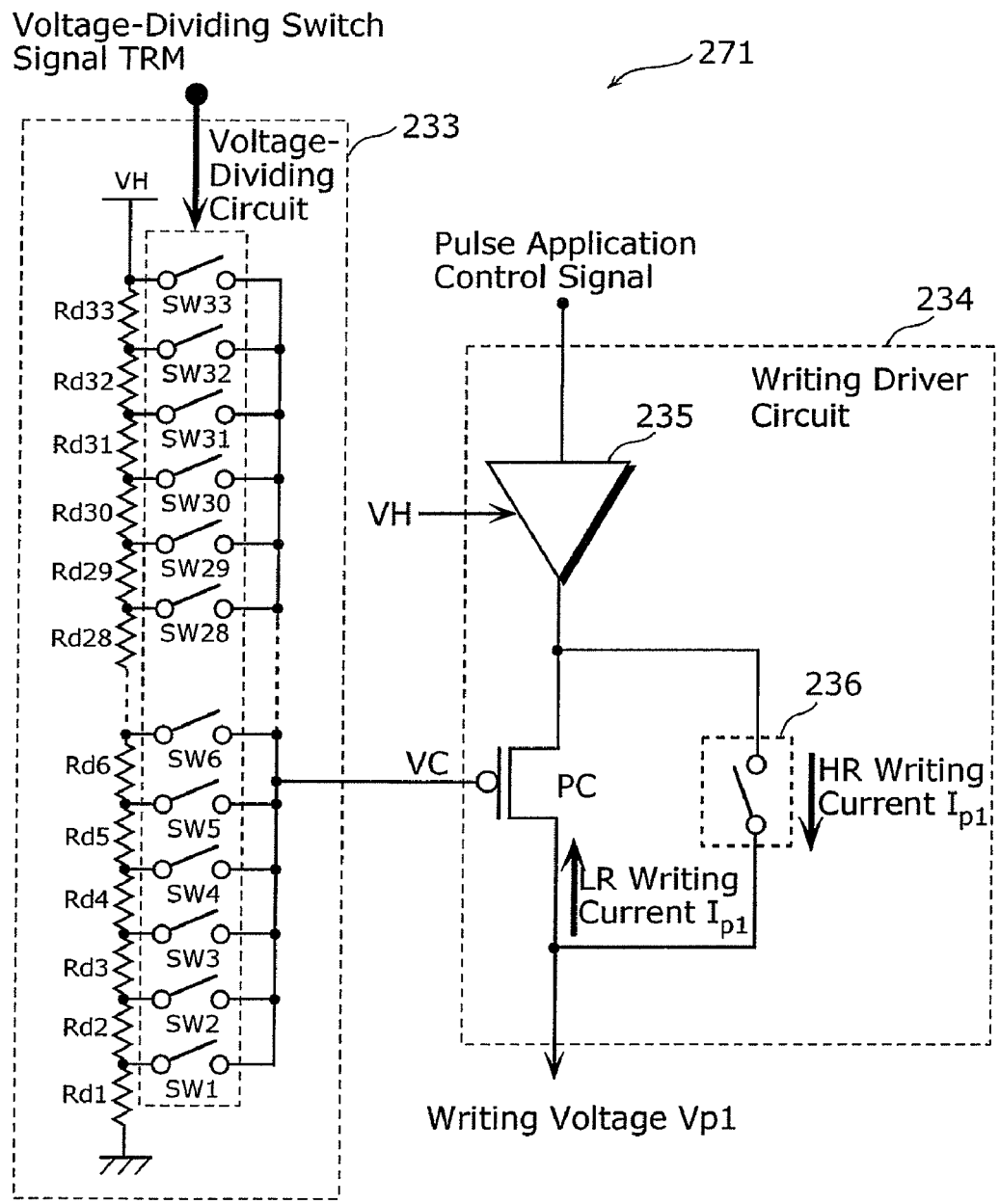
FIG. 33 is a circuit diagram showing an example of a structure of a writing circuit according to the third embodiment of the present invention.

FIG. 33 is a diagram showing an example of a structure of the writing circuit 271 in FIG. 32 in more detail. The same reference numerals of FIG. 20 are assigned to the identical structural elements of FIG. 33, so that the identical structural elements are not explained again below.

The writing circuit 271 shown in FIG. 33 differs from the voltage-dividing circuit 216 shown in FIG. 20 in that the writing driver circuit 214 is replaced by the voltage-dividing circuit 233 and the writing driver circuit 234, that the voltage follower circuit 215 is eliminated, and that the voltage-dividing circuit 233 is directly connected to the writing driver circuit 234.

In the voltage-dividing circuit 233, 33 fixed resistances Rd1 to Rd33 are connected in series to one another, between a voltage VH outputted from the HR writing power source 213 and a ground potential. There are switches SW1 to SW33 at nodes among the fixed resistances Rd1 to Rd33 and at a node between the power source VH terminal and the fixed resistance Rd33, respectively. Terminals of the switches SW1 to SW33 which are not connected to the fixed resistances Rd1 to Rd33 are connected to the same common node VC. Each of the switches SW1 to SW33 can be independently controlled to be ON/OFF, by a corresponding voltage-dividing switch signal TRM provided from the control circuit 210. The common note VC is connected to the writing driver circuit 234.

The writing driver circuit 234 includes: a write buffer 235 that receives, as power, the voltage VH supplied from the HR writing power source 213; a PMOS clamp transistor PC; and a switch 236 that is controlled to be ON/OFF by the control circuit 210. An input terminal of the write buffer 235 receives a pulse application control signal from the control circuit 210. An output terminal of the write buffer 235, a drain terminal of the PMOS clamp transistor PC, and an end of the switch 236 are connected to one another. A gate terminal of the PMOS clamp transistor PC and the common node VC are connected to each other. A source terminal of the PMOS clamp transistor PC which is connected to the other end of the switch 236 outputs a writing voltage Vp1.

Therefore, regarding the writing circuit 271, the following is possible. In forming pulse application, the control circuit 210 controls the voltage-dividing switch signal TRM so as to control only a target one of the switches SW1 to SW33 to be ON. Thereby, it is possible to control an output voltage of the voltage-dividing circuit 233 by multiple stages, thereby controlling a gate voltage of the PMOS clamp transistor PC also by multiple stages. Therefore, by clamping a L level side of a pulse voltage having a large amplification which is outputted from the write buffer 235, the voltage is converted into a writing voltage that is obtained by increasing the gate voltage of the PMOS clamp transistor PC by a threshold voltage Vt of the PMOS clamp transistor PC. As a result, Vp1 can be outputted. Here, the switch 236 is controlled to be OFF by the control circuit 210.

Furthermore, in the writing circuit 271, in application of the usual writing of data "1" (LR writing) and data "0" (HR writing), the switch 236 is controlled to be ON by the control circuit 210. Thereby, the source and drain terminals of the PMOS clamp transistor PC short out. As a result, a writing pulse voltage Vp1 having a voltage amplification VH (L level has a ground potential) caused by the write buffer 235 is outputted.

[Operations of Variable Resistance Nonvolatile Memory Device according to Third Embodiment]

Regarding the variable resistance nonvolatile memory device having the above-described structure, at first, the description is given for operations performed by main circuit blocks. Next, the description is given for (a) a writing cycle used for a data writing operation and a forming and (b) a reading cycle used for a usual reading operation and a verification reading operation.

Next, an operation performed by the writing circuit 271 shown in FIG. 33 is described.

Now, it is assumed that, for forming pulse application, a potential of the power source VH is 3.3 V, each of the resistances Rd1 to Rd33 is 10 kΩ, and a pulse voltage amplification of the write buffer 235 is 3.3 V. Under the assumption, if the threshold voltage Vt of the PMOS clamp transistor PC is 0.5 V, the writing circuit 271 turns only the switch SW18 (not shown in FIG. 33) ON, a potential of the common node VC is 1.8 V (=3.3 V×180 kΩ/330 kΩ) from a voltage-dividing relationship formula. Thereby, the ground potential (0 V) applied from the write buffer 235 is converted to 2.3 V (=1.8 V+0.5 V) in order to be outputted as a writing voltage Vp1 (=2.3 V−3.3 V=−1.0 V).

Figure 34:
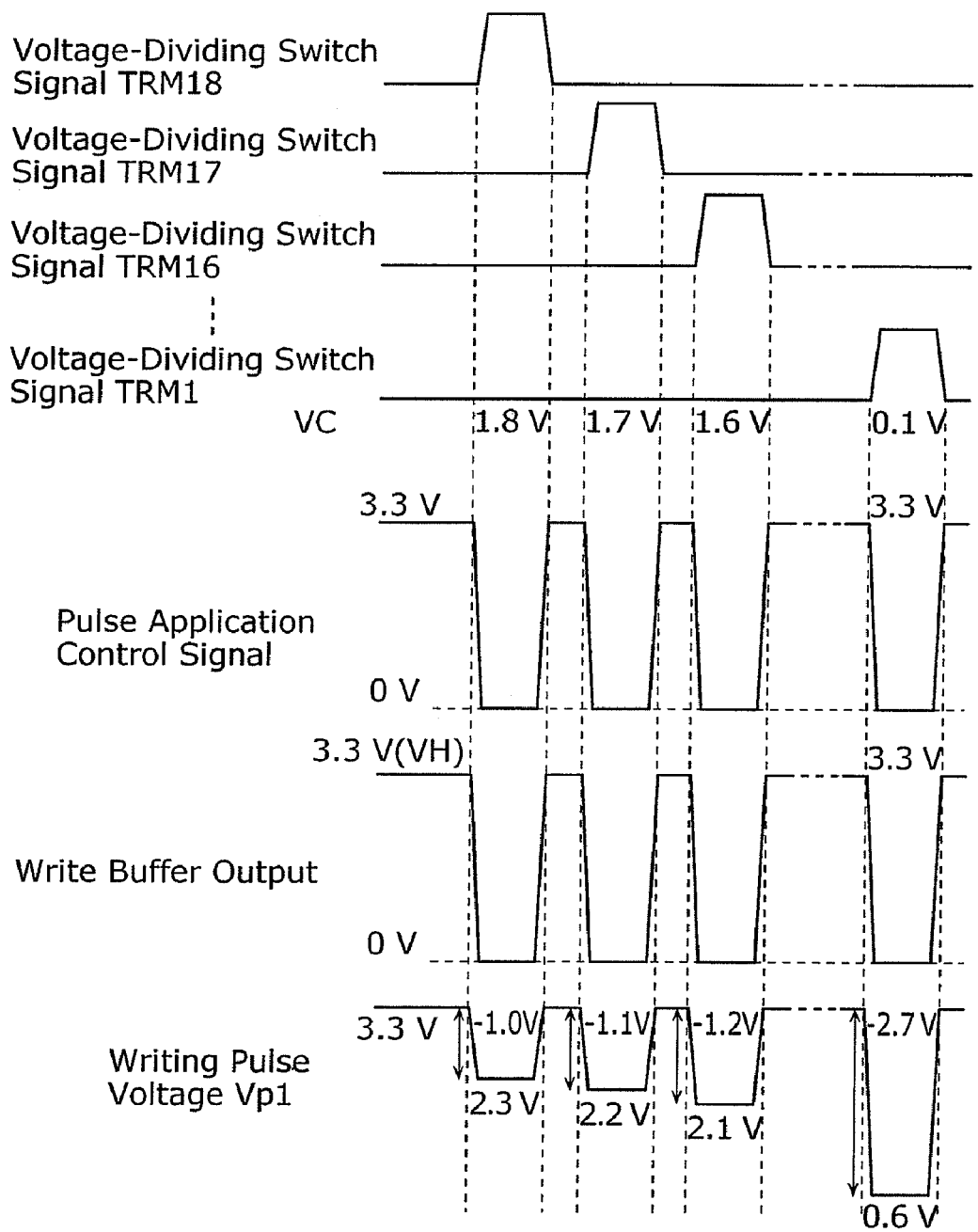
FIG. 34 is a timing diagram showing a waveform of step-down writing pulse voltage application according to the third embodiment of the present invention.

FIG. 34 is a timing diagram of a step-down writing pulse voltage Vp1 which the writing circuit 271 can output. In FIG. 34, in the soft forming, by voltage-dividing switch signals TRM18, TRM17, . . . outputted from the control circuit 210, the switches SW18 to SW1 are sequentially and independently controlled to be in a conducting state. Thereby, voltages of the common node VC are gradually decreased from 1.8 V to 0.1 V by 0.1 V decrements. As a result, in synchronization with an output pulse of the write buffer controlled by the pulse application control signal, negative pulse voltages from −1.0 V to −2.7 V (−0.1 V decrements) can be applied to a target memory cell, by stepping down the writing pulse voltage Vp1 from 2.3 V to 0.6 V by 0.1 V decrements.

Next, FIG. 35 shows a list of various setting voltages (for a I-type cell) which are: a voltage of a word line (WL) in various operation modes including a forming, a verification reading, a LR writing, a HR writing, and a reading; a voltage of a source line (SL) (hereinafter, a SL voltage); a voltage of a bit line (BL) (hereinafter, a BL voltage); a voltage of the output VHO of the HR writing power source 213; and a voltage of the output VLO of the LR writing power source 212. In FIG. 35, the BL voltage in a forming is the step-down writing pulse voltage Vp1 shown in FIG. 34, and the BL voltage in LR or HR writing is a pulse voltage of 2.4 V amplification.

In LR writing, VL is a voltage generated in the LR writing power source 212, Vp1 (2.4 V) is a writing pulse voltage applied from the writing circuit 271, and VH is a voltage generated in the HR power source 213 to be supplied to the writing circuit 271. Vp1 is a writing pulse voltage that exceeds the point P and does not exceed the point N in the pulse RV properties seen in FIGS. 10A and 10B, and is effectively applied to the memory cells M11, M12, . . . .

In HR writing, VL is a voltage generated in the LR writing power source 212, VH is a voltage generated in the HR writing power source 213 to be supplied to the writing circuit 271. VH is set to be a voltage (+2.4 V) at the point O in the pulse RV characteristics seen in FIG. 10A, in order not to enter the unipolar region determined by the preparation evaluation. In short, control is performed to observe the above-described second control rule.

It should be noted that, although a voltage of the output VHO of the HR writing power source 213 is applied to the source lines with reference to the bit lines, it is also possible to set the voltage to be relatively high so that a maximum voltage of the source lines is effectively within a range not exceeding the voltage (+2.4 V) of the point O, in consideration of decrease of the voltage due to parasitic resistance occurred between the HR writing power source 213 and the source lines.

In the forming, Vp1 is a step-down writing pulse voltage applied from the writing circuit 271, and VL is a voltage generated in the LR writing power source 212. VL is set to be 3.3 V so that a writing pulse voltage Vp1 having a high voltage can be applied in the forming.

In verification reading and in reading, Vread is a reading voltage (0.4 V) clamped by the sense amplifier 204. Vread is in a positive voltage direction in the pulse RV properties seen in FIGS. 10A to 10C, thereby corresponding to a voltage value (+0.4 V) adjusted not to disturb the reading (namely, not to change a resistance state of a target variable resistance element). VDD corresponds to a voltage of the power supplied to the nonvolatile memory device 270.

Figure 36:
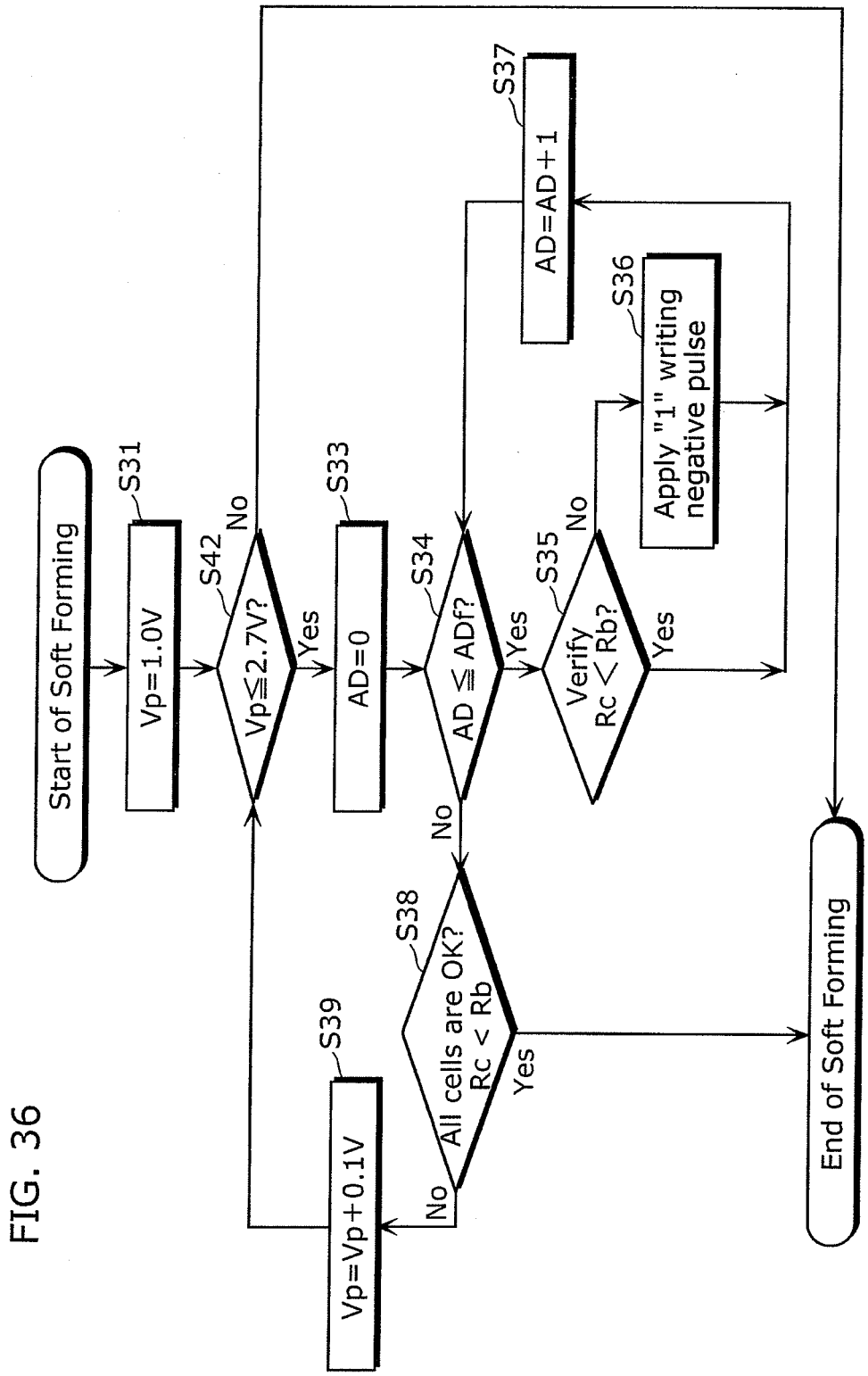
FIG. 36 is a flowchart of the soft forming performed by the variable resistance nonvolatile memory device according to the third embodiment of the present invention.

FIG. 36 is a flowchart of the soft forming performed by the variable resistance nonvolatile memory device 270. Assuming that, in applying a LR writing negative pulse for a forming, an absolute value of a pulse voltage applied to the memory cells M11, M12, . . . is Vp, the flowchart is the same as the flowchart of FIG. 23 except that the maximum value of the applicable pulse voltage Vp is 2.7 V (S42), not 3.3 V in the determination routine at the second step. Therefore, the same steps are not explained again below.

Examples of the operations in a data writing cycle, a reading cycle, and the soft forming for the variable resistance nonvolatile memory device having the above-described structure are described with reference to timing diagrams shown in FIGS. 37A to 37C and 38, the block diagram of the variable resistance nonvolatile memory device according to the third embodiment of the present invention in FIG. 32, and the graphs for explaining the pulse RV properties in FIGS. 10A to 10C.

Figure 37:
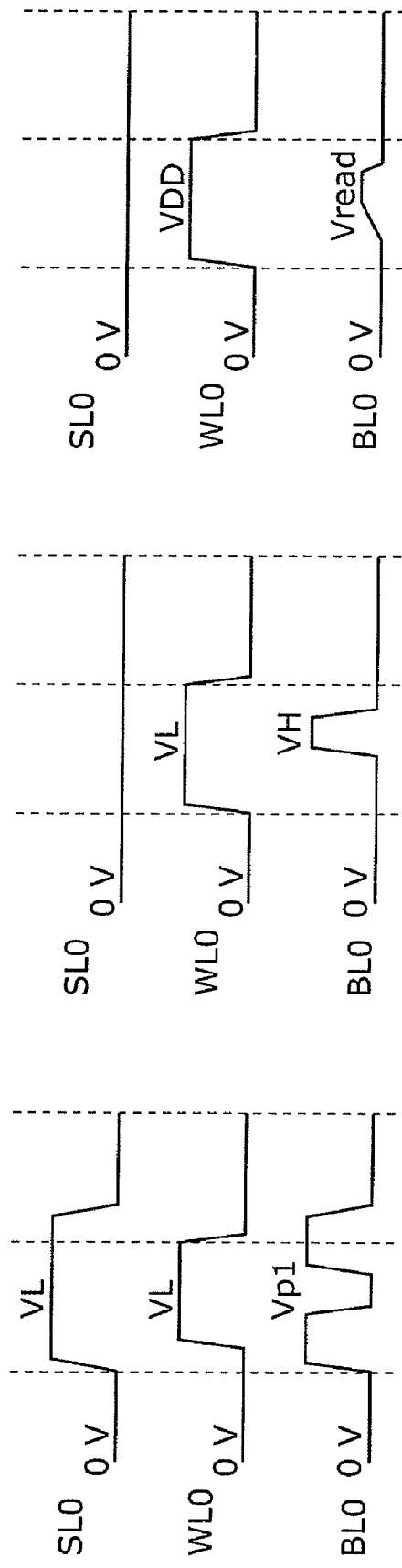
FIG. 37A is a timing diagram of an operation performed by the variable resistance nonvolatile memory device according to the third embodiment of the present invention.
FIG. 37B is a timing diagram of an operation performed by the variable resistance nonvolatile memory device according to the third embodiment of the present invention.
FIG. 37C is a timing diagram of an operation performed by the variable resistance nonvolatile memory device according to the third embodiment of the present invention.

FIGS. 37A to 37C are timing diagrams of operation examples performed by the nonvolatile memory device according to the third embodiment of the present invention. In the operation examples, it is assumed that data is "0" when the variable resistance layer is in a high resistance state, and that data is "1" when the variable resistance layer is in a low resistance state. The description is given only for the situation that data is written to and read from the memory cell M11.

In a cycle of writing data "1" to the memory cell M11 shown in FIG. 37A, at first, the selected bit line BL0 is set to have a voltage Vp1 (2.4 V) and the selected source line SL0 is set to have a voltage VL (2.4 V). Next, the selected word line WL0 is set to have a voltage VL (2.4 V). Here, the NMOS transistor N11 in the selected memory cell M11 in FIG. 32 is still OFF. At this state, the voltage of 2.4 V is applied to both the drain and source terminals of the NMOS transistor N11 in FIG. 32. Therefore, current does not flow regardless of ON/OFF of the transistor.

Next, the selected bit line BL0 is set to have a voltage of 0 V in a predetermined time period. After the predetermined time period, a pulse waveform is applied to cause the selected bit line BL0 to have the voltage Vp1 (2.4 V) again. At this state, a negative pulse voltage that exceeds the point P and does not exceed the point N in the pulse RV properties shown in FIGS. 10A and 10B is applied to the memory cell M11 in FIG. 32. Therefore, writing performs to change a high resistance value to a low resistance value. After that, the word line WL0 is set to have a voltage of 0 V. As a result, data "1" has been written in the memory cell M11. In other words, a memory cell is selected in a row direction by the source line and the word line, and then a pulse waveform in a negative voltage direction is applied to a certain bit line, so that a negative voltage pulse is applied to a variable resistance element in the memory cell selected by the source line, the word line, and the bit line, thereby achieving LR writing.

In writing data "0" to the memory cell M11 shown in FIG. 37B, at first, the selected bit line BL0 and the selected source line SL0 are set to have a voltage of 0 V. Next, the selected word line WL0 is set to have a voltage VL (2.4 V), thereby turning ON the NMOS transistor N11 of the selected memory cell M11 in FIG. 32.

Next, the selected bit line BL0 is set to have the voltage VH (2.4 V) in a predetermined time period. After the predetermined time period, a pulse waveform is applied to cause the selected bit line BL0 to have 0 V again. At this state, a positive pulse voltage (+2.4 V) at the point O in the pulse RV characteristics seen in FIG. 10A is applied to the memory cell M11 in FIG. 32. Therefore, writing performs to change a low resistance value to a high resistance value. After that, the word line WL0 is set to have a voltage of 0 V. As a result, data "0" has been written in the memory cell M11. In other words, a memory cell is selected in a row direction by the source line and the word line, and then a pulse waveform in a positive voltage direction is applied to a certain bit line, so that a positive voltage pulse is applied to a variable resistance element in the memory cell selected by the source line, the word line, and the bit line, thereby achieving HR writing.

In a data reading cycle for the memory cell M11 shown in FIG. 37C, at first, the selected bit line BL0 and the selected source line SL0 are set to have a voltage of 0 V. Next, the selected word line WL0 is set to have a voltage VDD (1.8 V), thereby turning ON the NMOS transistor N11 of the selected memory cell M11.

Next, the selected bit line BL0 is set to have the reading voltage Vread of 0.4 V in a predetermined time period, and the sense amplifier 204 detects a value of the current flowing in the selected memory cell M11 to determine whether the data stored in the selected memory cell M11 is data "0" or data "1". After that, the word line WL0 is set to have a voltage of 0 V. As a result, the data reading operation is completed.

Next, the soft forming operation performed by the nonvolatile memory device according to the third embodiment of the present invention is described.

Figure 38:
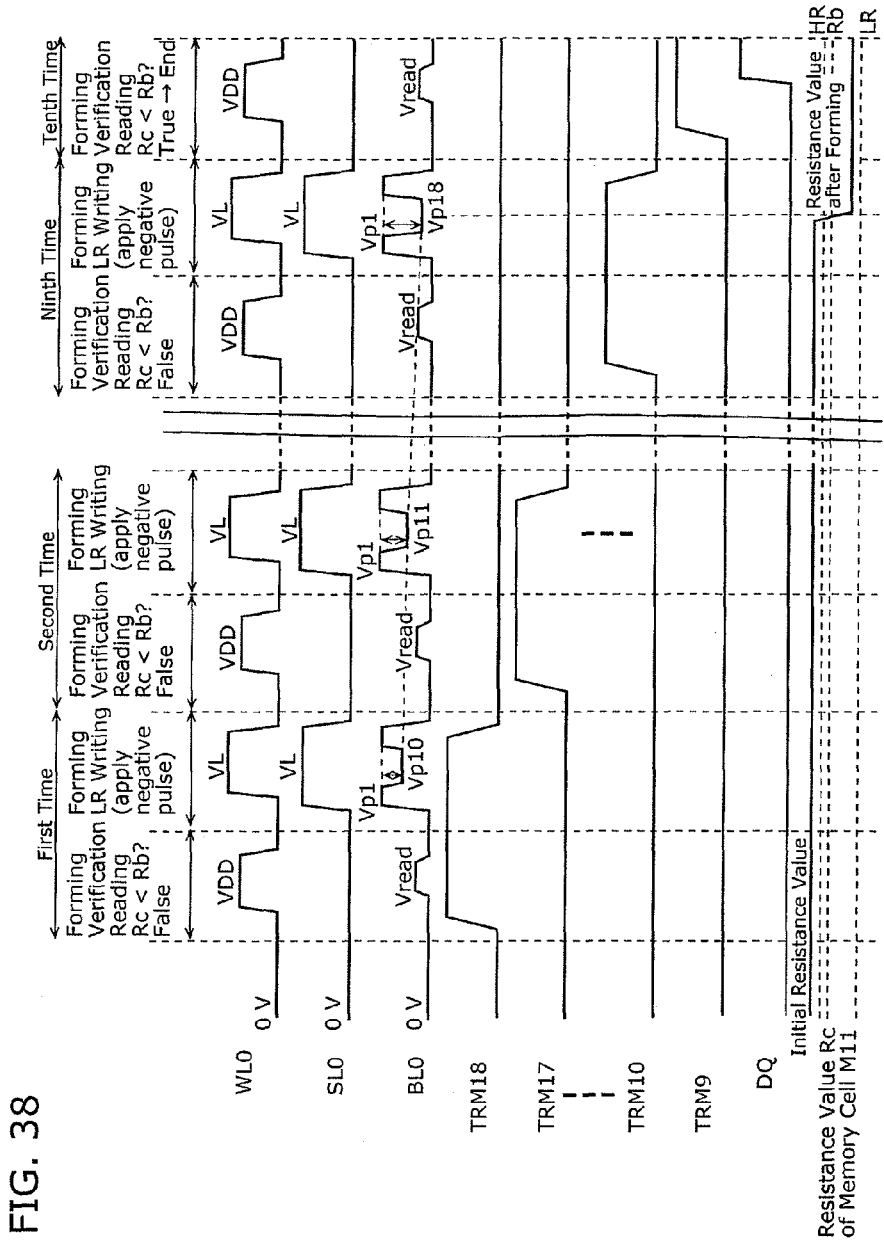
FIG. 38 is a timing diagram of the soft forming performed by the variable resistance nonvolatile memory device according to the third embodiment of the present invention.

FIG. 38 is a timing diagram of the soft forming operation performed by the nonvolatile memory device according to the third embodiment of the present invention.

In the soft forming operation shown in FIG. 38, by accessing only one bit of the memory cell M11 having the address AD of 0, the flow of the soft forming shown in FIG. 36 is achieved for the bit, not for the array (however, the fourth and seventh steps are eliminated because of the one-bit access).

In FIG. 38, when the soft forming starts, each voltage of the word line WL0, the bit line BL0, and the source line SL0 of the target memory cell M11 is 0 V. Each of the voltage-dividing switch signals TRM1, TRM2, ..., TRM33 and the terminal DQ is a L level. The memory cell M11 is in an initial state.

At first, at the first step in FIG. 36, only the voltage-dividing switch signal TRM18 is set to be a H level, so that the writing circuit 271 can apply a negative voltage pulse Vp10 (=3.3 V−2.3 V=1.0 V) as a writing pulse voltage Vp1.

Next, at the second step, it is determined that the writing pulse voltage Vp is equal to or lower than 2.7 V. At the third step, the address AD of the memory cell is initialized (AD=0), and then the processing proceeds to the fifth step.

At the fifth step, in order to perform a verification reading to verify whether or not the resistance value Rc of the selected memory cell is smaller than the forming reference resistance. Rb (Rc<Rb), the selected word line WL0 is set to have the voltage VDD (1.8 V), thereby turning ON the NMOS transistor N11 in the selected memory cell M11.

Next, the selected bit line BL0 is set to have the reading voltage Vread of 0.4 V in a predetermined time period, and the sense amplifier 204 detects a value of the current flowing in the selected memory cell M11 to determine whether or not the reference value Rc of the selected memory cell M11 is smaller than the forming reference resistance Rb (Rc<Rb). Here, since it is determined that the reference value Rc is equal to or greater than the forming reference resistance Rb, the sense amplifier output (terminal) SAO outputs a L level, provides data "0" to the terminal DQ, and informs the external device (a memory tester, for example) of that the forming fails (false). After that, each of the word line WL0 and the bit line BL0 is set to have a voltage of 0 V, and the verification reading operation is completed.

Next, the forming LR writing (the sixth step) shown in FIG. 36 is described. In order to apply a negative voltage pulse (−1.0 V with a pulse width of 50 ns) for the forming LR writing to the selected memory cell, at first, the selected bit line BL0 is set to have a voltage Vp1 (3.3 V) and the source line SL0 is set to have a voltage VL (3.3 V). Next, the selected word line WL0 is set to have a voltage VL (3.3 V).

After that, the selected bit line BL0 is set to have a voltage 2.3 V (=Vp1−Vp10) in a predetermined time period. After the predetermined time period, a pulse waveform (a negative voltage pulse of −1.0 V) is applied to cause the selected bit line BL0 to have the voltage Vp1 (3.3 V) again. At this state, a negative pulse voltage higher (namely, having an absolute value smaller than that of) the voltage at the point N (a forming start voltage Vb=−1.8 V) in the pulse RV characteristics seen in FIG. 10A is applied to the memory cell M11 in FIG. 32. However, the selected memory cell M11 is still in the initial state and a forming is not performed. In short, the forming fails. After that, the word line WL0 is set to have a voltage of 0 V. As a result, the forming LR writing is completed.

Next, at the eighth step, the determination at the fifth step is made that the forming fails (false), and therefore the processing proceeds to the ninth step. Only the voltage-dividing switch signal TRM17 is set to be a H level, so that the writing circuit 271 can apply a voltage pulse Vp11 (=1.1 V) as a writing pulse voltage Vp1.

Next, at the second step, it is determined that the writing pulse voltage Vp is equal to or lower than 2.7 V. At the third step, the address AD of the memory cell is initialized (AD=0), and then the processing proceeds to the fifth step.

At the fifth step in the second loop, the verification reading operation (Rc<Rb or not) is performed in the same manner as the fifth step in the first loop. However, since the resistance value Rc is currently still in the initial resistance state and is equal to or greater than the forming reference resistance Rb, the sense amplifier output (terminal) SAO outputs a L level, provides data "0" to the terminal DQ, and informs the external device (a memory tester, for example) of that a forming fails (false). As a result, the verification reading operation is completed.

Next, the forming LR writing (the second loop) at the sixth step shown in FIG. 36 is described. In order to apply a negative voltage pulse (−1.1 V with a pulse width of 50 ns) for the forming LR writing to the selected memory cell, at first, the selected bit line BL0 is set to have a voltage Vp1 (3.3 V) and the source line SL0 is set to have a voltage VL (3.3 V). Next, the selected word line WL0 is set to have a voltage VL (3.3 V). After that, the selected bit line BL0 is set to have a voltage 2.2 V (=Vp1−Vp11) in a predetermined time period. After the predetermined time period, a pulse waveform (a negative voltage pulse of −1.1 V) is applied to cause the selected bit line BL0 to have the voltage Vp1 (3.3 V) again. At this state, a negative pulse voltage higher (namely, having an absolute value smaller than that of) the voltage at the point N (a forming start voltage Vb=−1.8 V) in the pulse RV characteristics seen in FIG. 10A is applied to the memory cell M11 in FIG. 32. However, the selected memory cell M11 is still in the initial state and a forming is not performed. In short, the forming fails. After that, the word line WL0 is set to have a voltage of 0 V. As a result, the forming LR writing in the second loop is completed.

After that, the loop from the second step to the ninth step (except the fourth and seventh steps) in FIG. 36, namely, a set of the verification reading operation and the forming LR writing operation, is repeated from three to eight times (loops). However, the resistance value Rc of the memory cell M11 is still in the initial state and is equal to or greater than the forming reference resistance Rb. In short, the forming fails.

Next, at the ninth step, only the voltage-dividing switch signal TRM10 is set to be a H level, so that the writing circuit 271 can apply a voltage pulse Vp18 (=1.8 V) as a writing pulse voltage Vp1.

Next, at the second step, it is determined that the writing pulse voltage Vp is equal to or lower than 2.7 V. At the third step, the address AD of the memory cell is initialized (AD=0), and then the processing proceeds to the fifth step.

Next, at the fifth step in the ninth loop, the verification reading operation (Rc<Rb ?) is performed. However, since the resistance value Rc is currently still in the initial resistance state and is equal to or greater than the forming reference resistance Rb, the sense amplifier output (terminal) SAO outputs a L level, provides data "0" to the terminal DQ, and informs the external device (a memory tester, for example) of that a forming fails (false). As a result, the verification reading operation is completed.

Next, the forming LR writing (the ninth loop) at the sixth step shown in FIG. 36 is described. In order to apply a negative voltage pulse (−1.8 V with a pulse width of 50 ns) for the forming LR writing to the selected memory cell, at first, the selected bit line BL0 is set to have a voltage Vp1 (3.3 V) and the source line SL0 is set to have a voltage VL (3.3 V). Next, the selected word line WL0 is set to have a voltage VL (3.3 V). After that, the selected bit line BL0 is set to have a voltage 1.5 V (=Vp1−Vp18) in a predetermined time period. After the predetermined time period, a pulse waveform (a negative voltage pulse of −1.8 V) is applied to cause the selected bit line BL0 to have the voltage Vp1 (3.3 V) again. At this state, a negative pulse voltage corresponding to the point N (the forming start voltage Vb=−1.8 V) in the pulse RV characteristics seen in FIG. 10A is applied to the memory cell M11 in FIG. 32. Thereby, in the selected memory cell M11, a conducting path is formed from the initial high resistance state, so that the resistance value is changed to a resistance value after the forming that is between the high resistance state HR and the low resistance state LR. As a result, a forming is performed. Thereby, the forming is success at the first time. After that, the word line WL0 is set to have a voltage of 0 V. As a result, the forming LR writing in the ninth loop is completed.

After that, at the eighth step, the determination at the fifth step before the forming LR writing is made that the forming fails (false), and therefore the processing proceeds to the ninth step. Only the voltage-dividing switch signal TRM9 is set to be a H level, so that the writing circuit 271 can apply a voltage pulse Vp10 (=1.9 V) as a writing pulse voltage Vp1.

Next, at the second step, it is determined that the writing pulse voltage Vp is equal to or lower than 2.7 V. At the third step, the address AD of the memory cell is initialized (AD=0), and then the processing proceeds to the fifth step.

At the fifth step in the tenth loop, the verification reading operation (Rc<Rb or not) is performed. However, since the resistance value Rc of the selected memory cell M11 is currently smaller than the forming reference resistance Rb, the sense amplifier output (terminal) SAO outputs a H level, provides data "1" to the terminal DQ, and informs the external device (a memory tester, for example) of that a forming is successful (true). As a result, the verification reading operation is completed.

After that, at the eighth step, it is confirmed that the determination of the immediately previous fifth step is made that the forming is successful (true), and thereby the soft forming is completed.

As described above, negative voltage pulses are applied, gradually increasing their absolute values by 0.1 V increments. For each application, completion of a forming is examined. Thereby, a negative voltage pulse equal to or higher than the above voltage is not applied after the completion of the forming. As a result, after a forming using a predetermined writing pulse voltage Vp1, any excessive pulse voltage is not applied to the memory cell M11.

After the soft forming, as shown in FIG. 35, each of a HR writing pulse voltage and a LR writing pulse voltage is set to be 2.4 V, and their pulse widths are set to be 50 ns. Thereby, a usual data "0" writing (HR writing) and a usual data "1" writing (LR writing) are possible.

As described above, also in another soft forming for the I-type cell, application of step-down forming pulses from the bit line side can produce the same effects as described in the second embodiment (I-type cell with application of step-up pulses from the source line side). More specifically, if the soft forming is performed for each memory cell (in other words, if the above-described first control rule is observed), the changeable high resistance value level can be controlled to be higher. In addition, if a HR writing voltage near a maximal point which is not in the unipolar region is used to perform HR writing (in other words, if the above-described second control rule is observed), the high resistance value level can be set to be possible maximum (see FIGS. 10A to 10C and 11). As a result, it is possible to expand an operation window between a low resistance state and a high resistance state. Thereby, a high-speed reading and data reliability can be improved, and a risk of erroneous reading can be significantly reduced.

It should be noted that the LR writing voltage for data "1" writing (LR writing) is, of course, set not to decrease the changeable high resistance value level due to the forming margin Δ greater than 0.7 V.

It should also be noted that, in the case that the range close to the maximal point of the high resistance value level is relatively smooth, actual problems do not occur even if a HR writing voltage slightly entering the unipolar region is used to perform data "0" writing (HR writing). For example, even in the case that the HR writing voltage exceeds the maximal point of the high resistance value level, actual problems do not occur if the HR writing voltage causes a resistance value of 90% or more of a resistance value of the maximal point of the high resistance value level.

It should also be noted that it has been described in the third embodiment that, in usual writing of data "0" and "1", the voltage (=2.4 V) of the word line WL0, the LR writing pulse voltage Vp (=2.4 V), and the HR writing pulse voltage VH (=2.4 V) are set to be the same voltage, but these voltages are not necessarily the same.

[Variable Resistance Nonvolatile Memory Device According to Fourth Embodiment]

The following describes a 1T1R nonvolatile memory device including the II-type cells each of which can receive LR writing forming pulses directly from the outside in inspection of a wafer, according to the fourth embodiment of the present invention.

Figure 39:
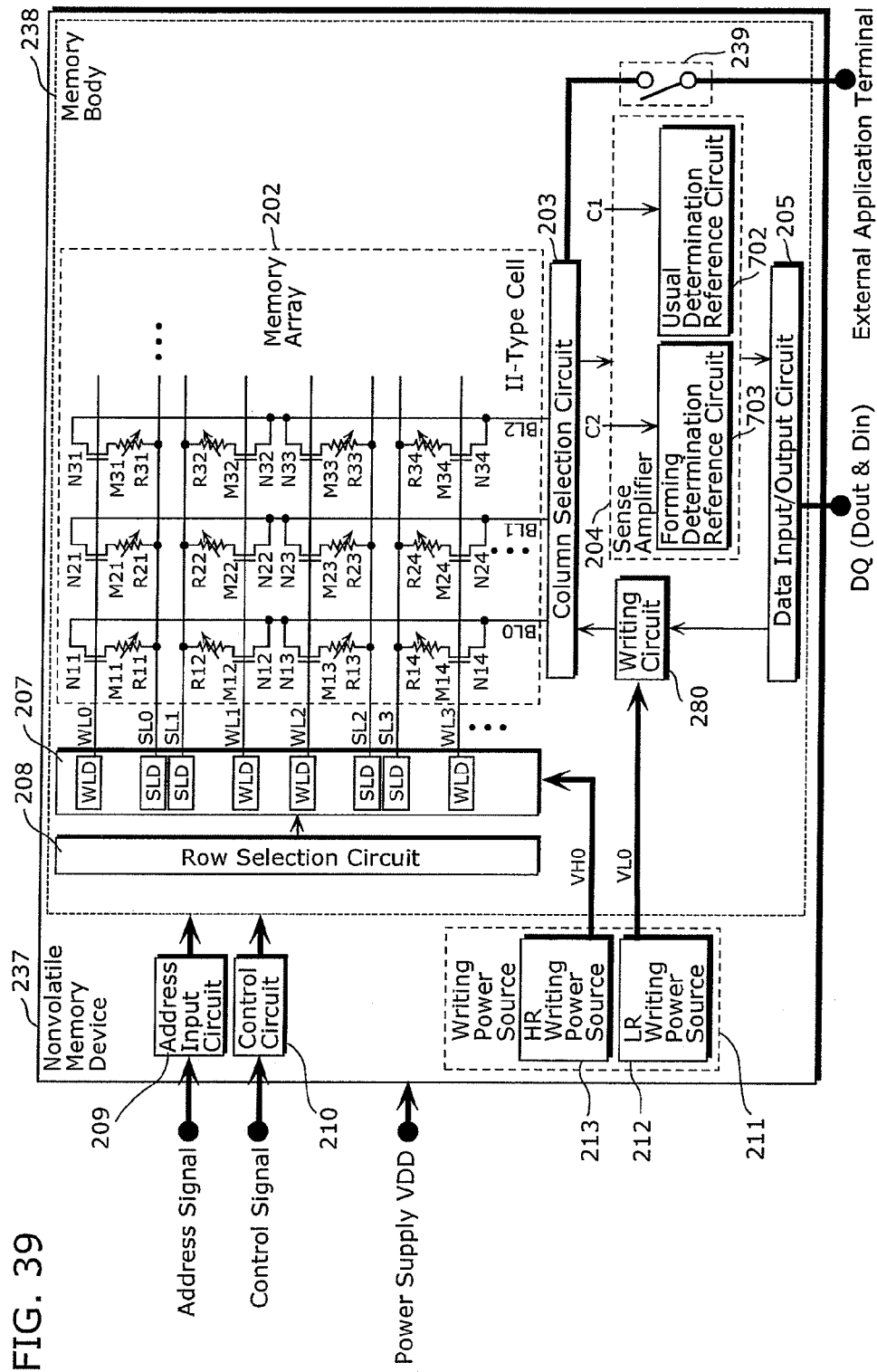
FIG. 39 is a block diagram showing a structure of a variable resistance nonvolatile memory device according to a fourth embodiment of the present invention.

FIG. 39 is a block diagram showing a structure of the nonvolatile memory device according to the fourth embodiment of the present invention.

The same reference numerals of FIG. 17 are assigned to the identical structural elements of FIG. 39, so that the identical structural elements are not explained again below.

The nonvolatile memory device 237 shown in FIG. 39 differs from the nonvolatile memory device 200 according to the first embodiment in that an external application terminal connection switch 239 is added and variable voltage pulses are thereby generated outside in the soft forming.

The external application terminal connection switch 239 is controlled by a control signal provided from the control circuit 210 to be in a conducting state, so that an external device (a memory tester, for example) shown in FIG. 39 can apply a RL forming pulse from an external application terminal to a selected memory cell via the column selection circuit 203.

In receiving a write command signal from the control circuit 210, a writing circuit 280 applies a usual writing voltage to a bit line selected by the column selection circuit 203.

The writing power source 211 includes the LR writing power source 212 and the HR writing power source 213. The output VHO of the HR writing power source 213 is provided to the row driver 207, while the output VLO of the LR writing power source 212 is provided to the writing circuit 280.

[Operations of Variable Resistance Nonvolatile Memory Device According to Fourth Embodiment]

The flowchart of the soft forming performed in the nonvolatile memory device 237 is the same as the flowchart of FIG. 23. Therefore, the flowchart is not explained again below. However, although a negative pulse to write "1" (the sixth step) is generated in the variable voltage pulse generation circuit 701 in performing the soft forming in the first embodiment, a negative pulse for a forming is applied from outside of the nonvolatile memory device by an external device (for example, a memory tester not shown) in the fourth embodiment. In other words, the nonvolatile memory device 237 does not include a circuit for generating forming voltage pulses according to the above-described first control rule, but the nonvolatile memory device 237 receives such a forming voltage pulse via an external application terminal to provide the pulse to a target memory cell.

As described above, the soft forming method in which pulses are applied from outside of the nonvolatile memory device can produce the same effects as described in the first embodiment (step-up pulses are generated inside of the nonvolatile memory device). More specifically, if the soft forming is performed for each memory cell (in other words, if the above-described first control rule is observed), the changeable high resistance value level can be controlled to be higher. In addition, if a HR writing voltage near a maximal point which is not in the unipolar region is used to perform HR writing (in other words, if the above-described second control rule is observed), the high resistance value level can be set to be possible maximum (see FIGS. 10A to 10C and 11). As a result, it is possible to expand an operation window between a low resistance state and a high resistance state. Thereby, a high-speed reading and data reliability can be improved, and a risk of erroneous reading can be significantly reduced. In addition, since the variable voltage pulse generation circuit is not necessarily provided in the nonvolatile memory device, it is possible to reduce a chip area, thereby lowering a cost.

Moreover, although the fourth embodiment has been described using the II-type cells, the same effects can be produced even if the 1-type cells (step-down pulse application from the bit line side) are used in the fourth embodiment as a variation of the memory cells.

[Variable Resistance Nonvolatile Memory Device According to Fifth Embodiment]

The following describes a 1T1R nonvolatile memory device including a one-pulse application soft forming circuit that uses current-restricted voltage pulses as the soft forming method that is not the above-described verification soft forming method, according to the fifth embodiment.

Figure 40:
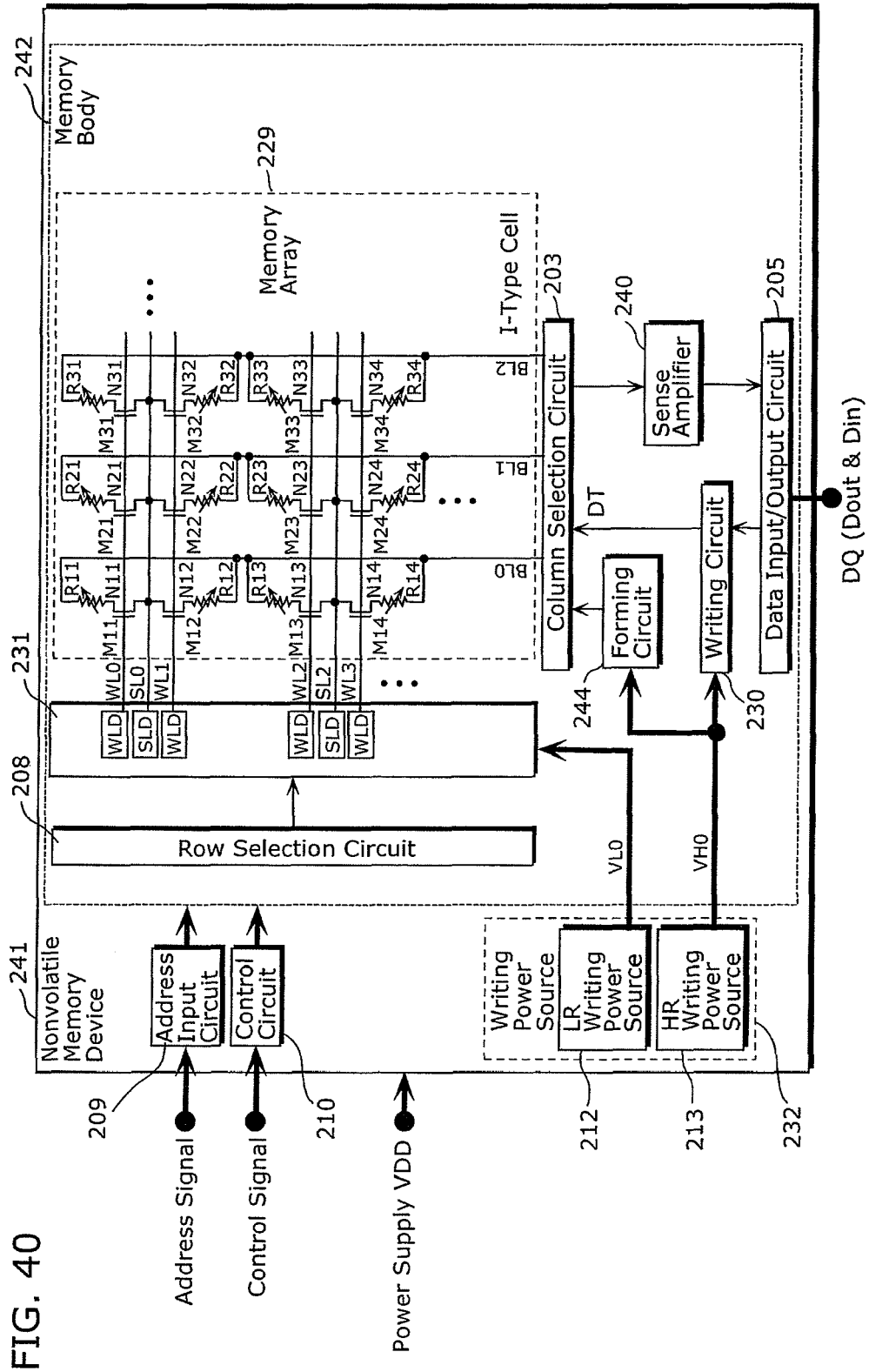
FIG. 40 is a block diagram showing a structure of a variable resistance nonvolatile memory device according to a fifth embodiment of the present invention.

FIG. 40 is a block diagram showing a structure of the nonvolatile memory device according to the fourth embodiment of the present invention.

The same reference numerals of FIGS. 26 and 32 are assigned to the identical structural elements of FIG. 40, so that the identical structural elements are not explained again below.

As shown in FIG. 40, the nonvolatile memory device 241 has a structure in which the nonvolatile memory device 227 according to the second embodiment includes a sense amplifier 240 and a forming circuit 244.

The output VLO of the LR writing power source 212 is supplied to the row driver 231, and the output VHO of the HR writing power source 213 is supplied to the writing circuit 230 and the forming circuit 244.

The HR writing power source 213 is a power circuit capable of supplying the voltage indicated at the point O in the pulse RV characteristics in FIG. 10A. The HR writing power source 212 is a power circuit capable of supplying, in the usual LR writing, a voltage having an absolute value equal to or greater than an absolute value of the voltage indicated at the point P in the pulse RV characteristics in FIG. 10B.

The sense amplifier 240 is a common sense amplifier which is a circuit that is shown by the circuit diagram of FIG. 18 but does not include the selection transistor 223 and the reference resistance Rb. The sense amplifier 240 has a single so-called reading determination level (reference resistance Rref). The sense amplifier 240 detects an amount of current flowing in a selected bit line and thereby determines whether a resistance state is a high resistance state as data "0" or a low resistance state as data "1".

Figure 41:
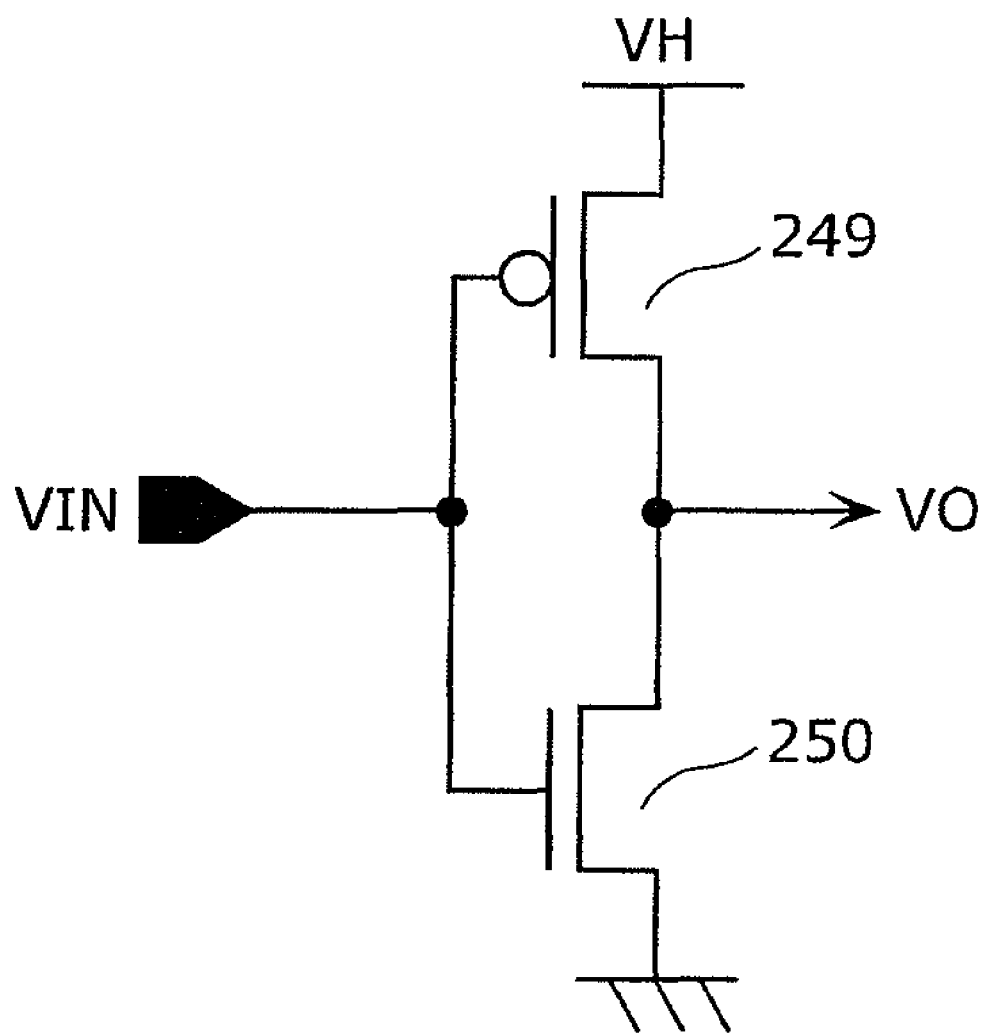
FIG. 41 is a circuit diagram showing an example of a structure of a forming circuit according to the fifth embodiment of the present invention.

As shown in FIG. 41, the forming circuit 244 has a structure in which the PMOS transistor 249 is inverter-connected to the voltage VH supplied from the HR writing power source 213 and the NMOS transistor 250 is inverter-connected to a ground potential, thereby forming a driver. An output VO of the forming circuit 244 is connected via the column selection circuit 203 to a bit line connected to a selected memory cell for a forming. An input VIN of the forming circuit 244 receives a control signal from the control circuit 210.

Moreover, based on a control signal provided from the outside, the control circuit 210 controls operations of the memory body 242. In a forming operation, the control circuit 210 provides a write command signal for instructing application of a voltage for a forming (LR writing as initialization), to the row driver 231 and the forming circuit 244. Then, by using the driver (the NMOS transistor 250 capable of current restriction in a forming) of the forming circuit 244, the control circuit 210 performs the soft forming for the respective memory cells M11, M21, . . . by applying a pulse once.

Next, the description is given for load characteristics of the forming circuit 244 that is characteristics of the fifth embodiment.

Figure 42B:
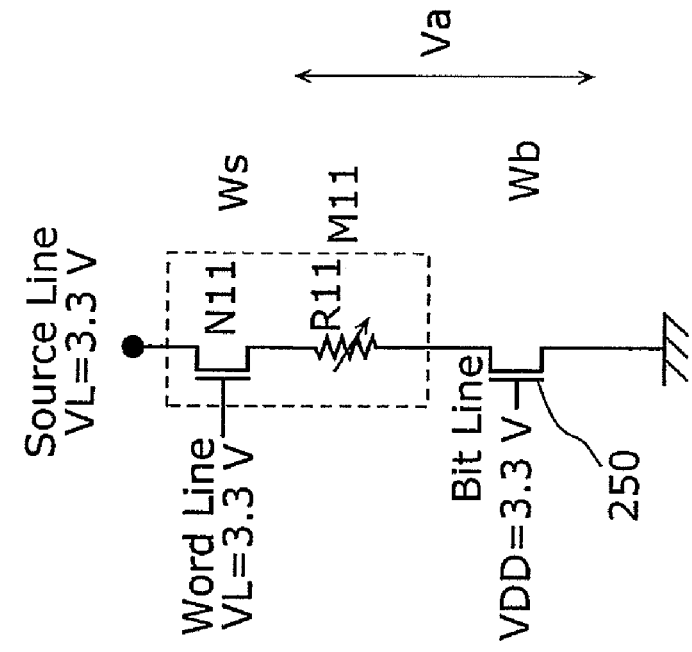
FIG. 42B is a circuit diagram for explaining an operation of the forming circuit according to the fifth embodiment of the present invention.
Figure 42A:
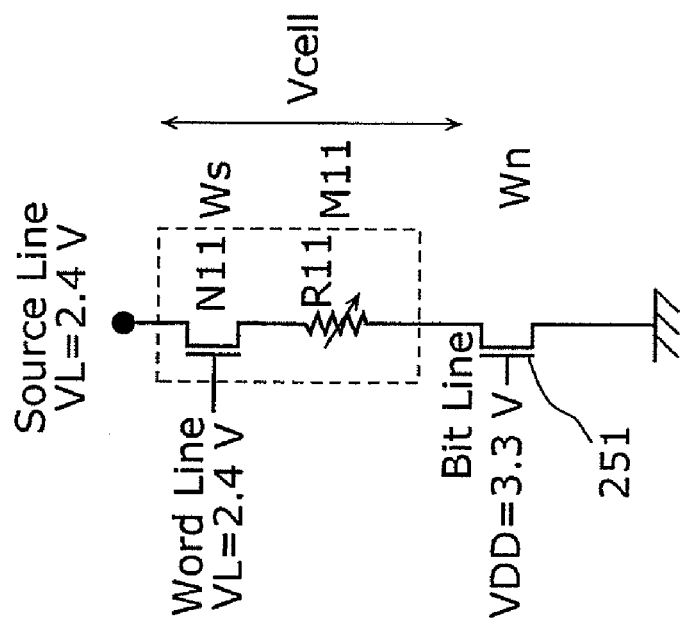
FIG. 42A is a circuit diagram for explaining an operation of a forming circuit according to the fifth embodiment of the present invention.

FIGS. 42A and 42B are circuit diagrams for explaining (i) bias conditions of the memory cell M11 and a bit line side driver and (ii) various transistor sizes, in the usual LR writing and in the forming operation.

FIG. 42A shows bias conditions in the LR writing as follows. A voltage VL (=2.4 V) supplied from the source line driver SLD is applied to a source terminal of the NMOS transistor N11 (with a transistor width (namely, a channel width or a gate width) Ws) of the memory cell M11. A voltage VL (=2.4 V) supplied from the word line driver WLD is applied to a word line. The upper electrode terminal of the variable resistance element R11 is connected to a driver output of the writing circuit 230 connected via the column selection circuit 203. A power VDD (=3.3 V) is applied to a gate terminal of the NMOS transistor 251 (with a transistor width Wn) of the driver. A source terminal of the NMOS transistor 251 is fixed to have a voltage of 0 V. Current flows in a direction from the source line to the bit line. As a result, the LR writing is performed for the variable resistance element R11. In addition, a transistor width Wn of the NMOS transistor 251 of the driver is set to be adequately larger than the transistor width Ws of the NMOS transistor N11, so that a voltage can be efficiently applied to the variable resistance element R11. This results in small on-resistance not to be noticeable.

On the other hand, FIG. 42B shows bias conditions in the forming as follows. A voltage VL (=3.3 V) supplied from the source line driver SLD is applied to a source terminal of the NMOS transistor N11 (with a transistor width Ws) of the memory cell M11. A voltage VL (=3.3 V) supplied from the word line driver WLD is applied to a word line. The upper electrode terminal of the variable resistance element R11 is connected to a driver output VO of the forming circuit 244 connected via the column selection circuit 203. A power VDD (=3.3 V) is applied to a gate terminal of the NMOS transistor 250 (with a transistor width Wb) of the driver. A source terminal of the NMOS transistor 250 is fixed to have a voltage of 0 V. Thereby, current flows in a direction from the source line to the bit line. As a result, the forming is performed for the variable resistance element R11. Here, application of a high voltage causes a forming to form a conducting path. When current starts flowing into the variable resistance element R11, the NMOS transistor 250 performs current restriction. The transistor width Wb of the NMOS transistor 250 is set to be adequately smaller than the transistor width Ws of the NMOS transistor N11. Thereby, it is possible to prevent that the forming causes a change to a low resistance state and eventually large current flows to decrease the changeable high resistance value level. In other words, setting is performed so that flowing current does not exceed ILR when a power VDD (=3.3 V) is applied to drain and gate terminals of the NMOS transistor 250 and a source terminal of the NMOS transistor 250 is fixed to 0 V.

It should be noted that a row selection switch, a line resistance, and the like are not shown in FIGS. 42A and 42B, assuming that the design can cause impedance to be adequately small.

[Operations of Variable Resistance Nonvolatile Memory Device According to Fifth Embodiment]

Figure 43A:
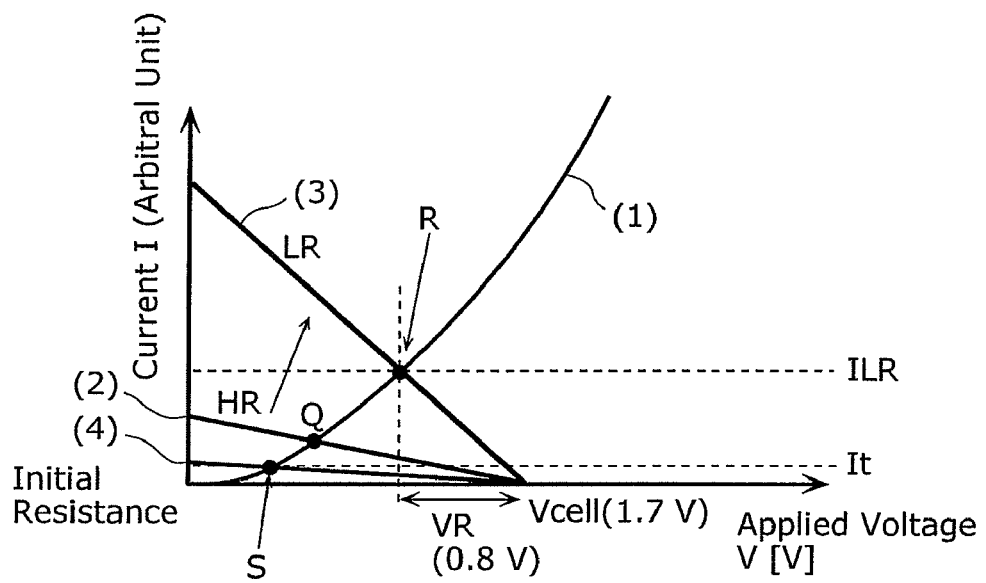
FIG. 43A is a graph plotting I-V properties used in operation point analysis in a forming according to the fifth embodiment of the present invention.
Figure 43B:
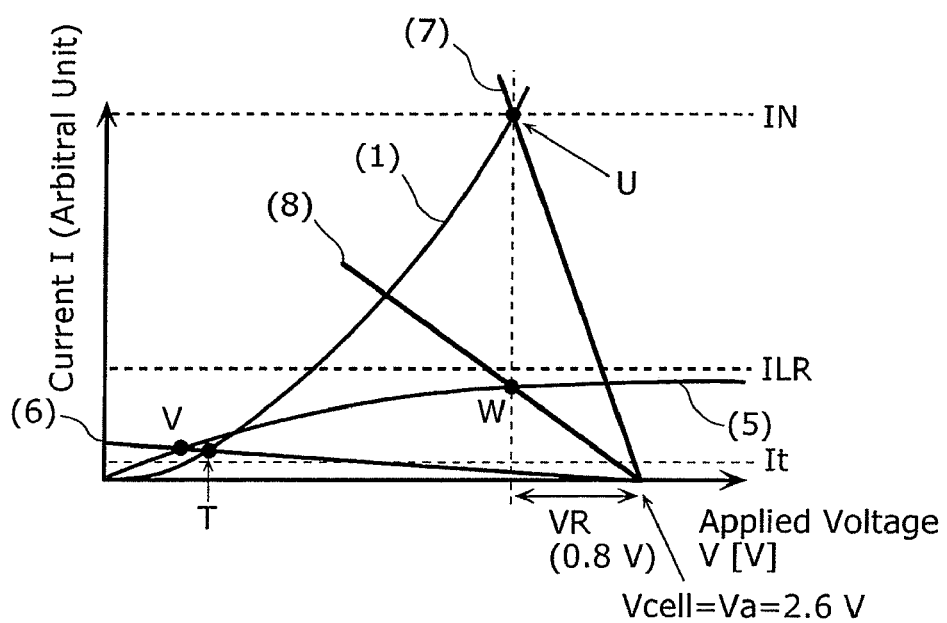
FIG. 43B is a graph plotting I-V properties used in operation point analysis in a forming according to the fifth embodiment of the present invention.

FIGS. 43A and 43B are graphs plotting properties used in operation point analysis in a resistance change, using the load properties of the transistor and the variable resistance element in FIGS. 42A and 42B, respectively. In the graphs, a vertical axis represents a current I (by a given unit) and a horizontal axis is an applied voltage V.

FIG. 43A is a graph plotting I-V characteristics for explaining a change from a high resistance state HR to low resistance state LR, which corresponds to FIG. 42A. Here, for the sake of simplicity in description, the load properties of two elements that are the variable resistance element R11 having a large resistance value component and the NMOS transistor N11 are shown. In FIG. 43A, the load characteristics of the NMOS transistor N11 operated in a saturated state are plotted by a curve (1), the load characteristics of the variable resistance element R11 in a HR state are plotted by a straight line (2), the load characteristics of the variable resistance element R11 in a LR state are plotted by a straight line (3), and the load characteristics of the variable resistance element R11 in an initial state are plotted by a straight line (4). Here, it is assumed that the LR writing voltage shown in FIG. 42A is applied when the variable resistance element R11 is in a HR state. Under the assumption, an inter-terminal voltage Vcell of the memory cell M11 is approximately 1.7 V, and an operation point after the application is the point Q. After that, the LR writing starts. Thereby, the operation point of the variable resistance element R11 changes from the point Q to the point R (a LR writing current in this situation is assumed to be ILR), so that an inter-terminal voltage of the variable resistance element R11 has a LR writing voltage VR (approximately 0.8 V). Thereby, the load characteristics of the variable resistance element R11 change from (1) to (2). As a result, the LR writing is completed.

If a usual LR writing voltage shown in FIG. 42A is applied to the initial high resistance state, the operation point becomes the point S. In the situation, it is impossible to flow a predetermined forming threshold current It (current required to change the initial state to the point D in (a1) in FIG. 3A), thereby failing a change to a low resistance state. In other words, the usual LR writing voltage application cannot change the operation point S, and fails to perform a forming.

FIG. 43B is a graph plotting I-V characteristics for explaining a forming to change the resistance state from an initial high resistance state to a low resistance state, which corresponds to FIG. 42B. Here, for the sake of simplicity in description, the load properties of two elements that are the variable resistance element R11 having a large resistance value component and the NMOS transistor N11 are shown. In FIG. 43B, the load characteristics of the NMOS transistor 250 operated in a saturated state are plotted by a curve (5), the load characteristics of the variable resistance element R11 in an initial state are plotted by a straight line (6), the load characteristics of the variable resistance element R11 in a LR state after a forming using the usual writing circuit 230, in other words, after a forming along the load curve (1) are plotted by a straight line (7), and the load characteristics of the variable resistance element R11 in a low resistance state after the soft forming using the forming circuit 244, in other words, after a forming along the load curve (5) are plotted by a straight line (8). Here, at first, it is assumed that, when a forming is performed using the usual writing circuit 230, both the word line voltage and the source line voltage are set to be 3.3 V as shown in FIG. 42B and a voltage for a forming (LR writing as initialization) is applied in shown in FIG. 42A. Under the assumption, the inter-terminal voltage Vcell of the memory cell M11 becomes approximately 2.6 V, the operation point after the application becomes the point T, and current at the operation point exceeds the forming threshold current It. After that, the LR writing starts, the operation point of the variable resistance element R11 changes from the point T to the point U so that the inter-terminal voltage of the variable resistance element R11 becomes a LR writing voltage VR (approximately 0.8 V), and the load characteristics of the variable resistance element R11 change from (6) to (7). As a result, the forming is completed. However, in comparison to a predetermined LR writing ILR, a significantly large forming current IN flows into the variable resistance element R11 in a forming at the operation point T. Thereby, the soft forming is not performed, and the changeable high resistance value level is decreased.

Next, the situation where a forming is performed using the forming circuit 244 is described. If a voltage for a forming (LR writing as initialization) in FIG. 42B is applied, an inter-terminal voltage Va of each of the variable resistance element R11 and the NMOS transistor 250 becomes approximately 2.6 V, the operation point after the application becomes the point V, and current at the operation point exceeds the forming threshold current It. After that, the LR writing starts, the operation point of the variable resistance element R11 changes from the point V to the point W, so that the inter-terminal voltage of the variable resistance element R11 becomes a LR writing voltage VR (approximately 0.8 V), and the load characteristics of the variable resistance element R11 change from (6) to (8). As a result, the forming is completed. In the situation, in comparison to the predetermined LR writing current ILR, the forming current at the operation point W is reduced. Therefore, an excessive current does not flow into the variable resistance element R11, and the soft forming can be performed by applying a negative pulse once. Thereby, it is possible to control the changeable high resistance value level to be higher.

Examples of the operations in a data writing and the soft forming for the variable resistance nonvolatile memory device having the above-described structure are described with reference to timing diagrams shown in FIGS. 44A to 44C, the block diagram of the variable resistance nonvolatile memory device according to the fifth embodiment of the present invention in FIG. 40, and the graphs for explaining the I-V properties used in operation point analysis in a resistance change in FIGS. 43A and 43B.

Figure 44C:
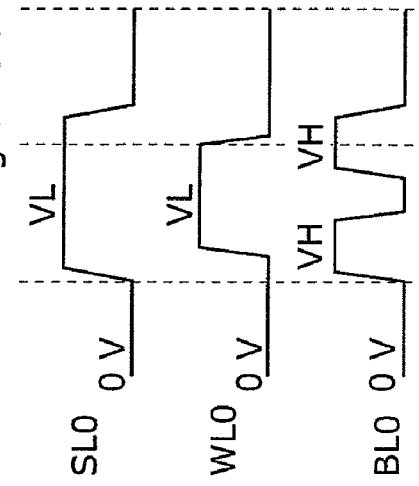
FIG. 44C is a timing diagram of an operation performed by the variable resistance nonvolatile memory device according to the fifth embodiment of the present invention.
Figure 44B:
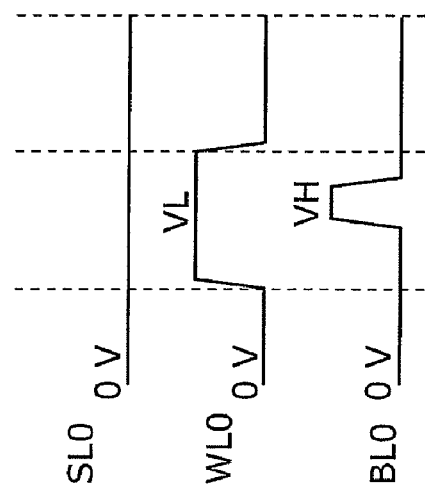
FIG. 44B is a timing diagram of an operation performed by the variable resistance nonvolatile memory device according to the fifth embodiment of the present invention.
Figure 44A:
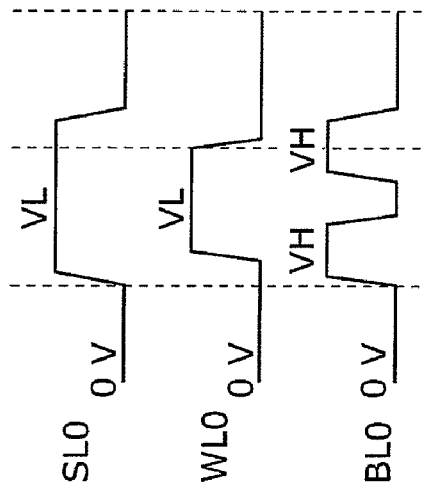
FIG. 44A is a timing diagram of an operation performed by the variable resistance nonvolatile memory device according to the fifth embodiment of the present invention.

FIGS. 44A to 44C are timing diagrams of operation examples performed by the nonvolatile memory device according to the fifth embodiment of the present invention. In the operation examples, it is assumed that data is "0" when the variable resistance layer is in a high resistance state, and that data is "1" when the variable resistance layer is in a low resistance state. The description is given only for the situation that data is written to and read from the memory cell M11.

In the situation of writing data "1" in FIG. 44A, a VL (2.4 V) and a VH (2.4 V) have a capability of supplying a voltage and a current for enabling a LR writing change from the operation point Q to the operation point R in the I-V characteristics in FIG. 43A.

In FIG. 44B, a VL (2.4 V) is a voltage generated in the LR writing power source 212, a VH (2.4 V) is a voltage generated in the HR writing power source 213. A positive voltage at the point O in the pulse RV characteristics in FIG. 10A is effectively applied to the memory cells M11, M12, . . . .

In the situation of the soft forming operation using the forming circuit 244 in FIG. 44C, a VL (3.3 V) is a voltage generated in the LR writing power source 212, and a VH (3.3 V) is a voltage generated in the HR writing power source 2133. The VL and VH have a capability of supplying a voltage and a current for enabling a forming (LR writing as initialization) to change the operation point V to the operation point W in the I-V characteristics in FIG. 43B.

In a cycle of writing data "1" to the memory cell M11 shown in FIG. 44A, at first, the selected bit line BL0 is set to have a voltage VH (2.4 V) and the selected source line SL0 is set to have a voltage VL (2.4 V). Next, the selected word line WL0 is set to have a voltage VL (2.4 V). Here, the NMOS transistor N11 in the selected memory cell M11 in FIG. 40 is still OFF. At this state, the voltage of 2.4 V is applied to both the drain and source terminals of the NMOS transistor N11 in FIG. 40. Therefore, current does not flow regardless of ON/OFF of the transistor.

Next, the selected bit line BL0 is set to have a voltage of 0 V in a predetermined time period. After the predetermined time period, a pulse waveform is applied to cause the selected bit line BL0 to have the voltage VH again. At this state, in the memory cell M11 in FIG. 40, a change from the operation point Q to the operation point R in the I-V characteristics shown in FIG. 43A is performed. In other words, writing performs to change a high resistance value to a low resistance value. After that, the word line WL0 is set to have a voltage of 0 V. As a result, data "1" has been written in the memory cell M11.

In writing data "0" to the memory cell M11 shown in FIG. 37B, at first, the selected bit line BL0 and the selected source line SL0 are set to have a voltage of 0 V. Next, the selected word line WL0 is set to have a voltage VL (2.4 V), thereby turning ON the NMOS transistor N11 of the selected memory cell M11 in FIG. 40.

Next, the selected bit line BL0 is set to have the voltage VH (2.4 V) in a predetermined time period. After the predetermined time period, a pulse waveform is applied to cause the selected bit line BL0 to have 0 V again. At this state, a positive pulse voltage (+2.4 V) at the point Q in the pulse RV characteristics seen in FIG. 10A is applied to the memory cell M11 in FIG. 40. Therefore, writing performs to change a low resistance value to a high resistance value. After that, the word line WL0 is set to have a voltage of 0 V. As a result, data "0" has been written in the memory cell M11.

In a forming cycle for the memory cell M11 shown in FIG. 44C, at first, the selected bit line BL0 is set to have a voltage VH (3.3 V) and the selected source line SL0 is set to have a voltage VL (3.3 V). Next, the selected word line WL0 is set to have a voltage VL (3.3 V). Here, the NMOS transistor N11 in the selected memory cell M11 in FIG. 40 is still OFF. At this state, the voltage of 3.3 V is applied to both the drain and source terminals of the NMOS transistor N11 in FIG. 40. Therefore, current does not flow regardless of ON/OFF of the transistor.

Next, the selected bit line BL0 is set to have a voltage of 0 V in a predetermined time period. After the predetermined time period, a pulse waveform is applied once to cause the selected bit line BL0 to have the voltage VH (3.3 V) again. At this state, in the memory cell M11 in FIG. 40, a change from the operation point V to the operation point W in the I-V characteristics shown in FIG. 43B is performed. In other words, the soft forming is performed by performing current-restriction to change an initial high resistance value to a low resistance value. After that, the word line WL0 is set to have a voltage of 0 V, and thereby the soft forming operation is completed.

As described above, the provision of the forming circuit 244 enables a forming voltage pulse to be generated using a voltage source having a limited maximum value of possible supplied current. Therefore, the soft forming can be completed by applying a pulse once. Thereby, the fifth embodiment can produce the same effects as those of the third embodiment (with the I-type cells), and can perform a forming operation at a higher speed. As a result, an inspection time can be shortened, which reduces a cost.

It should be noted that it has been described in the fifth embodiment that, in usual writing of data "0" and "1", the voltage (=2.4 V) of the word line WL0, the LR writing pulse voltage V2 (=2.4 V), and the HR writing pulse voltage V1 (=2.4 V) are set to be the same voltage, but these voltages are not necessarily the same.

It should be noted that it has been described in the fifth embodiment that a transistor width of the NMOS transistor forming a driver is reduced from the bit line side for applying 0 V to the I-type cell in order to reduce the capability of supplying current, which makes it possible to prevent that excessive current flows into a variable resistance element in a forming so as to reduce the high resistance value level. However, it is also possible to reduce a transistor width of the PMOS transistor forming a driver in the source line side to reduce the capability of supplying current not to exceed ILR, thereby preventing excessive current from flowing to a variable resistance element in a forming.

It should be noted that the fifth embodiment has been described using the I-type cells, but, of course, the II-type cells can be used to have a forming circuit for which current-restriction can be performed.

It should also be noted that, in the forming circuit according to the fifth embodiment, a transistor width of the NMOS transistor forming a driver is reduced to perform current-restriction. However, current-restriction can be performed using a high-breakdown-voltage transistor having a smaller current driving capability. Or, current-restriction may be achieved by inserting a fixed current-restriction resistance between a forming driver and a memory cell It should also be noted that it has been described in the fifth embodiment that a transistor width of the NMOS transistor forming a driver in the forming circuit is reduced. However, current-restriction may be performed by decreasing a gate voltage of the NMOS transistor.

It should also be noted that it has been described in the fifth embodiment that the selected transistor in a memory cell is a NMOS transistor, but it may be a PMOS transistor or a rectifying device such as a bidirectional diode.

[Variable Resistance Nonvolatile Memory Device According to Sixth Embodiment]

The following describes a 1T1R nonvolatile memory device including an automatic forming control circuit, according to the sixth embodiment of the present invention.

Figure 45:
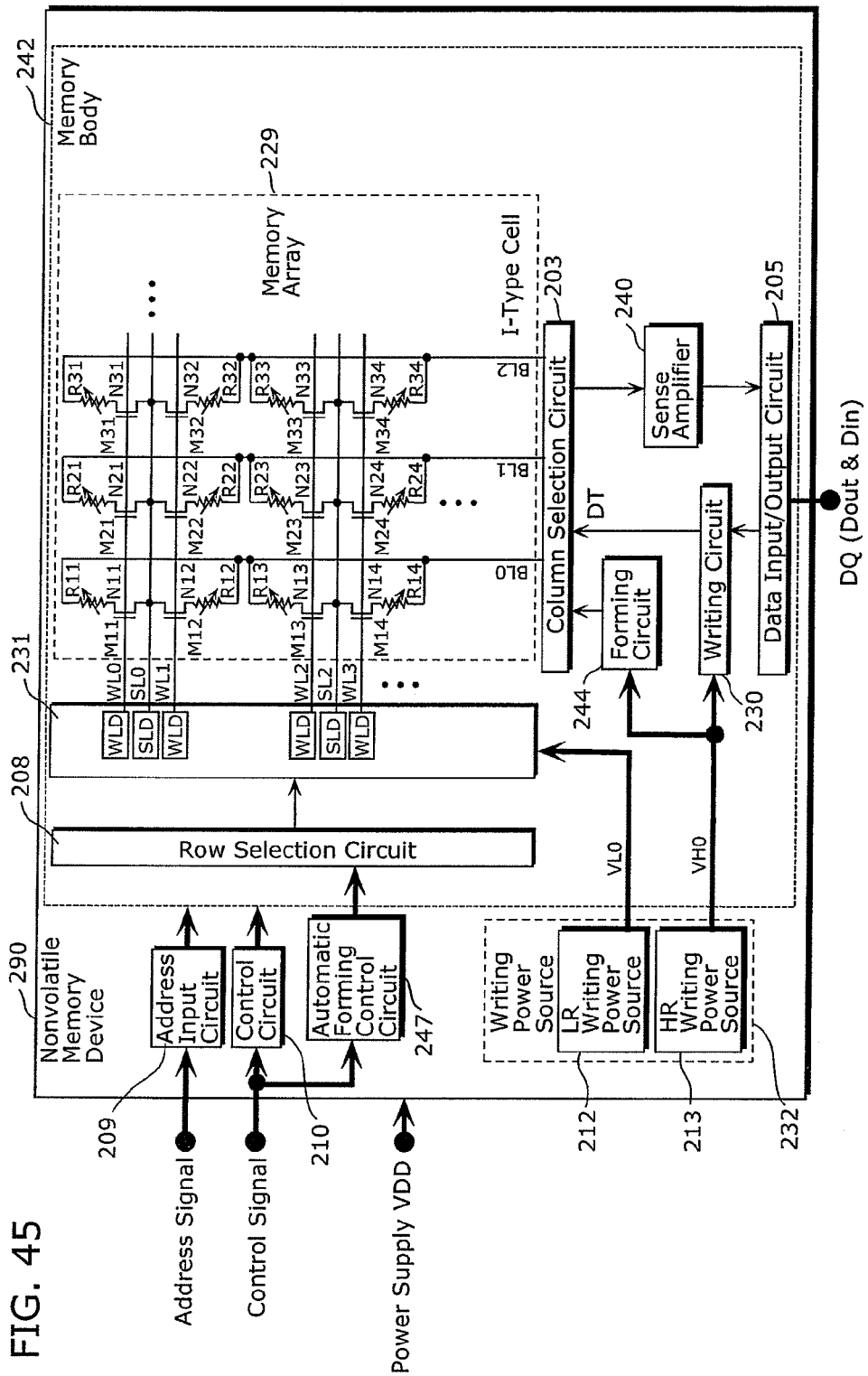
FIG. 45 is a block diagram showing a structure of a variable resistance nonvolatile memory device according to a sixth embodiment of the present invention.
Figure 46:
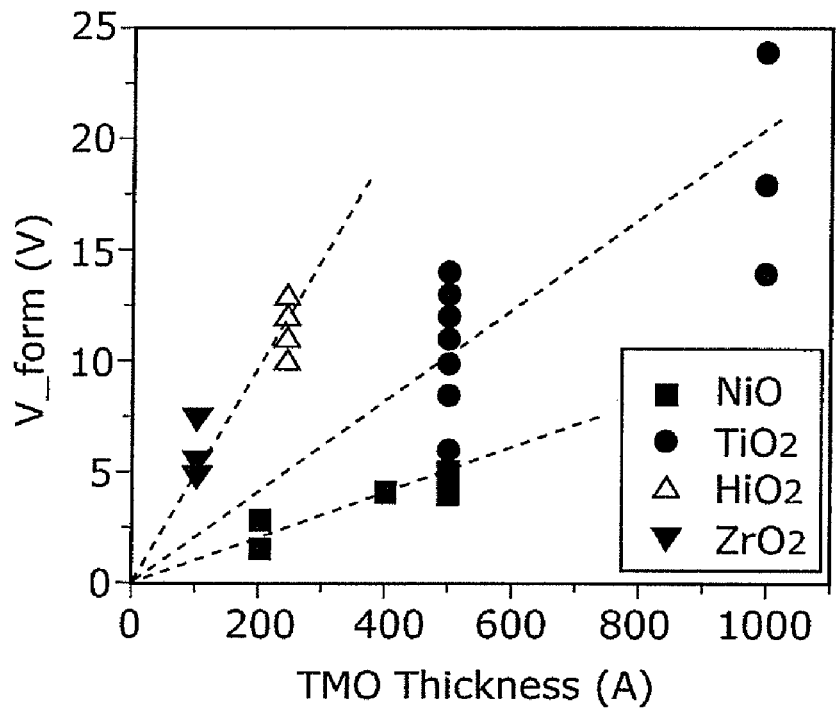
FIG. 46 is a graph plotting a dependency of a forming voltage on a transition metal oxide film thickness according to a conventional variable resistance nonvolatile memory.
Figure 47:
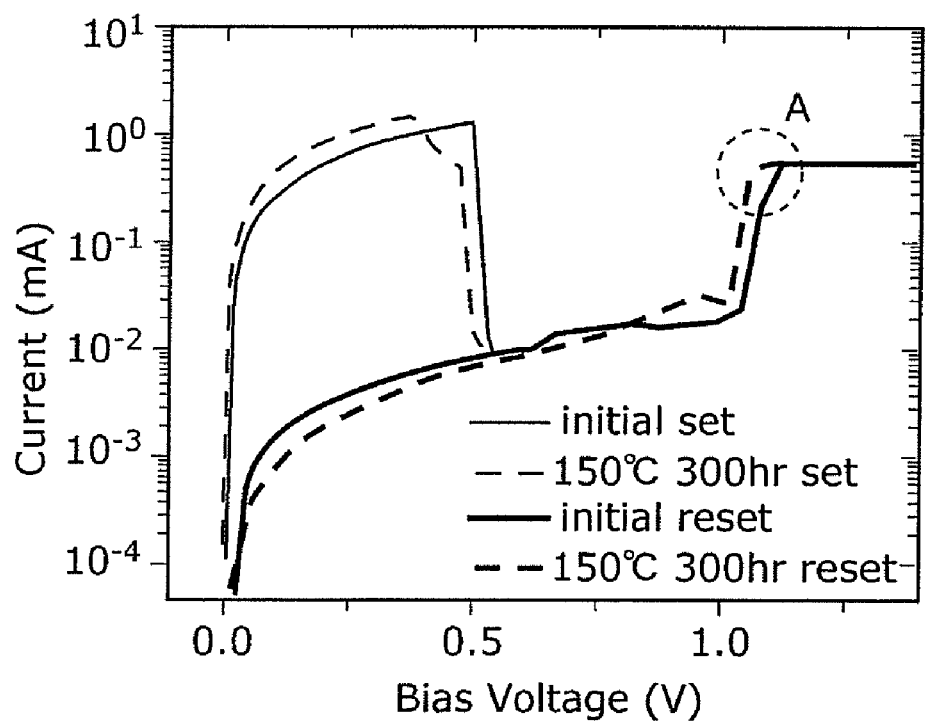
FIG. 47 is a graph plotting I-V properties according to the conventional variable resistance nonvolatile memory.
Figure 48:
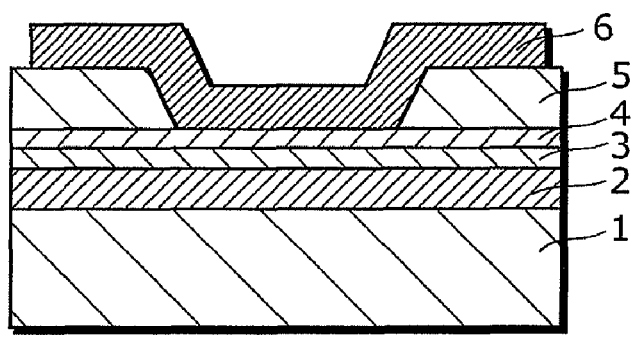
FIG. 48 is a cross-sectional view of a memory cell according to a conventional variable resistance nonvolatile memory element.
Figure 49:
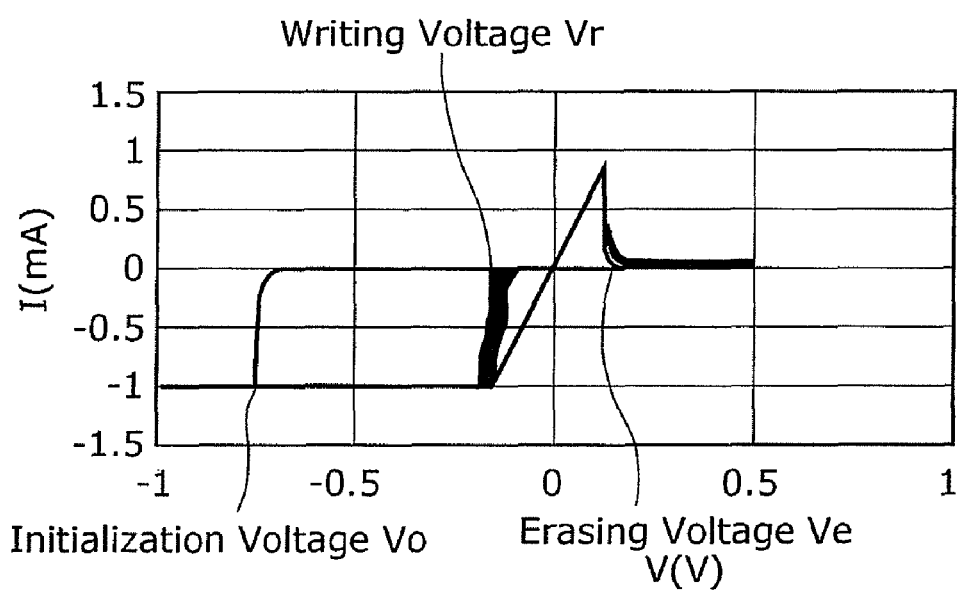
FIG. 49 is a graph plotting I-V properties changed from an initial state according to the conventional variable resistance nonvolatile memory element.
Figure 50:
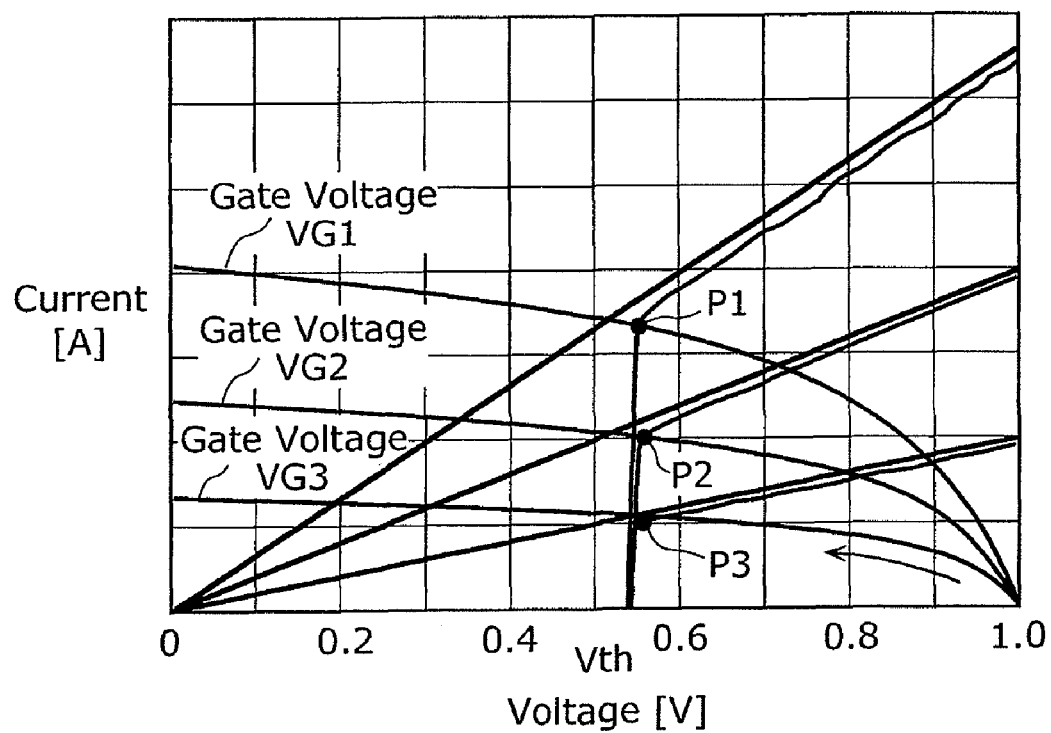
FIG. 50 is a graph for explaining LR writing operation point analysis based on static properties between a MIS transistor and a to the conventional 1T1R memory cell. variable resistance element in a conventional 1T1R cell.
Figure 51:
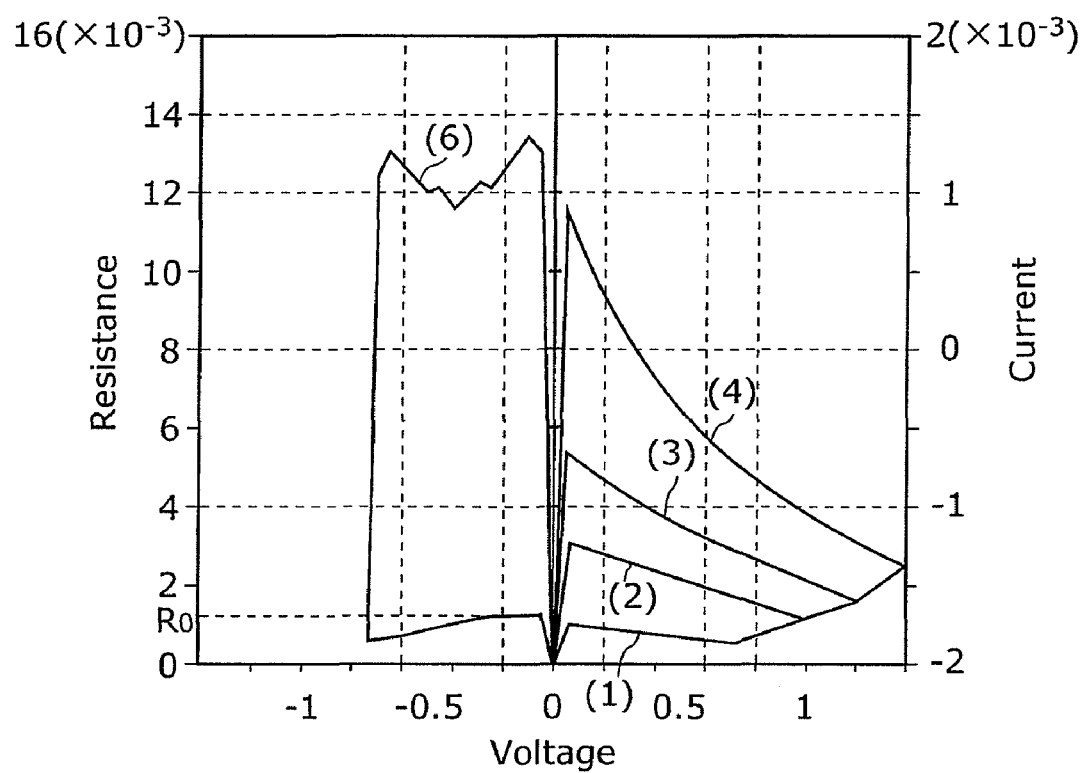
FIG. 51 is a graph plotting resistance-voltage characteristics in the case that a plurality of switching voltages are set for a conventional variable resistance element.
Figure 52:
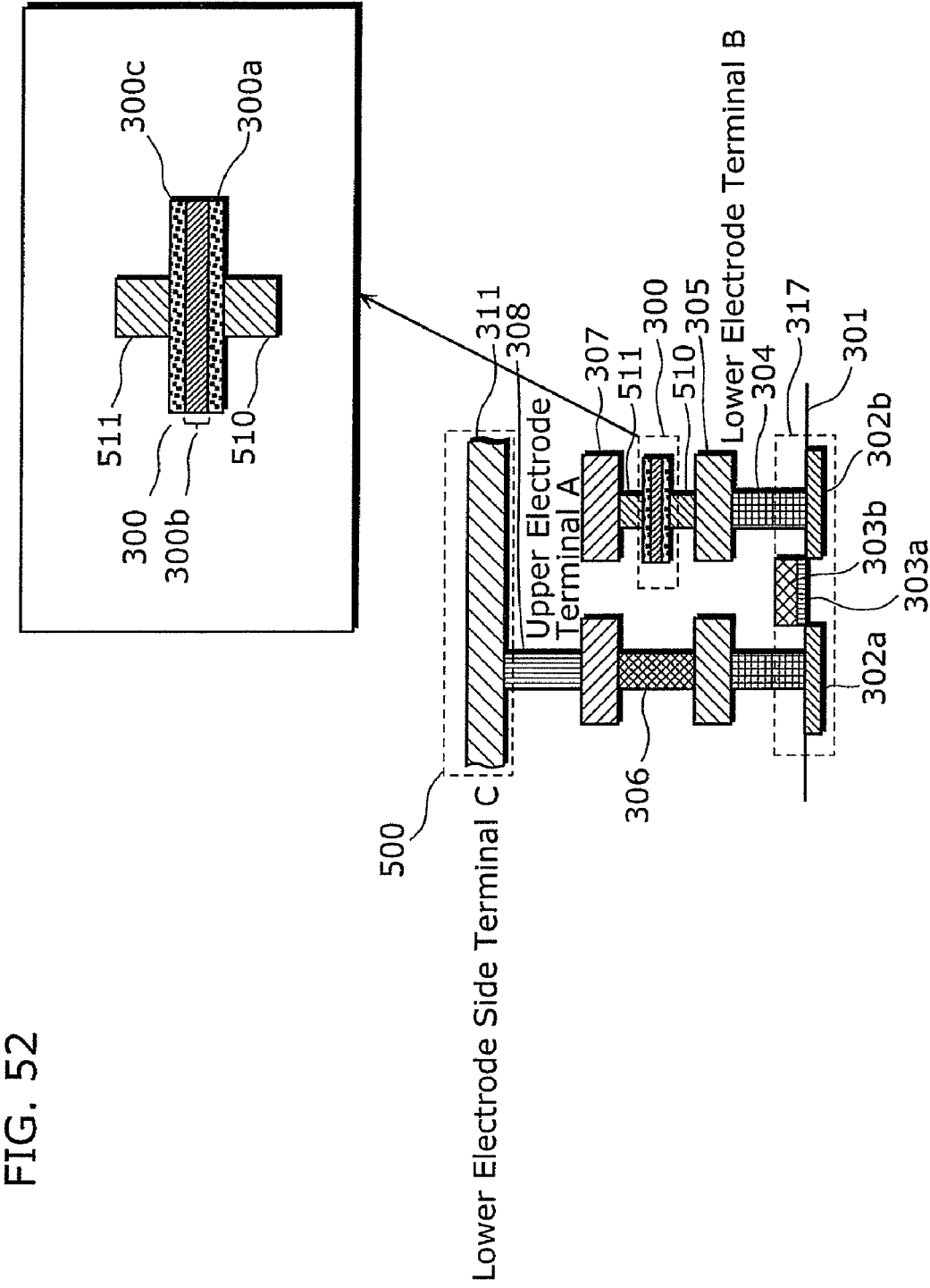
FIG. 52 is a cross-sectional view of a conventional 1T1R memory cell.

FIG. 45 is a block diagram showing a structure of the nonvolatile memory device according to the sixth embodiment of the present invention.

The same reference numerals of FIG. 40 are assigned to the identical structural elements of FIG. 45, so that the identical structural elements are not explained again below.

As shown in FIG. 45, the nonvolatile memory device 290 has a structure in which the nonvolatile memory device 241 according to the fifth embodiment includes an automatic forming control circuit 247.

The automatic forming control circuit 247 controls operations of the memory body 242 based on control signals provided from outside. More specifically, the automatic forming control circuit 247 controls the row selection circuit 208, the column selection circuit 203, the writing power source 232, the forming circuit 244, and the like to sequentially select the memory cells, and thereby to apply a forming voltage pulse to a variable resistance element included in the selected memory cell.

[Operations of Variable Resistance Nonvolatile Memory Device According to Sixth Embodiment]

The automatic forming control circuit 247 automatically generates row address signals and column address signals in a forming cycle, and provides the row address signals to the row selection circuit 208 and the column address signals to the column selection circuit 203. Thereby, by switching among the memory cells M11, M21, M31, . . . , M12, M22, M32, . . . , the bit lines BL, and the word lines WL, the automatic forming control circuit 247 continuously selects each of all memory cells M11, M21, . . . . In addition, at this stage, the automatic forming control circuit 247 provides the forming circuit 244 with a forming signal for instructing application of a forming voltage (LR writing as initialization), and performs the soft forming for each of the memory cells M11, M21, . . . by applying a pulse once from the forming circuit 244.

After completing the soft forming for all memory cells M11, M12, . . . , setting is performed so that VH=VL=2.4 V and a pulse width=50 ns. Thereby, data "0" and "1" writing is possible.

As described above, the automatic forming control circuit 247 is provided to continuously and automatically perform the soft forming for the memory array. With the above structure, the sixth embodiment can produce the same effects as those of the fifth embodiment. In addition, the soft forming operation can be performed at a higher speed than the situation where control is performed from outside. As a result, an inspection time can be shortened, thereby reducing a cost.

It should be noted that the sixth embodiment has a structure in which the fifth embodiment includes the automatic forming control circuit, but the sixth embodiment may be any one of the first to third embodiment added with the automatic forming control circuit, in order to perform the soft forming at a higher speed.

It is also possible to perform the soft forming for a plurality of bits at once.

Thus, the writing method for the variable resistance nonvolatile memory element and the variable resistance nonvolatile memory device according to the present invention have been described according to the first to sixth embodiments. However, the present invention is not limited to these embodiments. Those skilled in the art will be readily appreciated that various modifications are possible in the embodiments and combinations of given structural elements of the embodiments are possible without materially departing from the scope of the present invention.

For example, the external application terminal in the fourth embodiment may be provided in the nonvolatile memory devices in the other embodiments. More specifically, the nonvolatile memory device according to the present invention may include a variable voltage pulse generation circuit for a forming, and also an external application terminal for receiving a forming variable voltage pulse from outside and applying the pulse to a variable resistance element.

Industrial Applicability

As described above, according to the present invention, the variable resistance nonvolatile memory device, which includes memory cells each of which includes (a) a variable resistance element having a resistance value reversibly changed based on electrical signals, and (b) a switch element such as a transistor, can expand an operation window between a high resistance state and a low resistance state. As a result, the variable resistance nonvolatile memory device according to the present invention is useful to implement a memory that is highly reliable and capable of high-speed reading.

Numerical References

| | |
|---|---|
| 1 | substrate |
| 2 | lower electrode |
| 3 | ion source layer |
| 4 | memory layer |
| 5 | insulation layer |
| 6 | upper electrode |
| 100, 300, 600 | variable resistance element |
| 100a, 300a, 600a | lower electrode |
| 100b, 300b, 600b | variable resistance layer |
| 100b-1 | first oxygen-deficient tantalum oxide layer |
| 100b-2 | second oxygen-deficient tantalum oxide layer |
| 100c, 300c, 600c | upper electrode |
| 200, 227, 237, 241, 270, 290 | nonvolatile memory device |
| 201, 228, 272, 238, 242 | memory body |
| 202, 229 | memory array |
| 203 | column selection circuit |
| 204, 240 | sense amplifier |
| 205 | data input/output circuit |
| 206, 230, 271, 280 | writing circuit |
| 207, 231, 273 | row driver |
| 208 | row selection circuit |
| 209 | address input circuit |
| 210 | control circuit |
| 211, 232 | writing power source |
| 212 | low resistance (LR) writing power source |
| 213 | high resistance (HR) writing power source |
| 214, 234 | writing driver circuit |
| 215 | voltage follower circuit |
| 216, 223 | voltage-dividing circuit |
| 218 | current mirror circuit |
| 219, 220 | clamp transistor |
| 221 | reference circuit |
| 222, 223 | selection transistor |
| 224 | inverter |
| 225, 226 | transistor |
| 235 | write buffer |
| 236 | switch |
| 239 | external application terminal connection switch |
| 244 | forming circuit |
| 247 | automatic forming control circuit |
| 249 | PMOS transistor |
| 250, 251 | NMOS transistor |
| 301 | semiconductor substrate |
| 302a | first N-type diffusion layer region |
| 302b | second N-type diffusion layer region |
| 303a | gate insulation film |
| 303b | gate electrode |
| 304 | first via |
| 305 | first line layer |
| 306 | second via |
| 307 | second line layer |
| 308 | third via |
| 310 | fourth via |
| 311 | third line layer |
| 317 | transistor |
| 401 | switch element |
| 500 | 1T1R memory cell |
| 510 | first resistance film via |
| 511 | second resistance film via |
| 600b-1 | first oxygen-deficient transition metal oxide layer |
| 600b-2 | second oxygen-deficient transition metal oxide layer |
| 700, 705 | usual pulse generation circuit |
| 701, 706 | variable voltage pulse generation circuit |
| 702 | usual determination reference circuit |
| 703 | forming determination reference circuit |
| 704 | variable voltage pulse generation circuit |

The invention claimed is:

1. A method of writing to a variable resistance nonvolatile memory element that reversibly changes between a high resistance state and a low resistance state depending on a polarity of an applied voltage pulse,
   wherein the variable resistance nonvolatile memory element has characteristics of (i) changing from the low resistance state to the high resistance state due to application of a voltage having an absolute value equal to or greater than an absolute value of a first voltage, (ii) changing to the high resistance state having a maximum resistance value due to application of a second voltage having an absolute value greater than the absolute value of the first voltage, and (iii) changing to the high resistance state having a resistance value lower than the maximum resistance value due to application of a third voltage having an absolute value greater than the absolute value of the second voltage, and
   each of the first, second, and third voltages has a first polarity,
   said writing method comprising:
   a high resistance writing step of changing the variable resistance nonvolatile memory element from the low resistance state to the high resistance state, by applying a voltage pulse having the first polarity to the variable resistance nonvolatile memory element; and
   a low resistance writing step of changing the variable resistance nonvolatile memory element from the high resistance state to the low resistance state, by applying a voltage pulse having a second polarity to the variable resistance nonvolatile memory element,
   wherein the voltage pulse applied in said high resistance writing step has an absolute value which is equal to or greater than the absolute value of the first voltage and equal to or smaller than the absolute value of the second voltage.

2. The writing method according to claim 1, further comprising
   a preparation step of determining the first and second voltages, by applying voltage pulses to the variable resistance nonvolatile memory element so as to measure respective resistance values of the variable resistance nonvolatile memory element, the voltage pulses having voltage absolute values that are gradually increased,
   wherein the voltage pulse applied in said high resistance writing step is determined based on the first and second voltages determined in said preparation step.

3. The writing method according to claim 2,
   wherein the variable resistance nonvolatile memory element has characteristics by which application of a voltage pulse of any voltage in said high resistance writing step causes a resistance value in the high resistance state to be lower than the maximum resistance value if a voltage pulse of the third voltage has been applied to the variable resistance nonvolatile memory element, the third voltage having the absolute value greater than the absolute value of the second voltage.

4. The writing method according to claim 3,
wherein the variable resistance nonvolatile memory element includes a first oxygen-deficient transition metal oxide layer and a second oxygen-deficient transition metal oxide layer, the second oxygen-deficient transition metal oxide layer having an oxygen content percentage higher than an oxygen content percentage of the first oxygen-deficient transition metal oxide layer, and
the voltage pulse applied in said high resistance writing step has a positive voltage for the second oxygen-deficient transition metal oxide layer, with reference to a potential of the first oxygen-deficient transition metal oxide layer.

5. A variable resistance nonvolatile memory device including variable resistance nonvolatile memory elements, said variable resistance nonvolatile memory device comprising:
a memory cell array including a plurality of memory cells in each of which a corresponding one of said variable resistance nonvolatile memory elements is connected in series to a corresponding one of switch elements, said variable resistance nonvolatile memory elements each being reversibly changeable between a high resistance state and a low resistance state depending on a polarity of an applied voltage pulse;
a selection unit configured to select at least a memory cell from said memory cell array;
a writing unit configured to (i) generate a high resistance writing voltage pulse to be applied to change a variable resistance nonvolatile memory element in said memory cell selected by said selection unit from the low resistance state to the high resistance state, or (ii) generate a low resistance writing voltage pulse to be applied to change said variable resistance nonvolatile memory element from the high resistance state to the low resistance state; and
a reading unit configured to determine whether said variable resistance nonvolatile memory element in said memory cell selected by said selection unit is in the high resistance state or in the low resistance state,
wherein the variable resistance nonvolatile memory element has characteristics of (i) changing from the low resistance state to the high resistance state due to application of a voltage having an absolute value equal to or greater than an absolute value of a first voltage, (ii) changing to the high resistance state having a maximum resistance value due to application of a second voltage having an absolute value greater than the absolute value of the first voltage, and (iii) changing to the high resistance state having a resistance value lower than the maximum resistance value due to application of a third voltage having an absolute value greater than the absolute value of the second voltage,
each of the first, second, and third voltages has a same polarity, and
the high resistance writing voltage pulse generated in said writing unit is a voltage pulse having an absolute value which is equal to or greater than the absolute value of the first voltage and equal to or smaller than the absolute value of the second voltage.

6. The variable resistance nonvolatile memory device according to claim 5,
wherein the variable resistance nonvolatile memory element has characteristics in which application of a voltage pulse having any absolute value in said high resistance writing step causes a resistance value in the high resistance state to be lower than the maximum resistance value if a voltage pulse of the third voltage has been applied to the variable resistance nonvolatile memory element, the third voltage having the absolute value greater than the absolute value of the second voltage.

7. The variable resistance nonvolatile memory device according to claim 6,
wherein the variable resistance nonvolatile memory element includes a first oxygen-deficient transition metal oxide layer and a second oxygen-deficient transition metal oxide layer, said second oxygen-deficient transition metal oxide layer having an oxygen content percentage higher than an oxygen content percentage of said first oxygen-deficient transition metal oxide layer, and
said writing unit is configured to (i) generate, as the high resistance writing voltage pulse, a voltage pulse having a positive voltage for said second oxygen-deficient transition metal oxide layer, with reference to a potential of said first oxygen-deficient transition metal oxide layer, and (ii) generate, as the low resistance writing voltage pulse, a voltage pulse having a positive voltage for said first oxygen-deficient transition metal oxide layer, with reference to a potential of said second oxygen-deficient transition metal oxide layer.

8. The variable resistance nonvolatile memory device according to claim 7,
wherein said first oxygen-deficient transition metal oxide layer is a layer including a composition represented by $TaO_x$, and
said second oxygen-deficient transition metal oxide layer is a layer including a composition represented by $TaO_y$, where $x<y$.

9. The variable resistance nonvolatile memory device according to claim 5, further comprising
a plurality of bit lines and a plurality of source lines,
wherein each of said plurality of memory cells is connected between a corresponding one of said plurality of bit lines and a corresponding one of said plurality of source lines,
said selection unit includes a row selection unit and a column selection unit, said row selection unit configured to select at least one of said plurality of source lines, and said column selection unit configured to select at least one of said plurality of bit lines,
said reading circuit is connected to said variable resistance nonvolatile memory elements via said column selection unit, and
said writing unit is configured to (i) generate the high resistance writing voltage pulse for the at least one of said plurality of source lines selected by said row selection unit with reference to a potential of the at least one of said plurality of bit lines selected by said column selection unit, or (ii) generate the high resistance writing voltage pulse for the at least one of said plurality of bit lines selected by said column selection unit with reference to a potential of the at least one of said plurality of source lines selected by said row selection unit.

10. The variable resistance nonvolatile memory device according to claim 9, wherein said plurality of memory cells are arranged two-dimensionally, said variable resistance nonvolatile memory device further comprising a plurality of word lines which are provided to respective rows of said plurality of memory cells, wherein each of said plurality of word lines is connected to a control terminal of a corresponding one of switch elements included in memory cells forming a corresponding one of the rows, said row selection unit is further configured to select, from said plurality of word lines, a word line corresponding to the at least one of said plurality of source lines selected by said row selection unit, and said writing unit is configured to apply the high resistance writing voltage pulse to the at least one of said plurality of bit lines selected by said column selection unit, after fixing the at least one of said source lines selected by said row selection unit to have a reference potential and turning ON the corresponding one of said switch elements via the word line selected by said row selection unit.

* * * * *